(12) United States Patent
Epitaux et al.

(10) Patent No.: US 12,278,441 B2
(45) Date of Patent: Apr. 15, 2025

(54) ULTRA-DENSE, LOW-PROFILE EDGE CARD CONNECTOR

(71) Applicant: SAMTEC, INC., New Albany, IN (US)

(72) Inventors: Marc Epitaux, Gland (CH); Eric J. Zbinden, Santa Clara, CA (US); John Coronati, Colorado Springs, CO (US); Jignesh H. Shah, Santa Clara, CA (US); Brandon Thomas Gore, Lexington, SC (US)

(73) Assignee: SAMTEC, INC., New Albany, IN (US)

( * ) Notice: Subject to any disclaimer, the term of this patent is extended or adjusted under 35 U.S.C. 154(b) by 786 days.

(21) Appl. No.: 17/273,364

(22) PCT Filed: Sep. 4, 2019

(86) PCT No.: PCT/US2019/049458
§ 371 (c)(1),
(2) Date: Mar. 4, 2021

(87) PCT Pub. No.: WO2020/051183
PCT Pub. Date: Mar. 12, 2020

(65) Prior Publication Data
US 2021/0194164 A1    Jun. 24, 2021

Related U.S. Application Data

(60) Provisional application No. 62/726,833, filed on Sep. 4, 2018, provisional application No. 62/727,227, filed
(Continued)

(51) Int. Cl.
*H01R 12/73* (2011.01)
*G02B 6/42* (2006.01)
(Continued)

(52) U.S. Cl.
CPC ........ *H01R 12/732* (2013.01); *G02B 6/4246* (2013.01); *G02B 6/4269* (2013.01);
(Continued)

(58) Field of Classification Search
CPC ........ H01R 12/62; H01R 12/72; H01R 12/73; H01R 12/725; H01R 12/732;
(Continued)

(56) References Cited

U.S. PATENT DOCUMENTS

| 4,609,240 A | 9/1986 | Pistor |
|---|---|---|
| 4,640,032 A | 2/1987 | Lewis |

(Continued)

FOREIGN PATENT DOCUMENTS

| CN | 1329721 A | 1/2002 |
|---|---|---|
| CN | 1559084 A | 12/2004 |

(Continued)

OTHER PUBLICATIONS

Amphenol TCS Expands the XCede Platform with 85 ohm Connectors and High Speed cable Solutions, ENP Newswire, Feb. 26, 2009.
(Continued)

*Primary Examiner* — Khiem M Nguyen
(74) *Attorney, Agent, or Firm* — BakerHostetler

(57) ABSTRACT

This present disclosure increases the interconnect density by using a different technology approach than the industry is currently using (stamping and molding). By using a MEMS-based technology approach, better geometry and impedance control can be carried out to reduce impedance discontinuities and feature size. Additional concepts include low connector insertion force, no contact wiping, and a precise alignment mechanism between the connector contacts and those on the mating substrate.

17 Claims, 27 Drawing Sheets

Related U.S. Application Data on Sep. 5, 2018, provisional application No. 62/812,492, filed on Mar. 1, 2019.

(51) Int. Cl.

| | | |
|---|---|---|
| *H01L 23/498* | (2006.01) | |
| *H01L 25/18* | (2023.01) | |
| *H01R 12/62* | (2011.01) | |
| *H01R 12/72* | (2011.01) | |
| *H01R 13/506* | (2006.01) | |
| *H01R 13/631* | (2006.01) | |
| *H05K 1/11* | (2006.01) | |
| *H05K 1/18* | (2006.01) | |

(52) U.S. Cl.
CPC ..... *H01L 23/49838* (2013.01); *H01R 13/506* (2013.01); *H01R 13/631* (2013.01); *H05K 1/117* (2013.01); *H05K 1/18* (2013.01); *H01L 25/18* (2013.01); *H01R 12/62* (2013.01); *H01R 12/725* (2013.01); *H05K 2201/10121* (2013.01); *H05K 2201/10189* (2013.01)

(58) Field of Classification Search
CPC ........... H01R 13/506; H01R 13/631; H01L 23/49838; H01L 25/18; G02B 6/4246; G02B 6/4269; H05K 1/117; H05K 1/18; H05K 2201/10121; H05K 2201/10189
USPC .......................................................... 439/62
See application file for complete search history.

(56) References Cited

U.S. PATENT DOCUMENTS

| | | | |
|---|---|---|---|
| 4,924,179 A | 5/1990 | Sherman | |
| 4,975,068 A | 12/1990 | Squires | |
| 5,383,787 A | 1/1995 | Switky et al. | |
| 5,435,757 A | 7/1995 | Fedder et al. | |
| 5,441,424 A | 8/1995 | Morlion et al. | |
| 5,487,673 A | 1/1996 | Hurtarte | |
| 5,509,827 A | 4/1996 | Huppenthal et al. | |
| 5,564,931 A | 10/1996 | Fabian et al. | |
| 5,567,166 A | 10/1996 | Lemke | |
| 5,598,627 A | 2/1997 | Saka et al. | |
| 5,781,759 A | 7/1998 | Kashiwabara | |
| 5,823,796 A | 10/1998 | Bethurum | |
| 6,068,500 A | 5/2000 | Kantner | |
| 6,071,016 A | 6/2000 | Ichino et al. | |
| 6,097,086 A | 8/2000 | Crane et al. | |
| 6,100,626 A | 8/2000 | Frey et al. | |
| 6,144,559 A | 11/2000 | Johnson et al. | |
| 6,186,106 B1 | 2/2001 | Glovatsky et al. | |
| 6,203,376 B1 | 3/2001 | Magajne et al. | |
| 6,231,363 B1 | 5/2001 | Kosmala | |
| 6,232,556 B1 | 5/2001 | Daugherty et al. | |
| 6,574,115 B2 | 6/2003 | Asano et al. | |
| 6,688,776 B2 | 2/2004 | Simmons et al. | |
| 6,702,590 B2 | 3/2004 | Zaderej et al. | |
| 6,726,504 B2 | 4/2004 | Fuerst et al. | |
| 6,738,259 B2 | 5/2004 | Le et al. | |
| 6,797,882 B1 | 9/2004 | Crane et al. | |
| 6,971,887 B1 | 12/2005 | Trobough | |
| 6,990,733 B2 | 1/2006 | Lopata et al. | |
| 7,004,644 B1 | 2/2006 | Johnson | |
| 7,118,293 B2 | 10/2006 | Nagasaka et al. | |
| 7,183,646 B2 | 2/2007 | Crane, Jr. et al. | |
| 7,320,426 B2 | 1/2008 | Shue et al. | |
| 7,384,275 B2 | 6/2008 | Ngo | |
| 7,402,048 B2 | 7/2008 | Meier et al. | |
| 7,503,793 B2 | 3/2009 | Morello | |
| 7,719,843 B2 | 5/2010 | Dunham | |
| 8,007,316 B2 | 8/2011 | Costello | |
| 8,036,500 B2 | 10/2011 | McColloch | |
| 8,083,553 B2 | 12/2011 | Manter et al. | |
| 8,173,490 B2 | 5/2012 | Eckhardt et al. | |
| 8,335,411 B2 | 12/2012 | Kuznia et al. | |
| 8,353,708 B2 | 1/2013 | Hsu | |
| 8,553,102 B2 | 10/2013 | Yamada | |
| 8,724,944 B2 | 5/2014 | Kuznia et al. | |
| 8,787,711 B2 | 7/2014 | Zbinden et al. | |
| 8,867,231 B2 | 10/2014 | Roitberg et al. | |
| 8,867,869 B2 | 10/2014 | Steijer et al. | |
| 9,118,151 B2 | 8/2015 | Tran et al. | |
| 9,442,255 B2 | 9/2016 | Pommer et al. | |
| 9,465,176 B2 | 10/2016 | Pommer et al. | |
| 9,606,307 B2 | 3/2017 | Matsumaru et al. | |
| 9,647,762 B2 | 5/2017 | Arvelo et al. | |
| 9,766,418 B2 | 9/2017 | Lewallen et al. | |
| 9,791,647 B2 | 10/2017 | Steijer et al. | |
| 9,835,811 B2 | 12/2017 | Zbinden et al. | |
| 9,841,572 B2 | 12/2017 | Zbinden et al. | |
| 10,074,920 B2 | 9/2018 | Tran et al. | |
| 10,910,748 B2 | 2/2021 | Mason et al. | |
| 10,931,047 B2 | 2/2021 | Lee et al. | |
| 11,146,002 B2 | 10/2021 | Ellis et al. | |
| 11,476,603 B2 | 10/2022 | Buck et al. | |
| 11,495,899 B2 | 11/2022 | Zbinden et al. | |
| 2002/0153977 A1 | 10/2002 | McDonough et al. | |
| 2003/0036304 A1 | 2/2003 | Soubh | |
| 2004/0094328 A1 | 5/2004 | Fjelstad et al. | |
| 2004/0155328 A1 | 8/2004 | Kline | |
| 2004/0245610 A1 | 12/2004 | Zhong et al. | |
| 2005/0093127 A1 | 5/2005 | Fjelstad et al. | |
| 2006/0001163 A1 | 1/2006 | Kolbehdari et al. | |
| 2006/0040523 A1 | 2/2006 | Renfro et al. | |
| 2006/0091507 A1 | 5/2006 | Fjelstad et al. | |
| 2006/0133821 A1 | 6/2006 | Wang et al. | |
| 2006/0215963 A1 | 9/2006 | Hamano | |
| 2006/0228922 A1 | 10/2006 | Morriss | |
| 2007/0001277 A1 | 1/2007 | Ichikawa | |
| 2007/0015416 A1 | 1/2007 | Gutierrez et al. | |
| 2007/0040626 A1 | 2/2007 | Blair et al. | |
| 2008/0095506 A1 | 4/2008 | McColloch | |
| 2008/0150571 A1 | 6/2008 | Miller et al. | |
| 2008/0176436 A1 | 7/2008 | Morello | |
| 2008/0277769 A1 | 11/2008 | Cotte et al. | |
| 2009/0023330 A1 | 1/2009 | Stoner et al. | |
| 2009/0148108 A1 | 6/2009 | Fukutomi | |
| 2010/0062656 A1 | 3/2010 | Lynch et al. | |
| 2010/0075536 A1 | 3/2010 | Kubo | |
| 2010/0188828 A1 | 7/2010 | Takao | |
| 2010/0195304 A1 | 8/2010 | Takao | |
| 2010/0258952 A1 | 10/2010 | Fjelstad | |
| 2011/0201213 A1 | 8/2011 | Dabov et al. | |
| 2011/0272825 A1 | 11/2011 | McGrath et al. | |
| 2012/0129382 A1 | 5/2012 | Regnier et al. | |
| 2012/0282807 A1 | 11/2012 | Regnier | |
| 2013/0040483 A1 | 2/2013 | Ngo et al. | |
| 2013/0088829 A1 | 4/2013 | Co | |
| 2013/0108210 A1 | 5/2013 | Uemura et al. | |
| 2013/0115500 A1 | 5/2013 | McClure et al. | |
| 2013/0181360 A1 | 7/2013 | Kim et al. | |
| 2013/0215563 A1 | 8/2013 | Behziz et al. | |
| 2013/0309809 A1 | 11/2013 | Eckhardt et al. | |
| 2014/0056592 A1 | 2/2014 | McColloch et al. | |
| 2014/0057487 A1 | 2/2014 | May | |
| 2014/0098969 A1 | 4/2014 | Oliveira | |
| 2014/0193160 A1 | 7/2014 | Yagisawa et al. | |
| 2014/0273629 A1 | 9/2014 | Canning et al. | |
| 2015/0111410 A1 | 4/2015 | Gingrich et al. | |
| 2015/0234437 A1 | 8/2015 | Gallina et al. | |
| 2015/0357736 A1 | 12/2015 | Swaminathan et al. | |
| 2016/0218455 A1 | 7/2016 | Sayre et al. | |
| 2018/0120906 A1 | 5/2018 | Reed et al. | |
| 2018/0132352 A1 | 5/2018 | Yanagihashi et al. | |
| 2018/0217341 A1 | 8/2018 | Smith et al. | |
| 2019/0182958 A1 | 6/2019 | Searls et al. | |
| 2019/0200450 A1 | 6/2019 | Mellitz et al. | |
| 2019/0319380 A1 | 10/2019 | Lloyd et al. | |
| 2019/0372251 A1 | 12/2019 | Huang et al. | |
| 2020/0212631 A1 | 7/2020 | Buck et al. | |
| 2021/0091496 A1 | 3/2021 | Cartier, Jr. et al. | |
| 2021/0194164 A1* | 6/2021 | Epitaux ................ | H01R 13/631 |

(56) References Cited

U.S. PATENT DOCUMENTS

| | | |
|---|---|---|
| 2021/0257788 A1 | 8/2021 | Cartier et al. |
| 2021/0265785 A1 | 8/2021 | Mongold et al. |
| 2021/0289617 A1 | 9/2021 | Mellitz et al. |
| 2022/0167497 A1 | 5/2022 | Fukao et al. |
| 2022/0304149 A1 | 9/2022 | Qiao et al. |

FOREIGN PATENT DOCUMENTS

| | | |
|---|---|---|
| CN | 1559164 A | 12/2004 |
| CN | 1925234 A | 3/2007 |
| CN | 101120491 A | 2/2008 |
| CN | 101882717 A | 11/2010 |
| CN | 102082376 A | 6/2011 |
| CN | 103168396 A | 6/2013 |
| CN | 103337749 A | 10/2013 |
| CN | 211530225 U | 9/2020 |
| EP | 1065758 A2 | 1/2001 |
| JP | 5605323 B2 | 10/2014 |
| KR | 10-1269784 B1 | 5/2013 |
| TW | I221197 B | 9/2004 |
| TW | I329398 B | 8/2010 |
| TW | M409564 U | 8/2011 |
| TW | I444120 B | 7/2014 |
| TW | 201519522 A | 5/2015 |
| TW | I525882 B | 3/2016 |
| TW | I577085 B | 4/2017 |
| TW | 201732493 A | 9/2017 |
| TW | 202033079 A | 9/2020 |
| TW | M611526 U | 5/2021 |
| TW | 202239297 A | 10/2022 |
| WO | 2016/053501 A1 | 4/2016 |
| WO | 2017/024244 A1 | 2/2017 |
| WO | 2020/014597 A2 | 1/2020 |

OTHER PUBLICATIONS

Wig et al., U.S. Appl. No. 61/714,871 filed Oct. 17, 2012.

Abot et al., Precise Monitoring of Damage Evolution in Laminated Composite Materials using Integrated Carbon Nanotube Fiber Sensors: Experimental Results and Validation; Conference: American Society for Composites, Sep. 2016, 14 pages.

Anandtech, SuperComputing 15: Intel's Knights Landing/Xeon Phi Silicon on Display, online article Ian Cutress dated Nov. 19, 2015, 8 pages, https://www.anandtech.com/show/9802/supercomputing-15-intels-knights-landing-xeon-phi-silicon-on-display.

Icrontic, Tech Tips: Rounded Cables, Supplied by Koolcases, published in Tech Nov. 20, 2002; 8 pages.

Intel Xeon Phi Processor: Your Path to Deeper Insight, Product Brief, Dec. 13, 2016, 4 pages.

Intel Xeon Phi Processors, Product Specification List dated Dec. 31, 2016, https://ark.intel.com/content/www/us/en/ark/products/series/75557/intel-xeon-phi-processors.html.

The Next Platform, Intel Knights Landing Yields Big Bang for the Buck Jump, online article by Timothy Prickett Morgan dated Jun. 20, 2016, 13 pages, https://www.nextplatform.com/2016/06/20/intel-knights-landing-yields-big-bang-buck-jump/.

\* cited by examiner

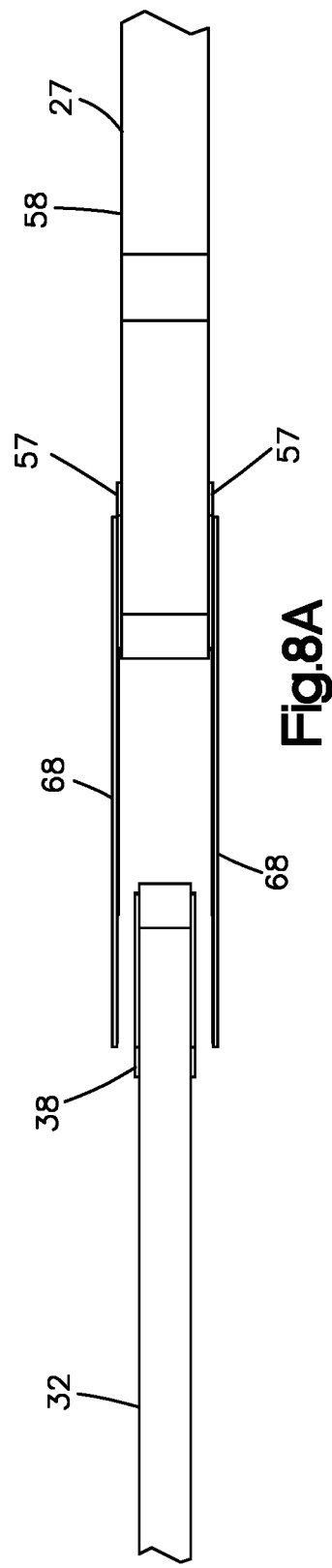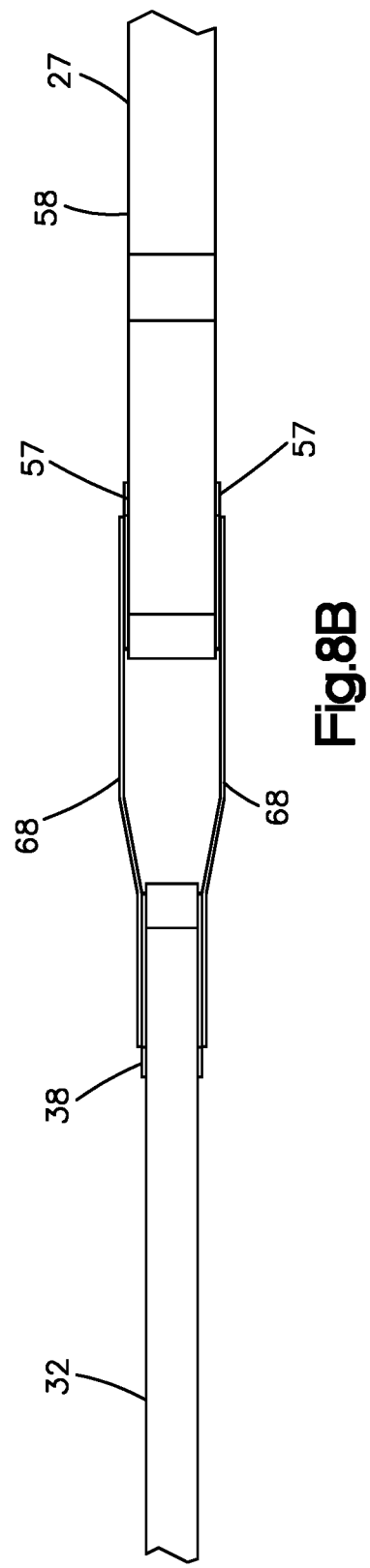

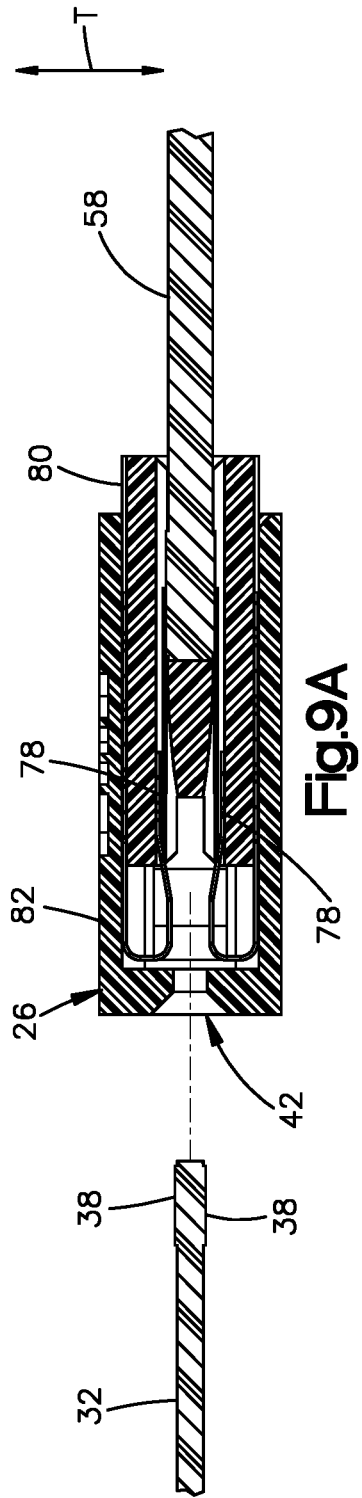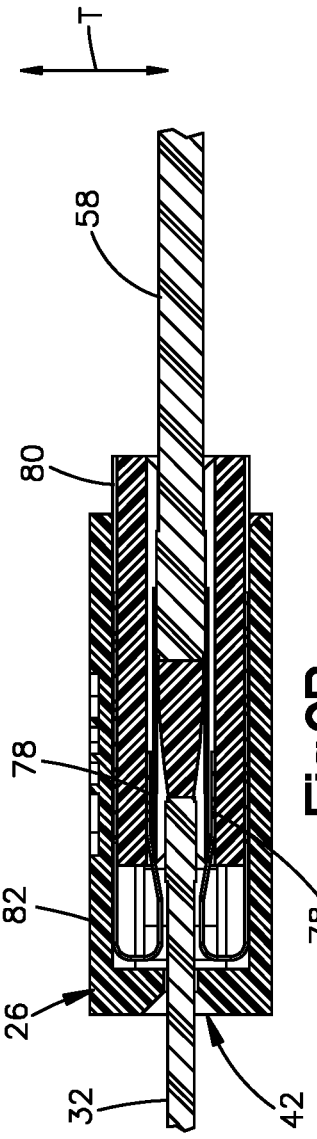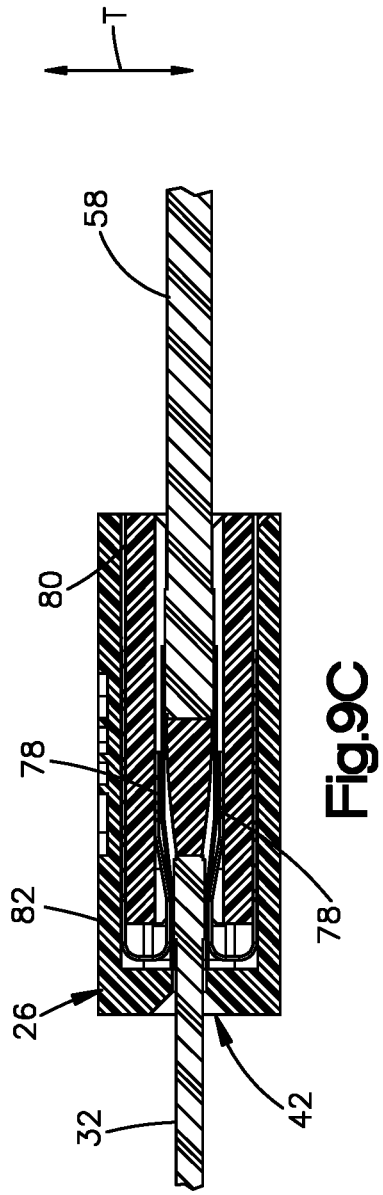

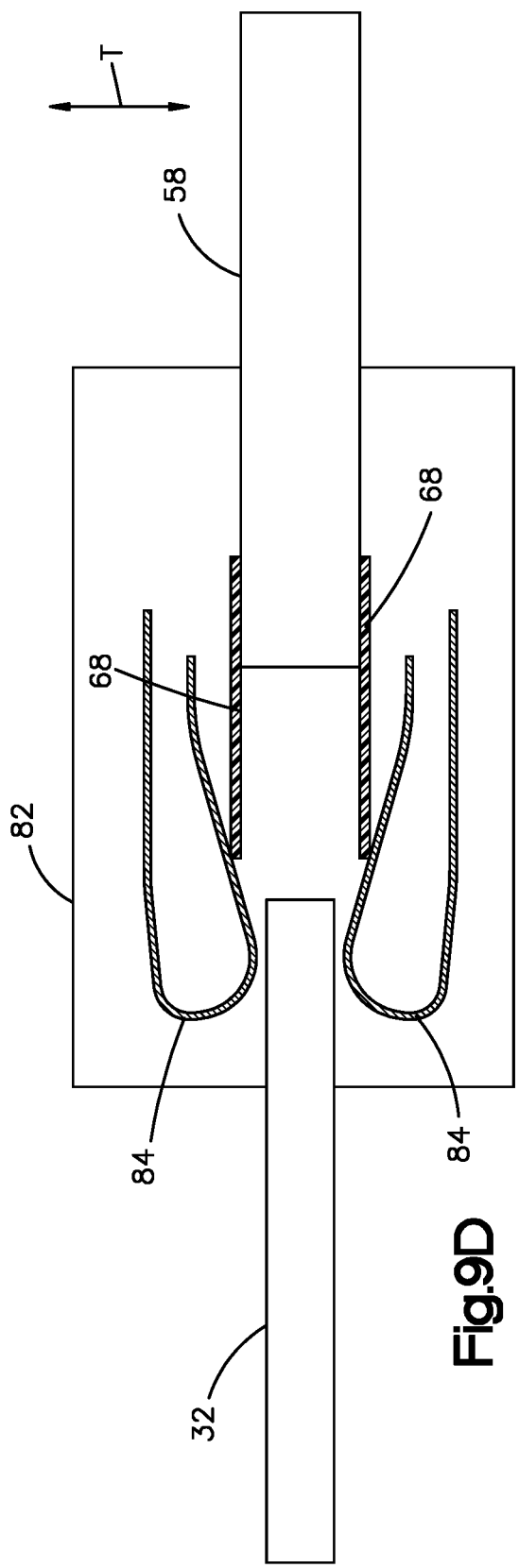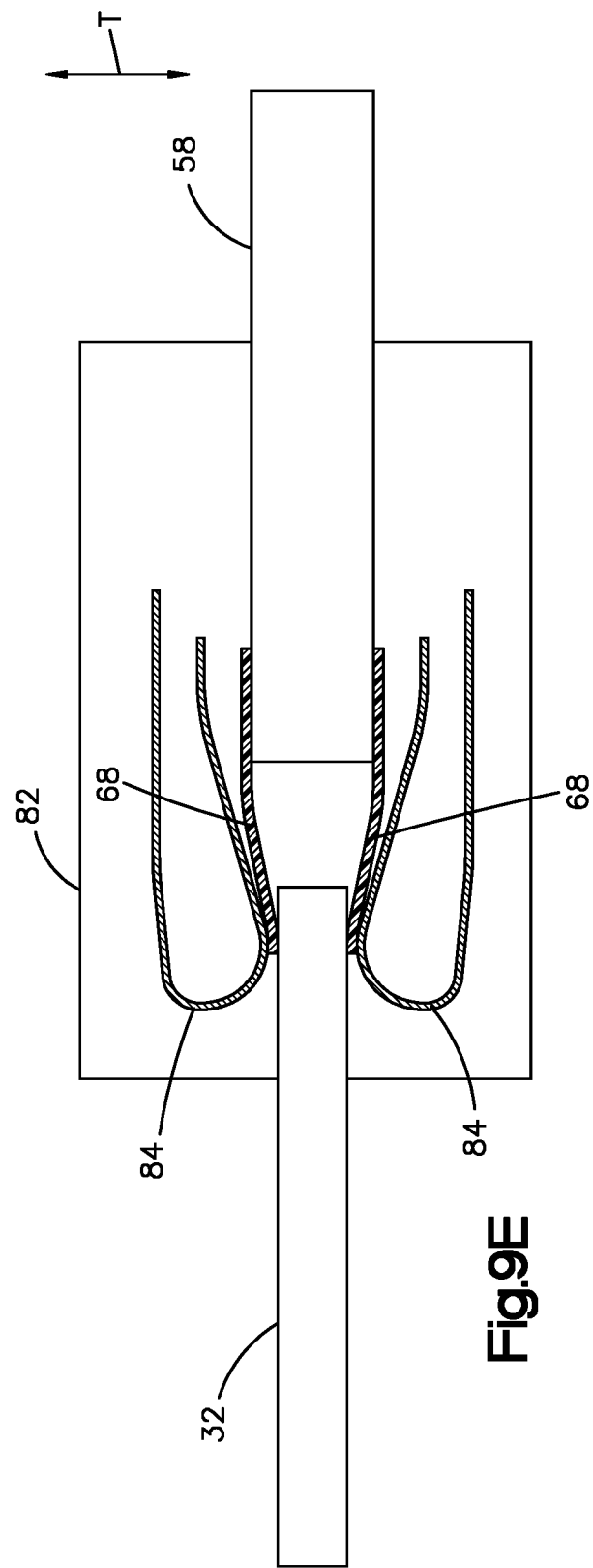

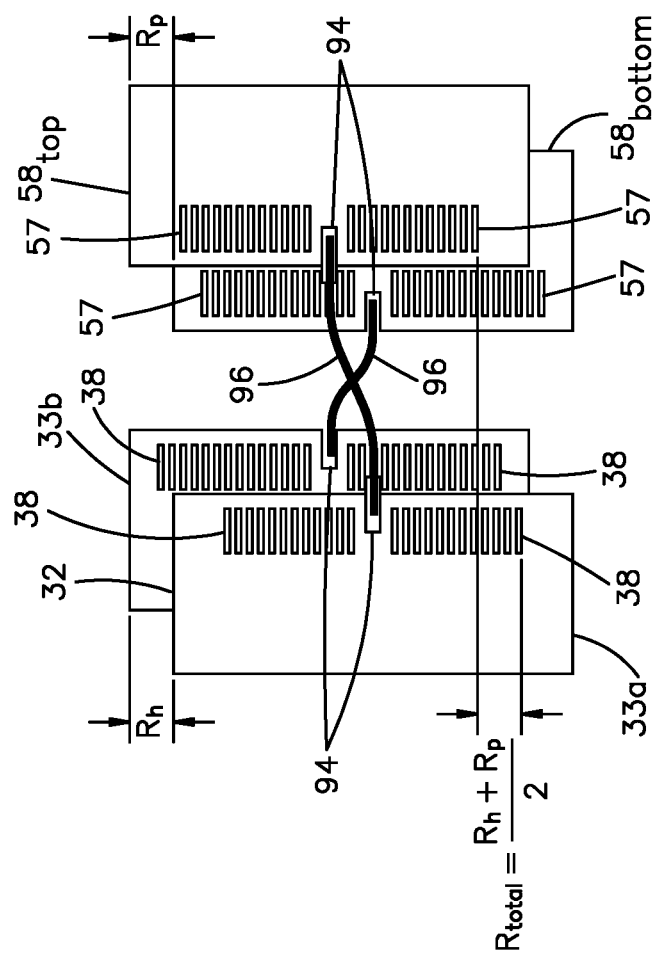
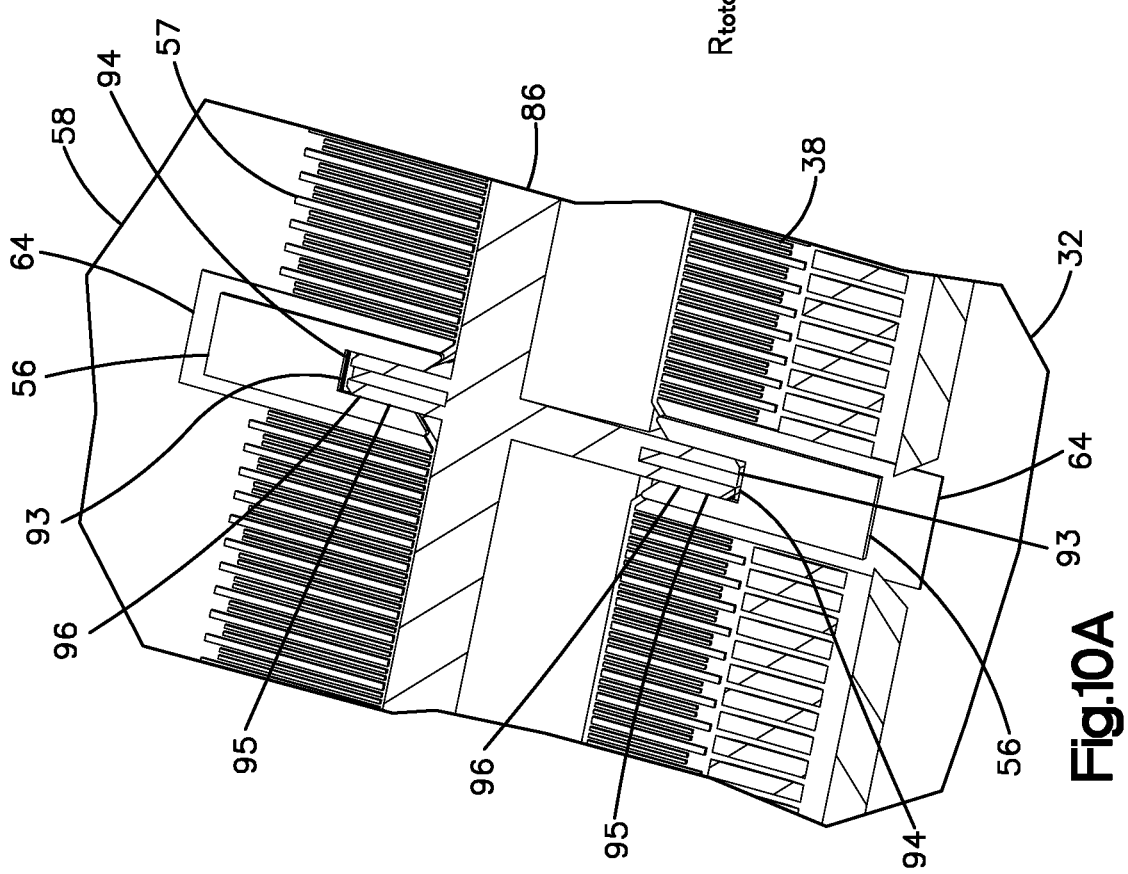

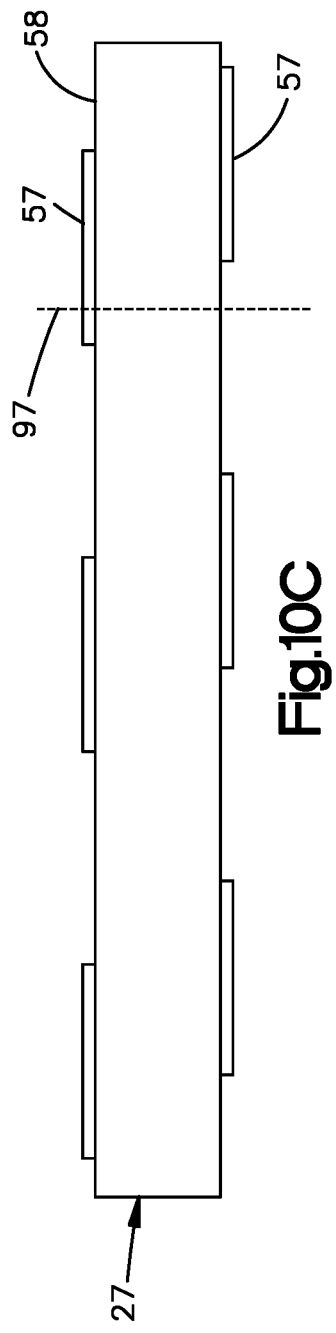
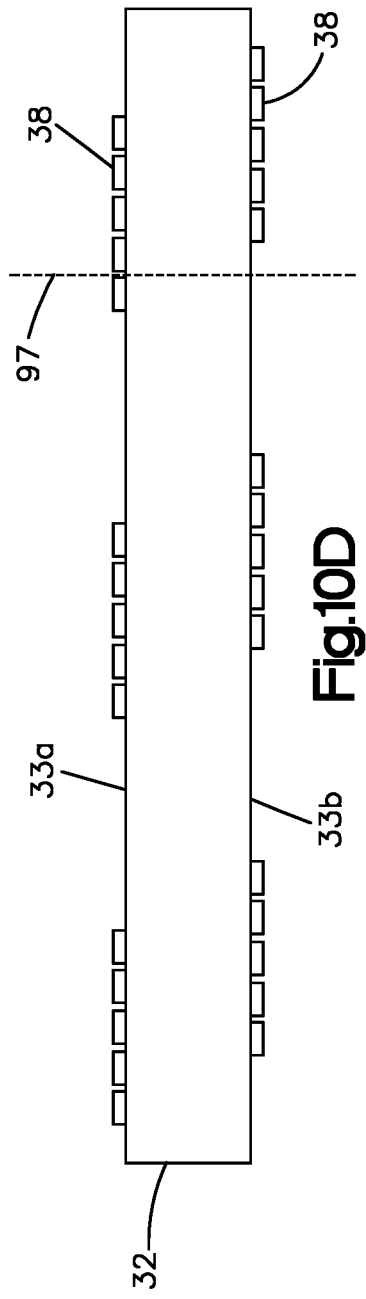
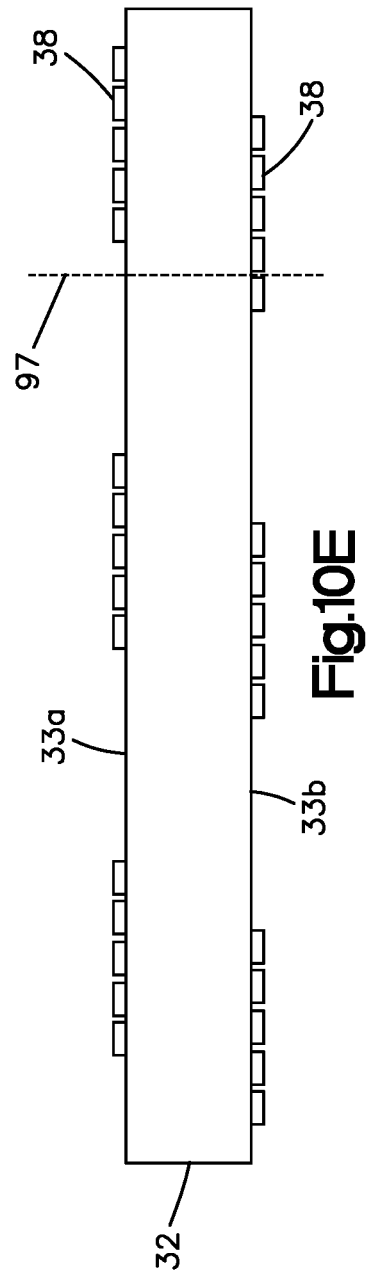

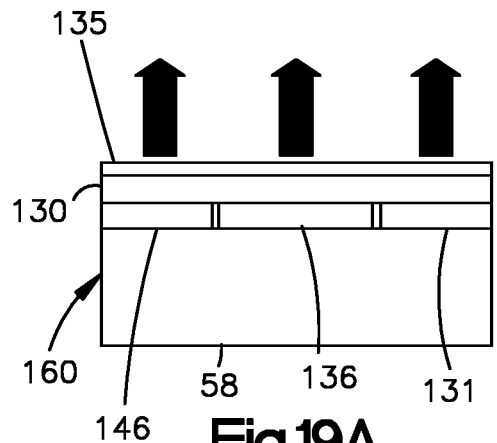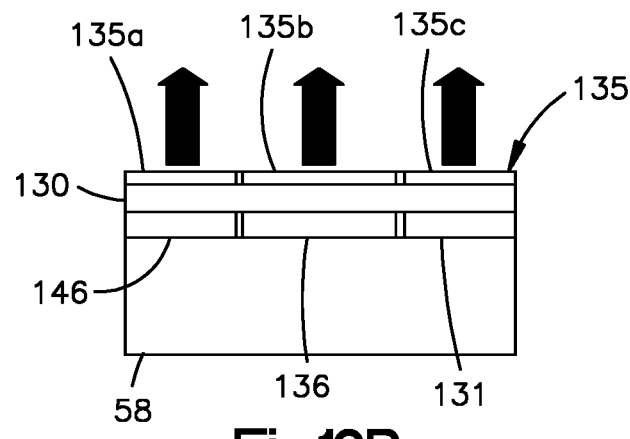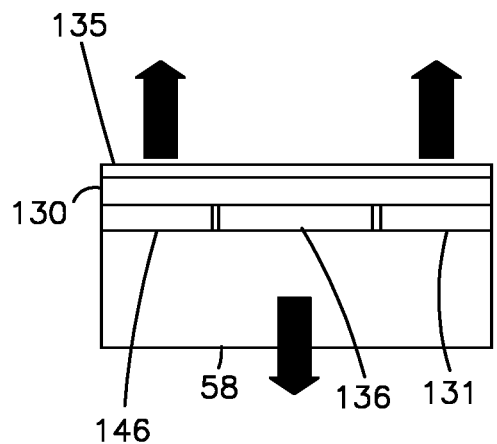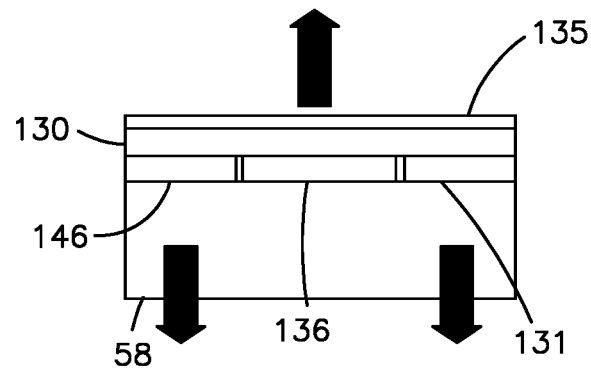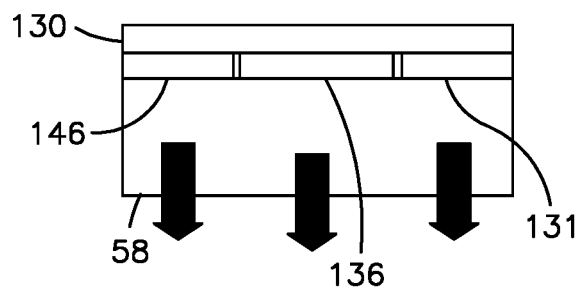

ULTRA-DENSE, LOW-PROFILE EDGE CARD CONNECTOR

CROSS-REFERENCE TO RELATED APPLICATIONS

This application is the National Stage Application of International Patent Application No. PCT/US2019/049458, filed Sep. 4, 2019 which claims priority to U.S. Patent Application Ser. No. 62/726,833 filed Sep. 4, 2018, U.S. Patent Application Ser. No. 62/727,227 filed Sep. 5, 2018, and U.S. Patent Application Ser. No. 62/812,492 filed Mar. 1, 2019, the disclosure of each of which is hereby incorporated by reference as if set forth in its entirety herein.

BACKGROUND

In a never-ending demand of network traffic growth, ASIC (application specific integrated circuit) switches, FPGAs (Field programmable gate arrays) or microprocessors are increasing their IO (input/output) bandwidth capability and channel counts. At the same time transistor sizes are getting smaller and smaller, with state-of-the-art node processing dropping from 12 nm to 7 nm. As a result, the ASIC die size remains almost constant, but its IO density is drastically increased. The challenge becomes then to create electrical, i.e. twinaxial cable, or optical interfaces that are dense enough (<0.5 mm electrical contact pitch, <2 mm channel density) to carry all these channels (512 channels) at an ultra-high speed, such as 112 Gbps per channel.

There is a need for connectors, capable of being mated and unmated, that can support high bandwidth electrical signals and have a high density, i.e. small spacing, between individual signal channels. The connectors need to be compact, so that they occupy a minimum of space allowing easy integration with other electronic components and ancillary elements, such as heat sinks that may be required for cooling during system operation.

SUMMARY

In one aspect of the present disclosure, a high density, edge-card, electrical connector can include a compliant circuit having electrically conductive traces formed on the surface of a flexible substrate. The electrical connector can further have a compression plate that is configured to force the compliant circuit against an electrical contact pad on a substrate to form an electrical connection between the electrical contact and the compliant circuit, thereby defining a separable interface between the electrical connector and the substrate.

In another aspect of the present disclosure, an interconnect system can be configured to place an extension card in electrical communication with an ASIC package substrate, the interconnect system including a separable interface between an extension card substrate of the extension card and the ASIC package substrate.

In another aspect of the present disclosure, an electrical connector can include a compliant electrical circuit having contact pads spaced from each other along a row direction at a contact pitch that is less than approximately 0.5 mm.

In another aspect of the present disclosure, a locking mechanism for an interconnect system that can include an electrical connector mounted on an edge of a printed circuit board. The interconnect system can further include a host printed circuit board that supports a substrate, wherein the substrate may be mated and unmated with the connector. The locking mechanism can be mounted on the host printed circuit board, and can allow free motion in the insertion direction of the connector to the substrate but prohibits motion in a retraction direction, wherein the locking mechanism does not constrain the position of the printed circuit board in at least one direction.

In another aspect of the present disclosure, an interconnect system includes an extension card substrate that defines a top surface and a bottom surface opposite the top surface along a transverse direction, and electrical contact pads disposed along an edge of the extension card substrate on both top and bottom surfaces and arranged along a row direction. The interconnect system can further include a top alignment block mounted to the top surface, wherein the top alignment block along the edge of the extension card substrate on the top surface; wherein the top alignment block is in mechanical alignment with the contact pads on the top surface of the extension card substrate. The interconnect system can further include a bottom alignment block mounted along the edge of the extension card substrate on the bottom surface, wherein the bottom alignment block is in mechanical alignment with the contact pads on the bottom surface of the extension card substrate.

In another aspect of the present disclosure, an interconnect system can include an electrical connector mounted to a first printed circuit board, the first printed circuit board having a thickness. The interconnect system can further include top and bottom compliant circuits mounted to the printed circuit board and disposed on a top of the first printed circuit board and a bottom of the first printed circuit board, respectively, wherein an opening between leading edges of the two compliant circuits is greater than or equal to the thickness of the first printed circuit board.

In another aspect of the present disclosure, an electrical interconnect system can include an IC package having an IC substrate and an IC die mounted to the IC substrate, wherein the IC substrate defines opposed top and bottom surfaces, and the IC package is mounted to a host substrate. The interconnect system can further include an electrical connector having electrical conductors that are in electrical communication with the opposed top and bottom surfaces of the IC substrate so as to establish an electrical path between the electrical connector and the IC package without the path first being routed through the host substrate.

In another aspect of the present disclosure, an optical transceiver can include an interposer defining a top surface and a bottom surface, and optical fibers supported by one of the top surface and the bottom surface. The optical transceiver can further include an optical engine supported by the other one of the top surface and the bottom surface, the optical engine comprising at least one light source, at least one light source driver, at least one photodetector, and a current-to-voltage converter.

In another aspect of the present disclosure, and IC package can include an IC die, an IC package substrate having a top surface on which the IC die is mounted, an opposed bottom surface, and four edges that define a perimeter of the IC package, wherein at least one edge of the IC package substrate has a row of electrical contacts distributed adjacent the at least one edge on at least one of the top or bottom surface of the IC package substrate.

In another aspect of the present disclosure, an IC package can include an IC die, a rectangular IC package substrate having a top surface on which the IC die is mounted, and an opposed bottom surface, and four edges that define a perimeter of the IC package. The IC package can further include an electrical connector mounted adjacent an edge of the IC package substrate.

BRIEF DESCRIPTION OF THE DRAWINGS

The following detailed description will be better understood when read in conjunction with the appended drawings, in which there is shown in the drawings example embodiments for the purposes of illustration. It should be understood, however, that the present disclosure is not limited to the precise arrangements and instrumentalities shown. In the drawings:

FIG. 8A shows a schematic cross-section of an electrical connector in an open or unclamped position;

FIG. 8B shows a schematic cross-section of the electrical connector of FIG. 8A shown in a closed or clamped position;

FIG. 9A shows a first step of mating an ultra-dense electrical connector to an ASIC package substrate;

FIG. 9B shows a second step of mating the ultra-dense electrical connector to an ASIC package substrate;

FIG. 9C shows a third step of mating the ultra-dense electrical connector to an ASIC package substrate;

FIG. 9D shows detail of various components of the electrical connector illustrated in FIGS. 9A-9C shown in the open position;

FIG. 9E shows detail of various components of the electrical connector illustrated in FIG. 9D shown in the closed position;

FIG. 10A shows a partial top plan view of an ASIC package substrate and extension card alignment principle;

FIG. 10B is an illustration of an alignment principle to compensate for top to bottom metallization registration offset for an ASIC package substrate and extension card;

FIG. 10C is a schematic cross-sectional view of an extension card with top and bottom contact pads misaligned along a first direction, and an average position therebetween;

FIG. 10D is a schematic cross-sectional view of an ASIC package substrate with top and bottom contact pads misaligned along the first direction, and the average position therebetween;

FIG. 10E is a schematic cross-sectional view of an ASIC package substrate with top and bottom contact pads misaligned along a second direction opposite the first direction, and the average position therebetween;

FIG. 19A is a schematic elevation view of a heat dissipation system of an optical transceiver in one example;

FIG. 19B is a schematic elevation view of a heat dissipation system of an optical transceiver in another example;

FIG. 19C is a schematic elevation view of a heat dissipation system of an optical transceiver in still another example;

FIG. 19D is a schematic elevation view of a heat dissipation system of an optical transceiver in yet another example;

FIG. 19E is a schematic elevation view of a heat dissipation system of an optical transceiver in yet another example;

DETAILED DESCRIPTION

The present disclosure is directed to an ultra-dense (<0.3 mm pitch), low profile, and high bandwidth edge card connector. Additionally, this interconnect approach allows connection of the edge card connector with a low insertion force, reduced or no wiping effect between the pads and the contacts, and very low stub effect, which minimizes signal integrity discontinuity and degradation. Representative, but non-limiting, electrical contact pitches may have an electrical contact patch that is less than or equal to approximately 0.5 mm electrical contact pitch resulting in a channel density of less than 2 mm. There may be 512 channels going to and from an ASIC package each operating at an ultra-high speed, such as 112 Gbps per channel with no more than 6% asynchronous worst-case multi-active cross-talk.

Figure 1:
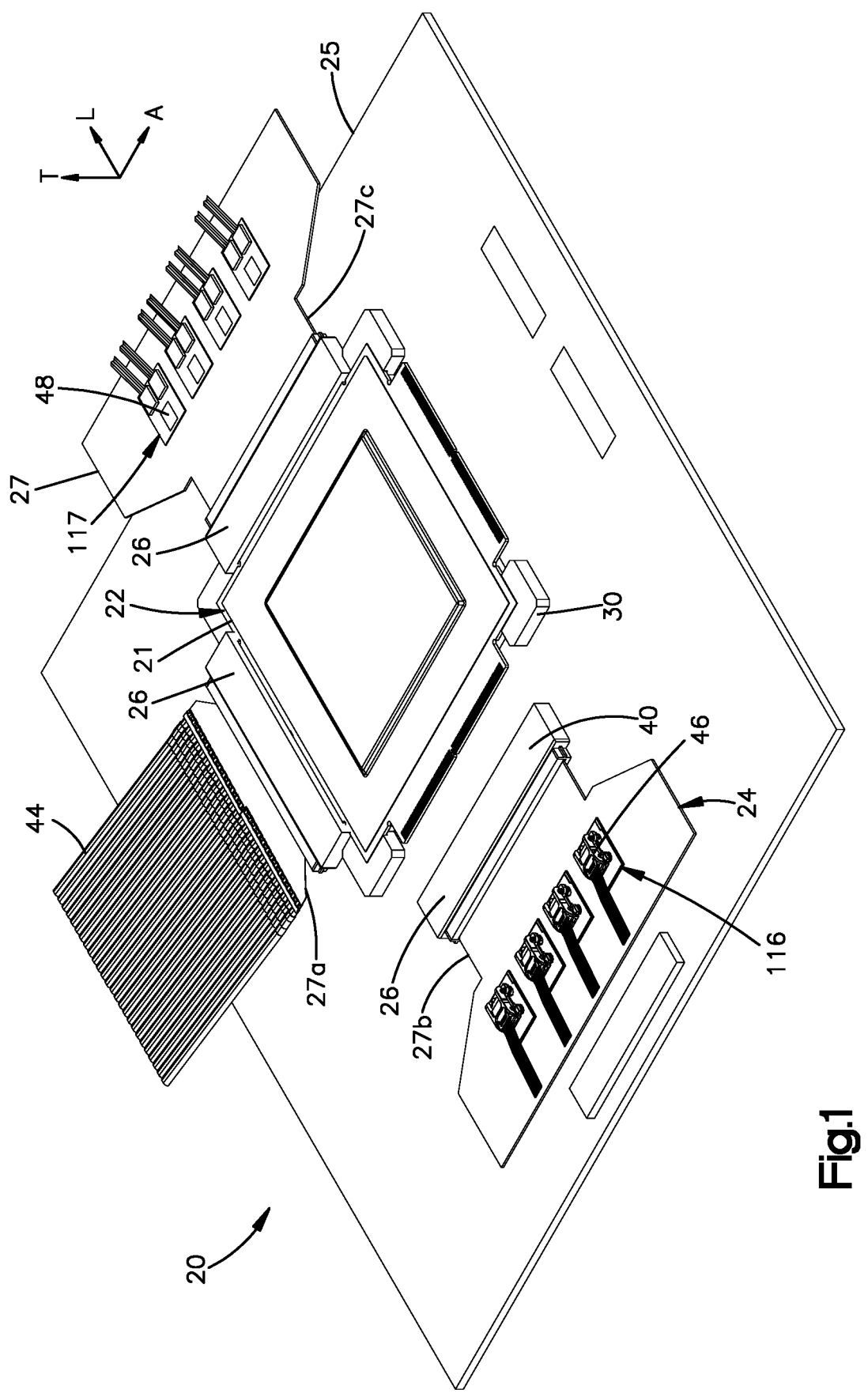
FIG. 1 shows an ASIC package seated in a socket, with an edge card interface on each side of the packaged die and three different interconnect interfaces: an electrical cable, a multi-mode optical engine, and single mode single-mode optical engine.
Figure 2:
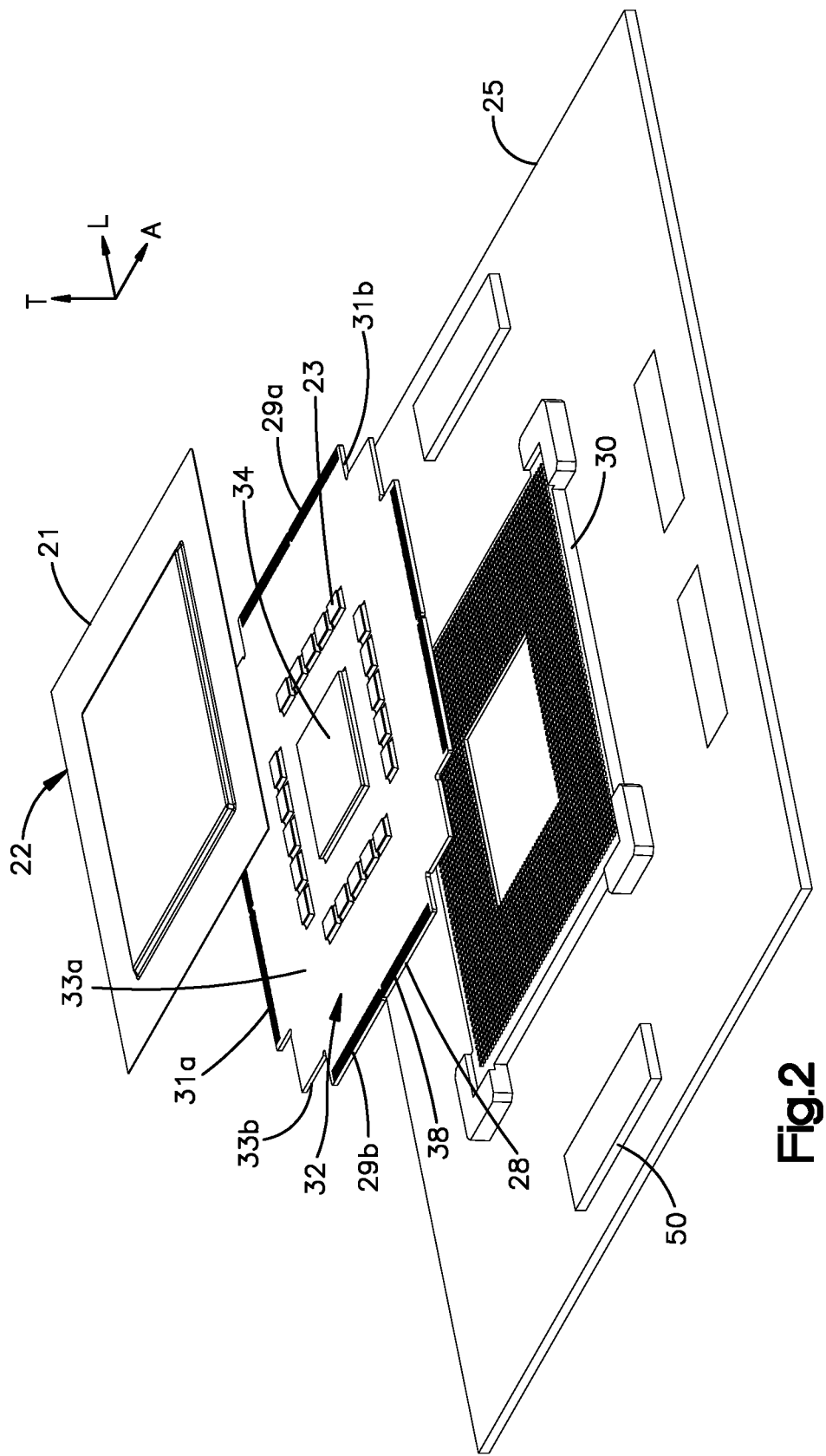
FIG. 2 shows an exploded view with a partial cut-away of an ASIC die mounted on a socket with contact pads on all four side of the ASIC package suitable for mating to ultra-dense edge card connectors.

Referring initially to FIGS. 1-2, a data communication system 20 can include an integrated circuit (IC) package 22, at least one data communication device 24 that is placed in electrical communication with the IC package 22, and a host substrate 25. The host substrate 25 can be configured as a host printed circuit board (PCB). The at least one data communication device 24 can be configured as at least one extension card 27. As will be described in more detail below, the at least one extension card 27 can mate directly with the IC package 22. That is, when the extension card 27 is mated with the IC package 22, an electrical path is established between the extension card 27 and the IC package 22 without traveling first through the host substrate 25. The IC package 22 can be mounted to the host substrate 25 so as to place the IC package in electrical communication with the host substrate 25. In particular, the data communication system 20 can include a socket 30 that is mounted to the underlying host substrate 25. The socket 30 can be configured as a land grid array (LGA) socket. The IC package 22 can be mounted to the socket 30 so as to thus mount the IC package 22 to the host substrate 25.

The IC package 22 can include an IC package substrate 32 and an IC die 34 that is mounted on the IC package substrate 32. The IC package 22 can further include a plurality of serializer/deserializer (SerDes) dies 23. The IC package 22 can further include an IC package lid 21 that is in thermal contact with the IC die 34 and facilitates heat transfer from the IC die 34 during operation. When the IC package 22 is mounted to the socket 30, the IC die 34 is placed in electrical communication with the host substrate 25. In some examples, the (IC) package 22 can be configured as an application specific integrated circuit (ASIC) package 22. Thus, the IC die 34 can be configured as an ASIC die 34, and the IC package substrate 32 can be referred to as an ASIC package substrate 32. While reference is made below to the ASIC package 22 as including the ASIC die 34 and the ASIC package substrate 32, it is recognized that the ASIC package 22 and ASIC components thereof can be otherwise referred to as an IC package and IC components thereof. The ASIC package substrate 32 can define a plurality of edges 28. The edges 28 can include first and second longitudinal edges 29a and 29b that are opposite each other along a longitudinal direction L. The edges 28 can further include first and second lateral edges 31a and 31b that are opposite each other along a lateral direction A that is perpendicular to the longitudinal direction L. The lateral edges 31a and 31b can extend from the first longitudinal edge 29a to the second longitudinal edge 29b. The lateral edges 31a-31b can be oriented perpendicular to the longitudinal edges 29a-29b, such that the ASIC package substrate 32 can define a rectangular shape.

The ASIC package substrate 32 can define first and second surfaces 33a and 33b that are opposite each other along a transverse direction T that is perpendicular to each of the longitudinal direction L and the lateral direction A. The first surface 33a can be disposed above the second surface 33b, and thus can be referred to as a top surface. The second surface 33b can be configured as a bottom surface 33b. All substrates disclosed herein can similarly define a top surface and a bottom surface opposite the top surface along the transverse direction T. The top surface of the host substrate 25 can face the bottom surface 33b of the ASIC package substrate 32. The top surface of the host substrate 25 can face the bottom surface of the extension card 27.

Further, all substrates disclosed herein can include longitudinal edges opposite from each other along the longitudinal direction L, and lateral edges opposite each other along the lateral direction A.

The ASIC die 34 can thus be placed in electrical communication with the host substrate 25 thru the LGA socket 30. The ASIC package 22 can include a plurality of electrical conductors that are configured to mate with complementary electrical conductors of a complementary electrical component. In one example, the electrical conductors are configured as electrical contact pads 38 that are carried by one or both of the first and second surfaces 33a and 33b. For instance, the contact pads 38 can be disposed at one or more up to all of the edges 29a-29b and 31a-31b of the ASIC package substrate 32. The complementary electrical component can be configured as at least one electrical connector 26. The at least one electrical connector 26 can be mounted to the extension card 27. The electrical connector 26 can be configured as an edge card connector.

The electrical connector 26 includes an electrically insulative connector housing 40 and a plurality of electrical contacts supported by the connector housing 40. As will be appreciated below, the electrical contacts of the electrical connector 26 can be defined by at least one compliant circuit 68 (see FIG. 5). The connector housing 40 can define a receptacle 42 (see FIG. 3) that is configured to receive one of the edges 29a-29b and 31a-31b so as to mate the electrical contacts with respective ones of the electrical contact pads 38 at the one of the edges of the ASIC package substrate 32, thereby also mating the respective extension card 27 to the ASIC package. Thus, it will be appreciated that the electrical connector 26 can mate directly with the IC package 22. That is, when the electrical connector 26 is mated with the IC package 22, and in particular with the IC package substrate 32, an electrical path is established between the electrical connector and the IC package 22 without the path first being routed through the host substrate 25.

Electrical connectors 26 that are mounted to a plurality of different extension cards 27 can be mated to different edges 28 of the ASIC package substrate 32. For instance, electrical connectors 26 mounted to three different extension cards 27 can be mated to three edges, respectively, of the ASIC package substrate 32. One or more electrical connectors 26 can be mounted to each extension card 27 and mated with a respective one of the edges of the ASIC package substrate 32. The fourth edge of the ASIC package substrate 32 can be left unconnected if desired. The LGA socket 30, can carry power supply and low speed control signals to the ASIC package 22. The electrical connector 26 can support high-speed signals. As described above, the electrical connectors can be mounted to respective extension cards 27 that support different high-speed electronic components, such as memory, microprocessor, field programmable gate arrays (FPGA), graphics processing units (GPUs), as well as support different types of transmission medium.

The extension cards 27 can take many forms including, but not limited to, 1) an electrical extension card 27a with electrical cables 44 (such as twin-axial cables) mounted thereto, 2) an optical multi-mode (MM) extension card 27b with one or more optical transceivers 116 having multi-mode optical engines 46 mounted thereto, and 3) an optical single-mode (SM) extension card 27c with one or more optical transceivers 117 having single-mode optical engines 48 mounted thereto. These could be silicon photonics based optical engines. The electrical cables 44 and optical transceivers 116 and 117 can be referred to as examples of data communication devices. Data communication devices supported by the extension cards 27, however, are not limited to the electrical cables 44 and optical transceivers 116 and 117 shown.

The electrical extension cards 27a can be considered as passive extension cards, whereas the optical MM and SM extension cards 27a and 27b may be considered as active extension cards. Difference between passive and active extension cards are that active extension cards typically include additional electrical contacts for power supply and control signals, and active extension cards can further include electronic chips that boost or clean high speed signals. These connections can be supplied by secondary low speed connectors mounted on the PCB. Active extension cards may also include an optical-to-electrical conversion element or electrical-to-optical conversion element.

Low speed electrical connections may be made to the extension card 27 thru a secondary low speed connector 50 on the host substrate 25 that mates with an electrical connector on the bottom surface of the extension card 27. This low speed connector may be removeable from the host substrate 25 depending on the configuration of the extension card 27. The extension card 27a can include electrical cables that extend along one or both of the top and bottom surfaces of the extension card. When the electrical cables extend along the bottom of the extension card 27a, the electrical cables could interfere with a secondary low speed connector should one be present on the host substrate 25. Therefore, in some examples, the electrical extension card 27a can be configured as an active extension card if an electronic driver is mounted to the extension card 27a in order to extend its reach.

Figure 3:
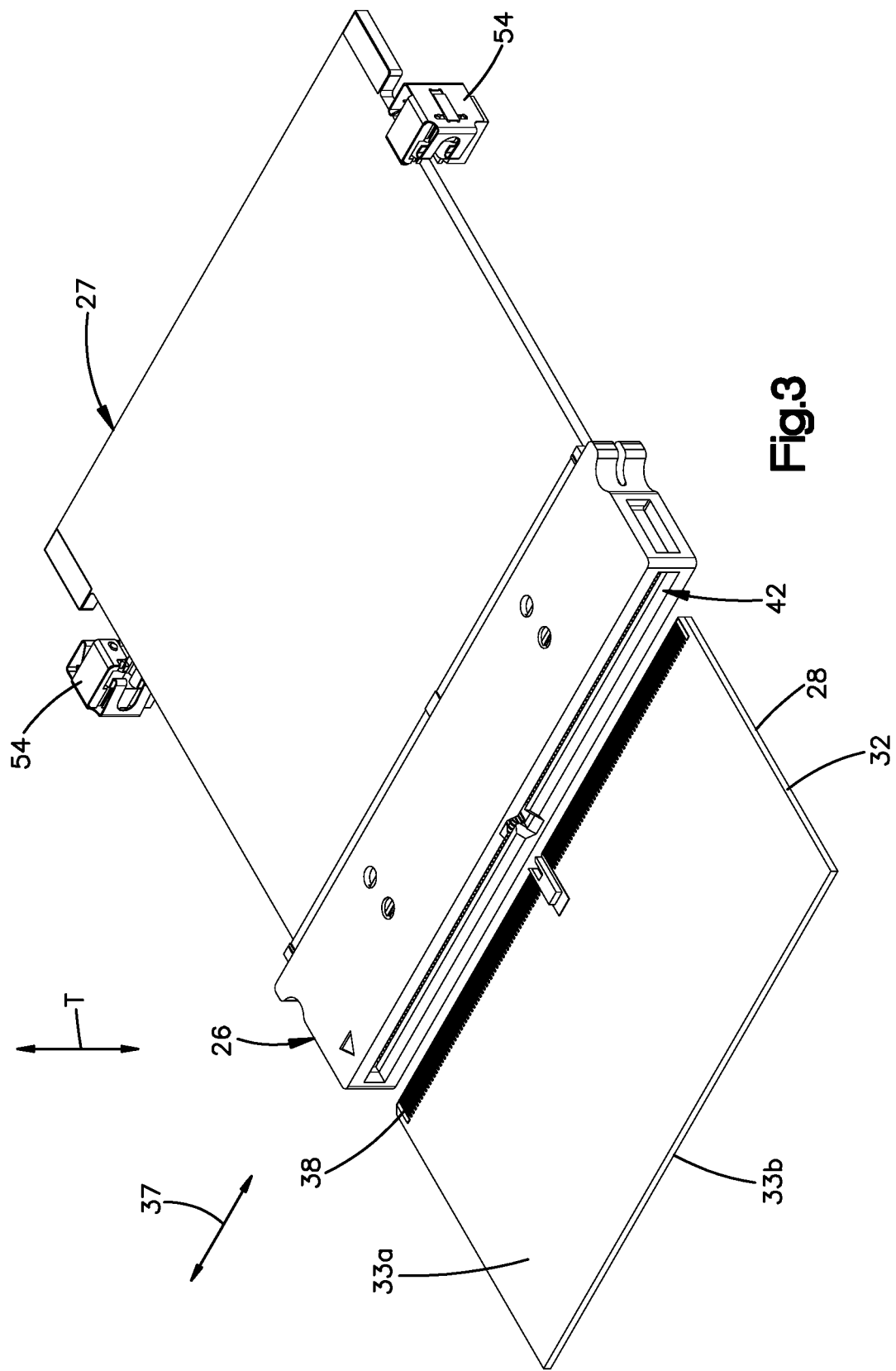
FIG. 3 shows a simplified implementation of an ultra-dense edge card connector.

Referring now to FIG. 3, and as described above, the ASIC package substrate 32 can include a plurality of contact pads 38 supported on one or both of the first and second surfaces 33a and 33b along one or more of the edges 28. The contact pads 38 can be dense. For instance, the contact pads 38 can be arranged along a respective row direction 37 having a contact pitch that ranges from approximately 0.2 mm to approximately 0.3 mm. The extension card 27 supports an electrical connector 26 that is oriented such that the electrical contacts of the electrical connector 26 are arranged along a row direction that is parallel to an edge of the extension card 27. The edge of the extension card 27 can be disposed adjacent a respective edge 28 of the ASIC package substrate 32. The term "approximate" and "substantial" and derivatives thereof as used herein recognizes that the referenced dimensions, sizes, shapes, directions, or other parameters can include the stated dimensions, sizes, shapes, directions, or other parameters and up to ±20%, including ±10%, ±5%, and ±2% of the stated dimensions, sizes, shapes, directions, or other parameters.

In accordance with one aspect of the present disclosure, the electrical connector 26 can maintain a low profile along the transverse direction T, also referred to as a height. In one example, the height of the electrical connector 26 can be approximately 4 mm. The height of the electrical connector 26 that extends above the ASIC package substrate 32 when mated to the ASIC package substrate may be less than or equal to approximately 1.5 mm. Thus, in one example, the height of the electrical connector 26 that extends above the ASIC package substrate 32 when mated to the ASIC package substrate may be less than or equal to approximately half the height of the electrical connector 26. Thus, the electrical connector 26 does not impeded access to the to the top of the ASIC package 22. The data communication system 20 can include a heat dissipation member 52 (see FIG. 20B) that can include one or both of an air cooled heatsink or liquid cooled block to be disposed on top of the ASIC package 22, facilitating cooling of the ASIC package 22. The data communication system 20 can further minimize any technology disruption on the packaging of the ASIC and maintains the current production approach of the silicon die vendors.

With continuing reference to FIGS. 1-3, the data communication system 20 can further include at least one locking mechanism 54 that can be attached to the extension card 27. The locking mechanism 54 can further be mounted to the host substrate 25, thereby securing the extension card 27 with respect to movement along a direction away from the ASIC package substrate 32 a distance sufficient to unmate the extension card 27 from the ASIC package substrate 32 once the two are mated. In one example, the locking mechanism 54 can substantially prevent the extension card 27 from moving with respect to the host substrate 25, and thus with respect to the ASIC package substrate 32, as described in more detail below. In one example, the locking mechanism 54 does not mechanically constrain the extension card 27, so that the positioning of the extension card 27 is controlled by an alignment block 56 on the extension card 27 (see FIG. 4) which mates with alignment features in the electrical connector 26 as described in more detail below.

Figure 4:
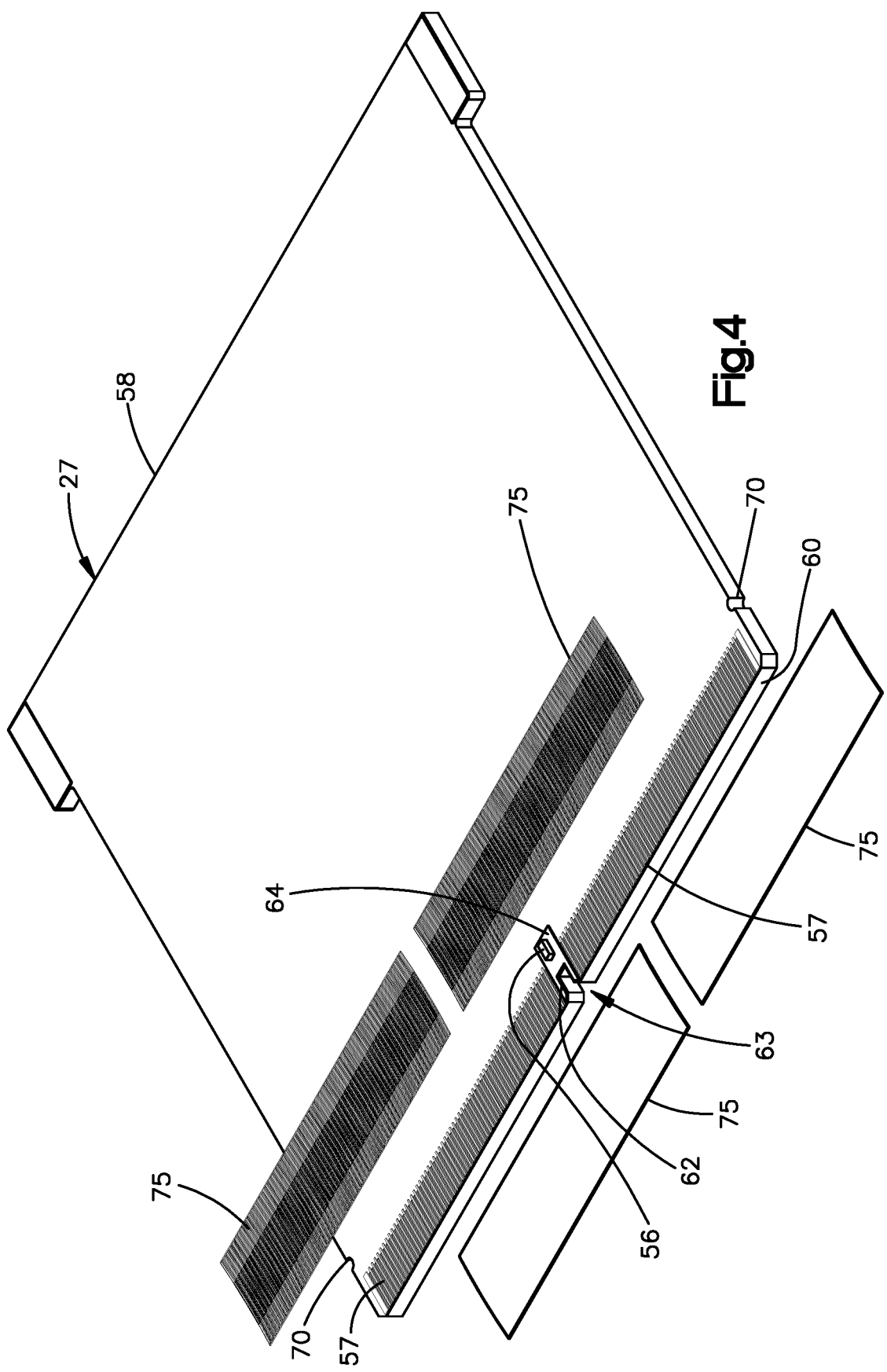
FIG. 4 shows an exploded view of a portion of an edge card connector.

Referring now to FIGS. 3-4, the extension card 27 can be configured as an extension card substrate 58 having a front edge 60. The extension card substrate 58 can be configured as an extension card PCB. The extension card 27 can include a plurality of electrical contact pads 57 that extends along the front edge 60 of the extension card substrate 58. The substrate 58 may be an organic material, glass, ceramic, or other insulative material. The electrical contact pads 57 may be arranged in groups of one or more rows that extend along the row direction and may be situated on both the top and bottom surfaces of the extension card 27. The extension card 27 can further include an alignment member 62 along the front edge 60. The alignment member 62 can be configured as an alignment notch 63 in the extension card substrate 58. The alignment member 62 can be substantially centered with respect to the front edge 60 of the extension card substrate 58. Further, the alignment notch 63 can be larger than a slot in the alignment block 56. The alignment block 56 can be mounted proximate to the front edge 60 of the extension card substrate 58. The extension card 27 can include at least one alignment block 56 on the top surface of the extension card substrate 58 and on the bottom surface of the extension card substrate 58. Similarly, the ASIC package substrate 32 can include at least one alignment block 56. The ASIC package can include at least one alignment block 56 on the top surface 33a of the ASIC package substrate 32 and at least one alignment block on the lower surface 33b of the ASIC package substrate 32.

An alignment pad 64 for the alignment block 56 can be disposed between adjacent groups of contact pads 57 on both the top and bottom of the extension card substrate 58. The alignment pad 64 and contact pads 57 may be fabricated on the extension card substrate 58 during the same processing step so they are precisely positioned relative to each other. The processing step can be a photolithographic processing step. Dimensional tolerances of less than approximately 10 microns should be attainable during the photolithographic processing step. The contact pads 57 can be configured as solder reflow pads suitable to make a solder connection, or can be configured for ultrasonic, thermosonic, or any suitable other type of bonding, which yields a low impedance electrical path and mechanical bond between the contact pad 57 and an electrically conductive trace 66 on a compliant circuit 68 (see FIG. 5).

At least one compliant circuit 68 can thus be mechanically and electrically attached to the extension card substrate 58. For instance, at least one compliant circuit 68 can be mechanically and electrically attached to the top surface of the extension card substrate 58. In one example, a pair compliant circuits 68 can be mechanically and electrically attached to the top surface of the extension card substrate 58 in a side-by-side arrangement. Further, at least one compliant circuit 68 can be mechanically and electrically attached to the bottom surface of the extension card substrate 58. In one example, a pair compliant circuits 68 can be mechanically and electrically attached to the bottom surface of the extension card substrate 58 in a side-by-side arrangement.

The alignment block 56 can be secured to the alignment pad 64, thereby mounting the alignment block 56 to the extension card substrate 58. For instance, the alignment block 56 can be secured to the alignment pad 64 using a surface mount technology (SMT) assembly process, which can have an accuracy ranging from approximately 10 microns to approximately 50 microns, such as from approximately 30 microns to approximately 35 microns. Alternatively, the alignment block 56 can be secured to the alignment pad 64 using a die-bonding process that can have an accuracy ranging from approximately 1 micron to approximately 5 microns. It should be appreciated that any suitable alternative method can be used to secure the alignment block 56 to the extension card substrate 58. Alignment of the alignment block 56 with the contact pads 57 of the extension card 27 can be within a tolerance that is within 5%, 10% or 20% of the contact pad width. Such an alignment tolerance may be on the order of several microns to several tens of microns. Thus, the alignment block can be precisely aligned with the contact pads 57 which, along with other aspects of the present disclosure, can allow for a small contact pitch of less than approximately 0.3 mm between contact pads 57 of the plurality of contact pads 57 along a respective row that is oriented along the row direction. The extension card substrate 58 can further include at least one retainer member that can be configured as retainer notch 70 configured receive a complementary retainer member of the electrical connector 26 that is mounted to the extension card 27. For instance, the extension card substrate 58 can include a retainer notch 70 in each of opposed edges of the extension card substrate 58. The front edge of the extension card substrate 58 having the contact pads 57 can extend between the opposed edges of the extension card substrate 58.

Figure 5:
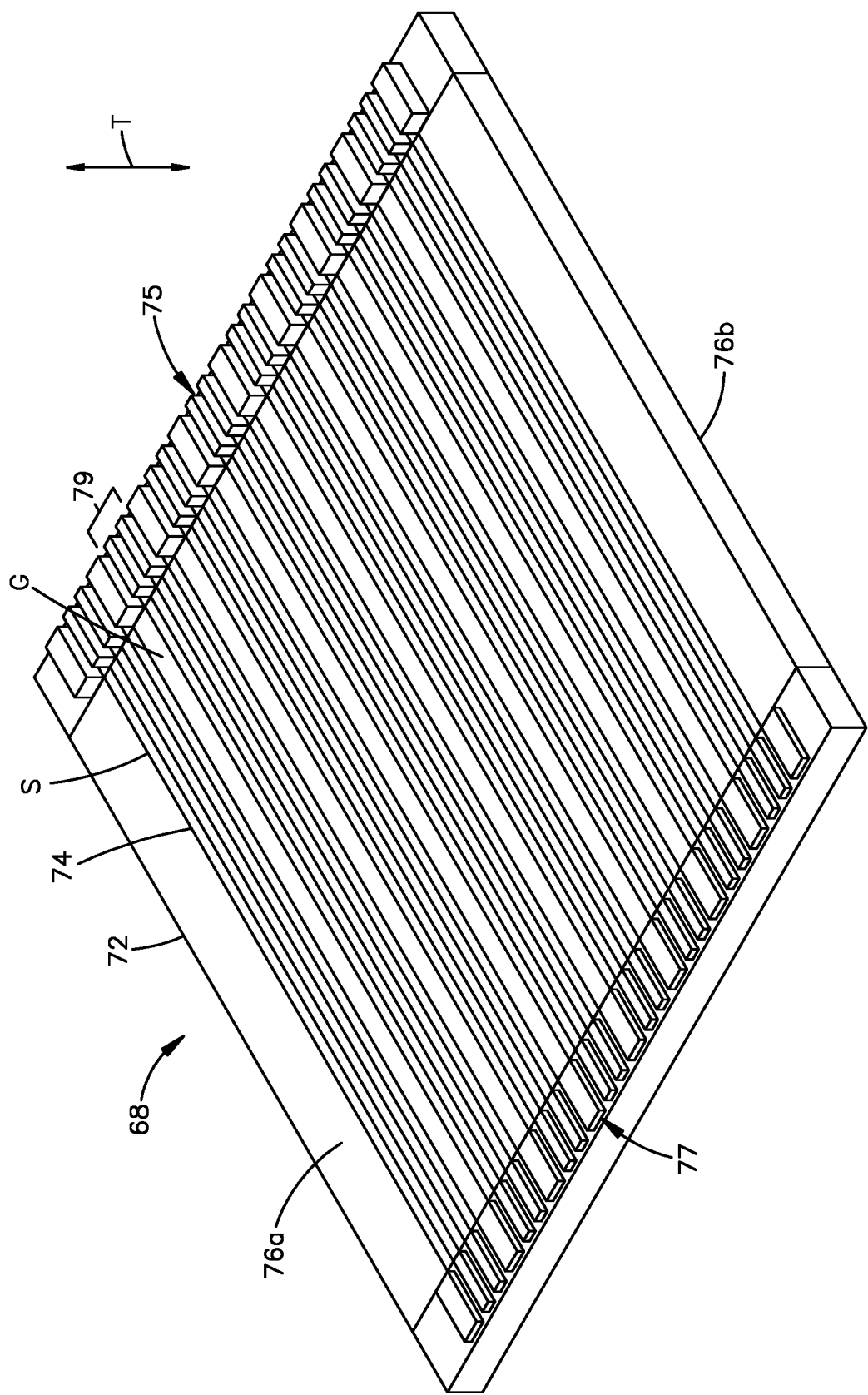
FIG. 5 shows a compliant circuit with solder attachment on one end (right) and electrically conductive ductile bumps for enhanced contact capability on the other end (left)

Referring now to FIG. 5, the compliant circuit 68 can be soldered or permanently attached to the extension card substrate 58, thereby mounting the extension card 27 to the electrical connector 26. The compliant circuit 68 can include a thin dielectric substrate 72, such as an organic or glass substrate. The substrate 72, and thus the compliant circuit 68, can be flexible, and can be substantially planar in its unflexed condition. Alternatively, the substrate 72 it may have some set curl or other nonplanar shape. The compliant circuit 68 may be metalized so as to define electrically conductive traces 74 on a first major surface 76a of the substrate 72. The electrically conductive traces 74 can span a substantial entirety of the length of the flexible substrate 72. In one example, the length of the conductive traces 74 may be approximately 6 mm, though it should be appreciated that longer or shorter trace lengths can be used. A second major surface 76b opposite the first major surface 76a along the transverse direction T can be metallized to form a ground plane. The electrically conductive traces 74 can include signal traces S that may be arranged in pairs to form a differential signal pairs 79 suitable for transmitting high bandwidth electrical signals. The differential signal pairs 79 can be arranged as a co-planar electrical waveguide structure. The electrically conductive traces can include at least one ground trace G disposed between adjacent ones of the signal traces.

The flexibility of the compliant circuit 68 allows the compliant circuit 68 to contact the electrical contact pads 38 of the ASIC package substrate 32 when the ASIC package substrate 32 is inserted into the electrical connector 26, and the compliant circuits 68 are bent inward by structure of the electrical connector 26 that are described below. Also, the individual electrically conductive traces 74 along an edge of the compliant circuit 68 can be positionally varied along the transverse direction T to conform to variations in height or straightness of the ASIC package substrate 32 when electrical connections are made between the compliant circuit 68 and the ASIC package substrate 32. This also allows substrates with different thickness to be placed in electrical communication with each other on opposed sides of the electrical connector 26.

The electrically conductive traces 74 may terminate along one edge of the compliant circuit 68 at first electrical contact pads 75 suitable to be soldered to the reflow pads of the extension card substrate 58 as described above. A solder mask can cover the compliant circuit 68 during the soldering process if desired. The mask can later be removed. Soldering is one of several methods that can be used to provide a permanent electrical and mechanical connection between the compliant circuit 68 and the extension card substrate 58. Gold-tin solder may be used to make this connection, although other types of solders may be used such as, but not limited to, SnAgCu. The opposed ends of the electrically conductive traces 74 can terminate at second electrical contact pads 77 suitable to make an electrical connection with a mating electrically conductive contact pad 38 of the ASIC package substrate 32. The electrical contact pads 75 and 77 can be compliant or can be a ductile conductive bump having a height of 30-50 microns. This allows for further accommodation for any height variations in the ASIC package substrate contact pads 38. In some embodiments, the contact pads 77 do not have a geometry that is distinguishable from the electrical traces, and are defined by respective ends of the electrical traces. It is thus appreciated that the electrical connector 26 can include a plurality of electrical conductors. The electrical conductors can be defined by one or more of the electrically conductive traces, the electrical contact pads 75, and the electrical contact pads 77. The electrical contact pads 75 can be referred to as first electrical contact pads, and the electrical contact pads 77 can be referred to as second electrical contact pads. It should be appreciated, of course, that the electrical connector 26 can include any suitable alternatively constructed electrical conductors as desired that are configured to place the ASIC substrate 32 in electrical communication with the extension card substrate 58.

It should be appreciated in one example that the individual contact pads 75 and 77 can all be mechanically connected to each other by the flexible substrate 72. This eliminates the problem of a single bent finger that could otherwise render the electrical connector 26 inoperable. Since the compliant circuit contact pads 75 and 77 are on a flexible circuit, the contact pads 75 and 77 need not be arranged in a straight line when mated with another substrate. The compliant circuit 68 can flex to accommodate bowing or warping in the mating substrate.

Figure 6:
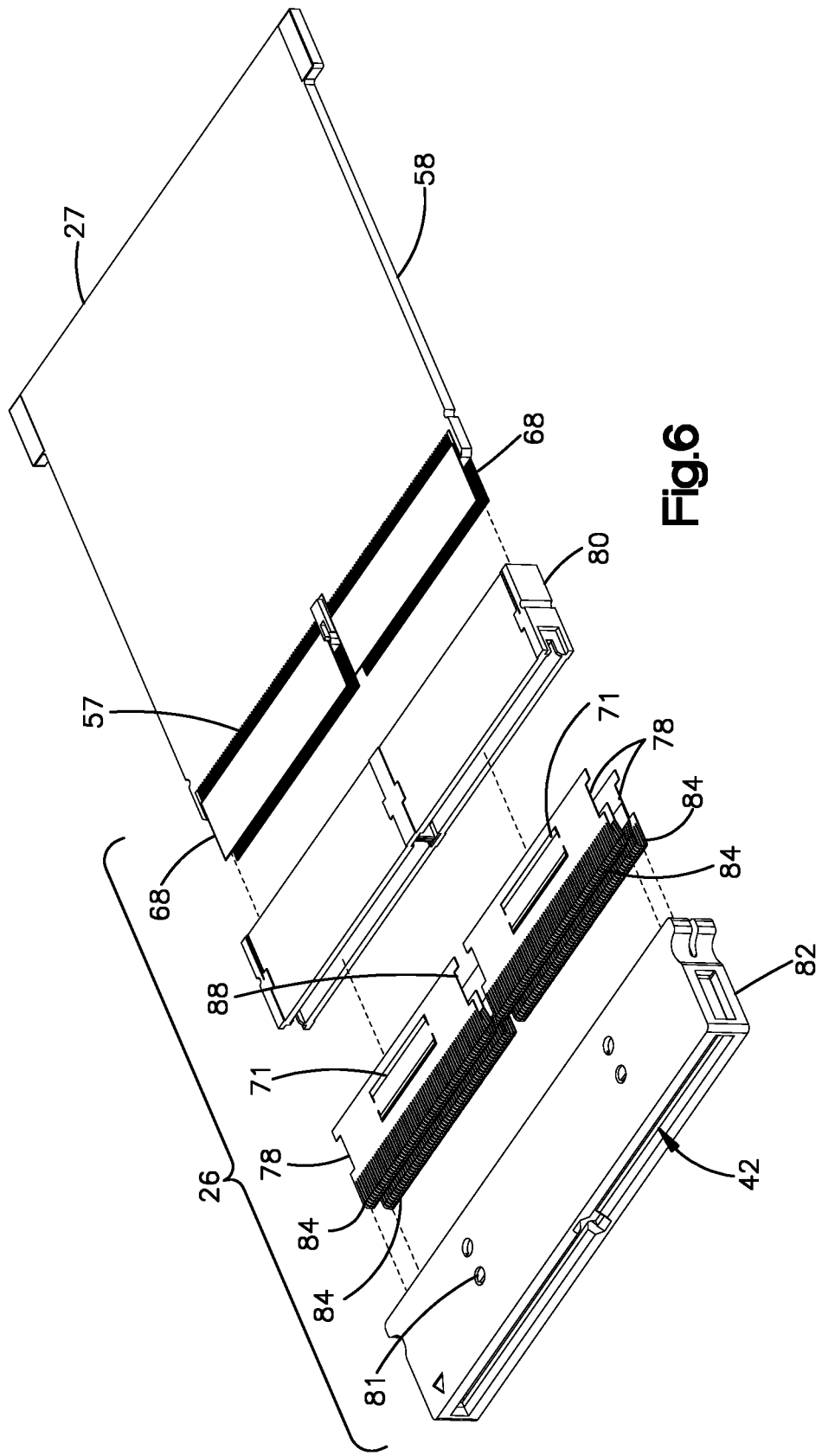
FIG. 6 shows an exploded view of a pre-assembled extension card with four compliant circuits and an alignment block.

Referring now to FIG. 6, the edge card connector 26 can include at least one compliant circuit 68, at least one compression plate 78, a core body 80, and a latch body 82. The compliant circuit 68 can include electrically conductive traces 74 (FIG. 5) that are placed in electrical communication with electrically conductive pads 57 of the extension card 27 as described above. The at least one compliant circuit 68 can be mounted to the extension card substrate 58. For instance, at least one compliant circuit 68 can be mounted to a top surface of the extension card substrate 58, and at least one compliant circuit 68 can be mounted to a bottom surface of the extension card substrate 58. In one example, a first pair of compliant circuits 68 can be mounted to the top surface of the extension card substrate 58, and a second pair of compliant circuits 68 can be mounted to the bottom surface of the extension card substrate 58. For clarity, other electrical elements are not shown mounted to the extension card substrate 58, though in practice various electrical elements may be mounted. That is the extension card 27 can be pre-assembled and can include a substrate with various electronic components already mounted on the card by soldering or suitable alternative attachment.

The core body 80 can be formed from a flexible, electrically insulative material, such as plastic. The core body 80 can fit over the compliant circuits 68 and the extension card substrate 58. The core body 80 can further include one or more retainer members that are configured to couple to the retainer member of the extension card substrate 58. For instance, the core body 80 can include a retainer projection that is received in the retainer notch 70 of the extension card substrate 58 (see FIG. 4), thereby latching the core body 80 to the extension card substrate 58. The at least one compression plate 78 can include at least one top compression plate such as a pair of top compression plates, and at least one bottom compression plate such as a pair of bottom compression plates. The compression plates 78 can be formed from any suitable compliant material, such as a metal. Each of the compression plates 78 can define a front end and a rear end opposite the front end. Each of the compression plates 78 can include a plurality of springs 84 at its front end. Each of the compression plates 78 can also include an engagement flap 71 at its rear end. A top notch 88 can be defined between the top compression plates 78, and a bottom notch can be defined between the bottom compression plates 78. The compression plates 78 are configured to fit over the core body 80 and compliant circuits 68, such that each compliant circuit 68 has its own compression plate 78. The latch body 82 is configured to fit over the compression plates 78. The engagement flaps 71 are configured to prevent the latch body 82 from becoming disengaged from the rest of the connector 26 once the latch body 82 has been fit over the compression plates 78.

A method for mounting the electrical connector 26 to the extension card 27 can include attaching the compliant circuits 68 to the extension card 27. For instance, the compliant circuits 68 can be soldered to the top and bottom surfaces of the extension card 27 adjacent the front end, such that the contact pads 75 of the compliant circuit 68 (see FIG. 5) are mounted to respective ones of the contact pads 57 of the extension card 27 (see FIG. 4). The compression plates 78 can be mounted to the core body 80. The extension card 27 with compliant circuits 68 soldered thereto can be inserted into the core body 80, thereby defining a sub-assembly. The latch body 82 can then be mounted to the sub-assembly, thereby completing assembly of the extension card 27. In particular, the latch body 82 is mounted over the compression plates 78 and the core body 80.

Figure 7:
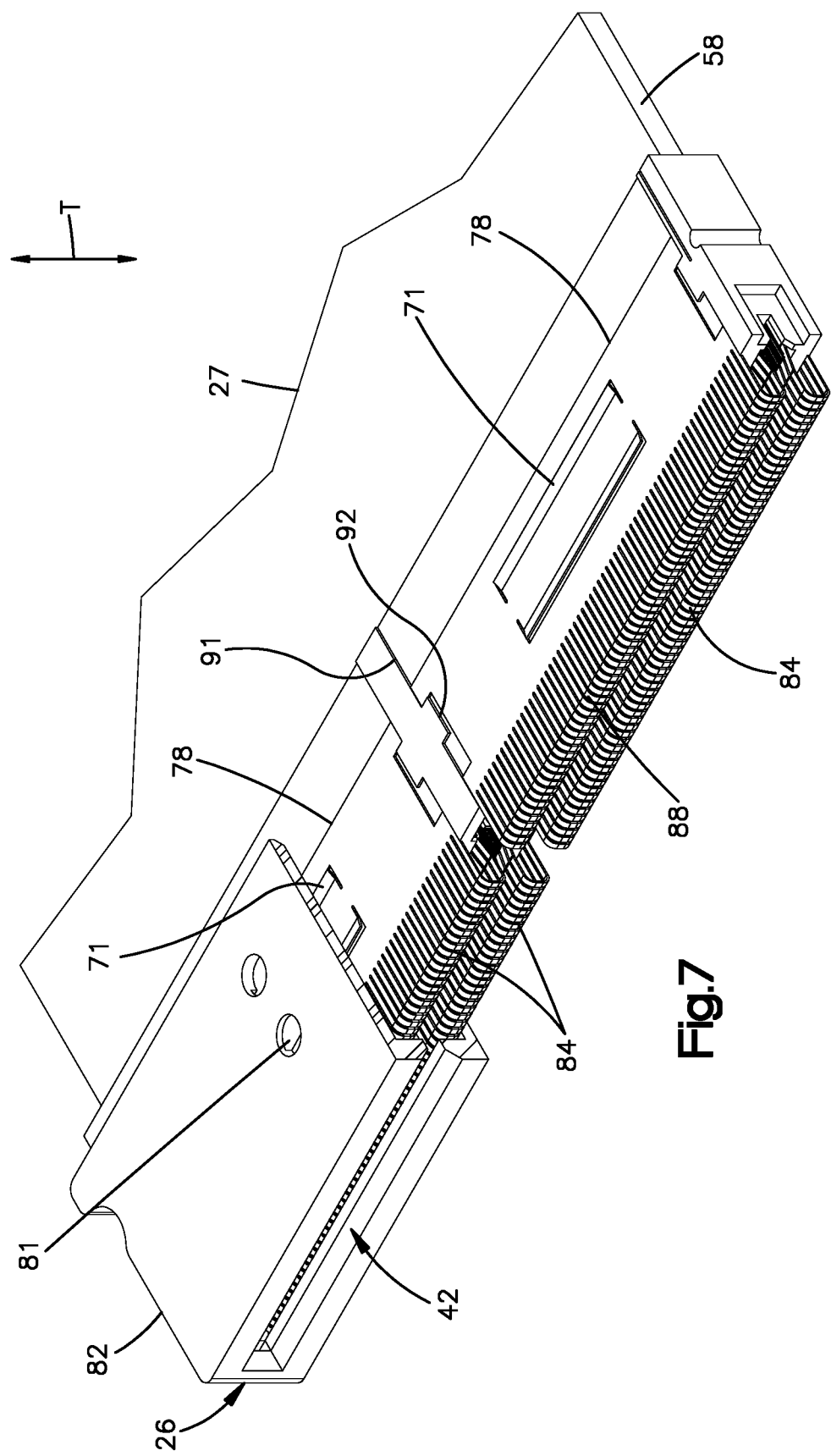
FIG. 7 shows a partial cut-away view of an ultra-dense edge card connector.

Thus, as illustrated in FIG. 7, the latch body 82 forms an outer surface of a majority of the electrical connector 26. The latch body 82 can define the receptacle 42 into which the ASIC package substrate 32 can be inserted. It is recognized, however, that any desired substrate can be inserted into the receptacle 42. The latch body 82 can also include disengagement holes 81 (see FIG. 6) that extend through the top and bottom of the latch body 82, which allow the latch body 82 to be removed from the core body 80 if desired. The disengaging holes 81 can be aligned with respective ones of the engagement flaps 71 located internal to the latch body 82.

The engagement flaps 71 can be disposed on respective outward facing surfaces of the compression plates 78. The engagement flaps 71 can be accessed through the disengagement holes 81 in the latch body 82 (see FIG. 6). When the ASIC package substrate 32 is inserted in the connector 26 and the connector 26 is in its closed or clamped position, the compression plates 78 exert a compression force on the compliant circuits 68 (see FIG. 6), thereby pressing the compliant circuits 68 against the ASIC package substrate 32. The compression force can be substantially uniform.

The notches 88 defined by the compression plates 78 is configured to receive respective protrusions 92 of the core body 80 so as to limit movement of the core body toward and away, selectively, from the ASIC package substrate 32 (see also FIG. 3). In particular, the notches 88 can each define a track 91 along which the protrusion 92 translates as the core body translates toward and away, selectively, from the ASIC package substrate 32. The protrusion 92 contacts surfaces of the compression plates that define a first end of the track 91 when the core body 80 has reached a travel limit toward the ASIC package substrate 32. The protrusion 92 contacts surfaces of the compression plates that define an opposed second end of the track 91 when the core body 80 has reached a travel limit away the ASIC package substrate 32. While in one example the compression plates 78 define the notches 88 and corresponding tracks 91, and the core body 80 defines the protrusions 92, in other examples the compression plates 78 can define the protrusions 92 and the core body 80 can define the track 91.

Referring now to FIGS. 8A-8B, a cross-sectional view of an electrical connection between the extension card substrate 58 and the ASIC package substrate 32 is shown. At least one top compliant circuit 68 is mechanically and electrically connected to the top surface of the extension card substrate 58. For instance, a pair of top compliant circuits are mechanically and electrically connected to the top surface of the extension card substrate 58. At least one bottom compliant circuit 68 is electrically connected to the bottom surface of the extension card substrate 58. For instance, a pair of bottom compliant circuits are mechanically and electrically connected to the bottom surface of the extension card substrate 58.

In an open position shown in FIG. 8A, the top and bottom compliant circuits 68 can be oriented substantially parallel with the top and bottom surfaces, respectively, of the extension card substrate 58. Alternatively, the top and bottom compliant circuits 68 can curl slightly away from the top and bottom surfaces, respectively, of the ASIC package substrate 32. Thus, a gap between the leading edges of the compliant circuits 68 along the transverse direction is greater than the thickness of the ASIC package substrate 32. In the closed position shown in FIG. 8B, each compliant circuit 68 is deflected inward along the transverse direction towards the ASIC package substrate 32. In the closed position the electrical traces 74 of the compliant circuit 68 (see FIG. 5)

are placed in electrical communication making electrical contact with contact pads 38 of the ASIC package substrate 32, thereby mating the electrical connector 26 to the ASIC package substrate 32. In particular, the electrical contact pads of the electrical traces 74 (see FIG. 5) are placed in electrical communication with contact pads 38 of the ASIC package substrate 32. Thus, in the closed or clamped position, the compliant circuit 68 forms a continuous electrical path between contact pads 38 on the ASIC package substrate 32 and the contact pads 57 of the extension card substrate 58.

Various components of the electrical connector 26, such as the compression plates 78 and the latch body 82 can facilitate the opening and clamping of the compliant circuits 68 with respect to the ASIC package substrate 32. In particular, the springs 84 of the compression plates 78 (see FIG. 6) are configured to bias the compliant circuits 68 against the ASIC package substrate 32. The springs 84 can be shaped so as to bend the compliant circuits 68 at a location between the extension card substrate 58 and the ASIC package substrate 32, and force the compliant circuits 68 against the ASIC package substrate 32. In one example, the electrical connection of the extension card 27 and the ASIC package substrate system can be configured to have no electrically conductive stub, thereby improving signal integrity, which can be particularly useful at high bandwidth data transmission speeds.

Further, the contact pads 38 of the ASIC package substrate 32 and the contact pads 57 of the extension card substrate 58 experience no wiping when they are placed in electrical communication with the compliant circuits 68. The contact pads 57 of the extension card substrate 58 do not wipe against the compliant circuits 68 when the compliant circuits 68 are mounted to the extension card substrate 58. Further, the contact pads 38 of the ASIC package substrate 32 do not wipe against the compliant circuits 68 when the compliant circuits 68 are mated to the ASIC package substrate 32. This reduces abrasion of the contacts during mating and unmating operations in some examples. Also, the contact pads 38 and 57 experience no mechanical loading in the mating/unmating direction in some examples. This allows the contact pads 38 and 57 to be sized smaller and placed more closely together than conventional contacts, since they do not need to withstand mechanical loads associated with wiping. The compliant circuits 68 mounted to the extension card substrate 58 and mated with the ASIC package substrate 32 can define a resulting connection system that can be referred to as a "zero-insertion force" connection system.

Referring now to FIGS. 9A-9C, the electrical connector is configured to place the extension card substrate 58 in electrical communication with the ASIC package substrate 32. In particular, the extension card substrate 58 is inserted into the electrical connector 26 in a respective insertion direction. A front edge 60 of the extension card substrate 58 defines a leading edge with respect to the insertion direction.

As described above, the electrical connector 26 can include the latch body 82, the core body 80 that can define the connector housing having the receptacle 42, the compression plates 78, and the compliant circuits 68. The receptacle 42 is configured to receive the ASIC package substrate 32 when the ASIC package substrate 32 is mated to the electrical connector 26. In this regard, the receptacle 42 can be referred to as a mating receptacle. While the mating receptacle 42 receives the ASIC package substrate 32 and the extension card substrate 58 is mounted to the electrical connector 26 in one example, in an another example the mating receptacle 42 can receive the extension card substrate 58 and the ASIC package substrate 32 can be mounted to the electrical connector 26. Thus, the electrical connector 26 can be mounted to one of the ASIC package substrate 32 and the extension card substrate 58, and the electrical connector can be mated to the other of the ASIC package substrate 32 and the extension card substrate 58.

As illustrated in FIGS. 9A-9B, the latch body 82 is shown in its "open" position, which allows the ASIC package substrate 58 to be translated into the connector 26 (see FIG. 7). In the open position of the latch body 82, the compliant circuits 68 can extend substantially straight out from the extension card 27 so that the ASIC package substrate 32 can be inserted into the electrical connector 26 without contacting the compliant circuit 68 (see FIG. 9D). Alternatively, the compliant circuits 68 may be fabricated with a slight bend, so that the opening between the top and bottom compliant circuits 68 is larger than the thickness of the extension card substrate 58. Thus, the ASIC package substrate 58 can be inserted into the electrical connector 26 without abutting the leading edges of the compliant circuits 68 that might otherwise prevent insertion of the ASIC package substrate 58.

Next, the electrical connector 26 can be moved to its closed or clamped position. In particular, the latch body 82 can be translated toward the extension card substrate 58 so as to simultaneously latch the ASIC package substrate 32 and the electrical connector 26 together and clamp the contact pads 38 of the ASIC package substrate 32 between the compliant circuits 68, thereby mating the compliant circuits 68 to the ASIC package substrate 32. In this regard, the electrical connector 26 can be inserted into the receptacle 42 and supported proximate to the front edge 60 of the extension card substrate 32. The ASIC package substrate 32 has electrical contact pads that extend along one or more of the edges 28 of the ASIC package substrate 32 on one or both of the top and bottom surfaces of the ASIC package substrate 32. As will be described in more detail below, the extension card substrate 58 can be prevented from removed from the electrical connector 26.

In the clamping process the latch body 82 can urge the compression plates 78 backwards toward the extension card substrate 58, thereby forcing the compression plates 78 to spring toward each other along the transverse direction T, as illustrated in FIGS. 9C and 9E. The springs 84 along the front edge of the compression plates 78 can be configured to conform to the contour of the top and bottom surfaces of the ASIC package substrate 32. In some examples, the springs 84 can be configured to flatness variations of the ASIC package substrate 32. The springs 84 thus press into the compliant circuits 68, forcing them inwardly toward each other along the transverse direction T toward the ASIC package substrate 32. Thus, the compliant circuits 68 are clamped to the ASIC package substrate 32 as shown in FIGS. 8 and 9E. The compliant circuits 68 and the ASIC package substrate 32 define a separable interface that places the extension card 27 in electrical communication with the ASIC package substrate 32, and thus the ASIC die.

The ASIC package 22, the extension card 27, and the electrical connector 26 can define an interconnect system that allows substrates of different thicknesses along the transverse direction T to be placed in electrical communication with each other through the electrical connector 26. For example, the compliant circuits 68 can connect to the ASIC package substrate 32 and the extension card substrate 58 when the ASIC package substrate 32 has a thickness along the transverse direction T that can range from approximately 10% greater than the thickness of the extension card substrate 58 along the transverse direction T to approximately 50% less than the thickness of the extension card substrate 58 along the transverse direction T. In one specific non-limiting example, the thickness of the extension card substrate 58 can be approximately 1.6 mm and the thickness of the ASIC package substrate 32 can be approximately 1.2 mm. Thus, the thickness of the ASIC package substrate 32 can be approximately 75% of the thickness of the extension card substrate 58 in some examples.

As described above, the contact pitch of the contact pads 38 of the package substrate 32, the contact pads 57 of the extension card 27, and the contact pads 75 and 77 of the electrical connector 26 along the row direction can be less than approximately 0.5 mm. For instance, the contact pitch can range from approximately 0.2 mm to approximately 0.5 mm. In one example, the contact pitch can range from approximately 0.2 mm to approximately 0.3 mm. It is recognized that when the contact pitch is less than approximately 0.5 mm, new challenges are raised regarding contact pad alignment at interfaces between contact pads. Such an interface can be defined between the contact pads 38 of the package substrate and the contact pads 77 of the compliant circuit 68, and thus of the electrical connector 26. Such an interface can also be defined between the contact pads 57 of the extension card 27 and the contact pads 75 of the compliant circuit 68, and thus of the electrical connector 26.

Alignment of contact pads conventionally depends typically on the footprint of the substrate, the substrate top to bottom metallization layer registration, and the attachment mechanism of the extension card. Alignment tolerances must be small relative to the contact width or contact-to-contact pitch to ensure a robust electrical connection between contacts on both sides of the interconnect system. Referring now to FIGS. 10A-10B, the present interconnect system, and thus the data communication system 20, includes alignment blocks 56 that are placed precisely on the ASIC package substrate 32 and the extension card substrate 58. The alignment blocks 56 may be precisely die-bonded or solder reflowed thru standard SMT production tools to the ASIC package substrate 32 and the extension card substrate 58. Each of the substrates 32 and 58 can include at least one alignment block 56. For instance, each of the substrates 32 and 58 can include at least one alignment block 56 on its bottom surface, and at least one alignment block 56 on its top surface. In one example, each of the substrates 32 and 58 can include a respective single alignment block 56 on its top surface, and respective single alignment block 56 on its bottom surfaces. As will be appreciated from the description below, alignment blocks 56 on both the top and bottom surfaces can help compensate for possible offsets between the metallization layers on the top and bottom surfaces of the substrates 32 and 58.

Referring also to FIGS. 10A and 10B, the electrical connector 26 is configured to align the contact pads 38 of the ASIC package substrate 32 to the contact pads 57 of the extension card substrate 58 with the contact pads 75 and 77 of the compliant circuits 68. In particular, for the interface between each of the contact pads 38 at the top surface of the ASIC package substrate 32 and the contact pads 77 of the at least one top compliant circuit 68, and further for the interface between each of the contact pads 38 at the bottom surface of the ASIC package substrate 32 and the contact pads 77 of the at least one bottom compliant circuit 68, at least one compliant alignment structure of the core body 80 is configured to average the position of the top and bottom metallization on both the ASIC package substrate and the extension card substrate along the row direction, thereby reducing the misalignment amplitude.

As described above, alignment blocks 56 can be mounted to both the top and bottom surfaces of one or both of the ASIC package substrate 32 and the extension card substrate 58. The alignment blocks 56 can include an alignment feature 93 such as a slot 94 that is configured to receive a compliant alignment feature 95 such as a flexible wall 96 of the core body 80. For example, the flexible wall 96 can extend from a surface of the core body 80. The distal ends of the flexible walls 96 can be received in the slots 94 of the aligned ones of the alignment blocks 56. To the extent that the alignment blocks 56 are not perfectly aligned with the flexible walls 96, the flexible walls can elastically deform or bend so as to be received in the slots 94, thereby accommodating the misalignment. The ASIC package substrate 32 and the extension card substrate 58 will thus be urged to respective locations along the row direction by the bending forces imparted by the flexible walls 96 to the alignment blocks 56, and thus to the extension card 27, and the counterforce applied by the alignment blocks 56 to the flexible walls 96. As a result, the bending forces, and thus the associated bend, of the flexible walls 96 are averaged. Accordingly, the movement of the ASIC package substrate 32 and the extension card substrate 58 relative to each other along the row direction is also averaged to minimize the misalignment of the contact pads 57 of the extension card substrate 58 and the contact pads 75 of the compliant circuits 68. This also minimizes the overall misalignment between the contact pads 38 of the ASIC package substrate 32 and the contact pads 57 of the extension card substrate 58.

It should be appreciated, of course, that the alignment feature of the core body 80 can alternatively be configured as a slot, and the alignment feature of the alignment blocks 56 can be configured as a flexible wall that is configured to be received in the recess.

In one example shown in FIG. 10B, a first misalignment distance of $R_h$ along the row direction exists between the top and bottom contact pads 38 of the ASIC package substrate 32. That is the contact pads 38 on the bottom surface are not perfectly aligned with the contact pads 38 the contacts on the top surface, and are misaligned by the misaligment distance $R_h$. Similarly, there is a second misalignment distance of $R_p$ between top contact pads 57 on the top surface of the extension card substrate 58, and bottom contact pads 57 on the bottom surface of the extension card substrate 58 along the row direction. The alignment features on a first side of the separable interface that includes the ASIC package substrate 32 and the alignment features on a second side of the separable interface that includes the extension card 27 center the core body 80 along the row direction between the two misalignment distances $R_h$ and $R_p$. The total misalignment between the respective contact pads of the ASIC package substrate 32 and the extension card substrate 58 is thus the average of the misregistrations or Rtotal=$(R_h+R_p)/2$. A typical value for the maximum misregistration between the top and bottom contact pads on both the ASIC package substrate 58 and the extension card substrate 32 can be approximately 37.5 microns. It is envisioned that a non-limiting worst case misalignment will occur if the misregistration has opposite oreintations. That is, the bottom contact pads are displaced towards one of the right or left directions on the ASIC package substrate 58, and the contact pads of the extension card substrate 58 are displaced in the opposite one of the right or left directions. In this case, the misalignment between the contact pads 38 of the ASIC package substrate 32 and the contact pads 57 of the extension card substrate 58 along the row direction will also be approximately 37.5 microns, since both the ASIC package substrate and the extension card substrate have this amount of misregistration. For a contact pitch in the range of approximately 200 microns to 300 microns, the resulting misalignment provided by the interconnect system will not seriously impact electrical performance of the electrical connector 26.

Referring now to FIG. 10C, the top contact pads 57 of the extension card substrate 58 and the bottom contact pads 57 of the extension card substrate 58 are misaligned in a first relative direction. FIG. 10C further shows an average position 97 between left edge of the top contact pad 57 and the bottom contact pad 57. FIG. 10D shows the top contact pads 38 of the ASIC package substrate 32 and the bottom contact pads 38 of the ASIC package substrate 32 that are misaligned with respect to each other in the first relative direction by the same first distance as the contact pads 57 of the extension card substrate 58. The average position 98 between the top and bottom contact pads 38 of FIG. 10D is thus the same average position 97 of the top and bottom contact pads 57 of FIG. 10C. Accordingly, when the misalignment has the same orientation and distance on both the ASIC package substrate 32 and the extension card substrate 58, both the top and bottom contact pads 38 of the ASIC package substrate 32 will perfectly align with the corresponding top and bottom contact pads 57 of the extension card 27 that are placed in electrical communication with the top and bottom contact pads 38, respectively, through the electrical connector 26. Referring to FIG. 10E, the top and bottom contact pads 38 of the ASIC package substrate 32 are misaligned the same distance as the top and bottom contact pads 57, but they are misaligned in a second relative direction opposite the first relative direction. In this instance, the average position will be midway between the first distance in the first relative orientation and the first distance in the second relative orientation.

Figure 11A:
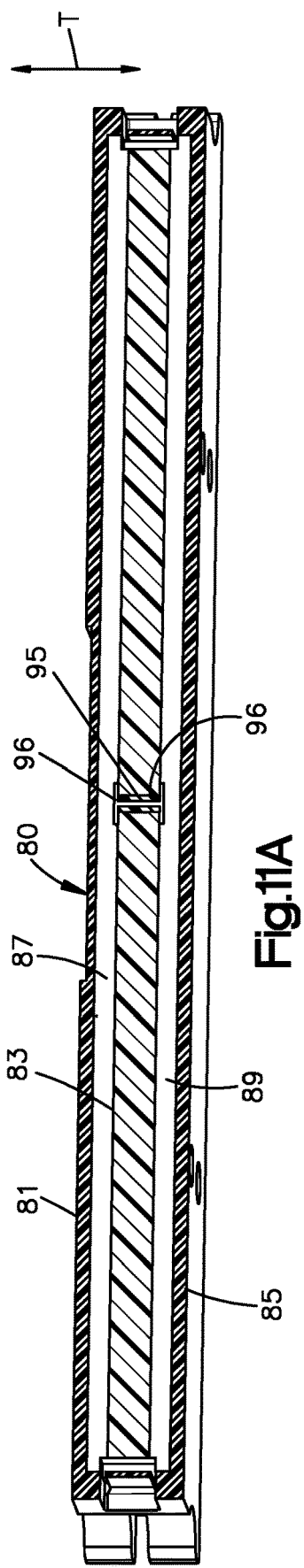
FIG. 11A is a side elevation view of a core body having a compliant alignment feature.
Figure 11B:
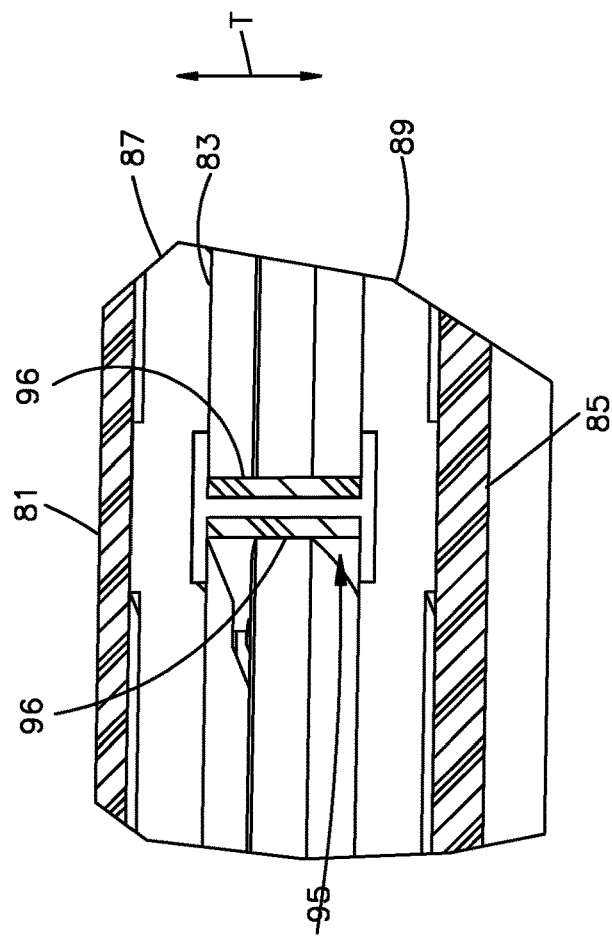
FIG. 11B is an enlarged perspective view of a portion of the core body showing the compliant alignment feature.

Referring now to FIGS. 11A-11B, the core body 80 can include a top section 81, a central section 83, and a bottom section 85. The central section 83 is disposed between the top section 81 and the bottom section 85 along the transverse direction T. The core body 80 can define an upper slot 87 between the top section 81 and central section 83. The core body 80 can define a lower slot 89 between the bottom section 85 and central section 83. As described above, the core body 80 can include the compliant alignment feature 95. For instance, the central section 83 can include the compliant alignment feature 95. It should be appreciated, however, that the compliant alignment feature 95 can be carried at any suitable alternative location of the core body 80 as desired. When the core body 80 receives the extension card substrate 58 as described above, the top compliant circuit 68 extends thru the upper slot 87, and the bottom compliant circuit 68 extends through the lower slot 89. The slots 87 and 89 can extend along the full width of the extension card substrate 58 along the row direction, and can further extend along the full width of the ASIC package substrate 32 along the row direction.

Referring now to FIG. 11B in particular, the compliant alignment feature 95 of the core body 80 can include at least one flexible wall 96 that extends both above and below the central section 83 along the transverse direction T. The at least one flexible wall 96 can extend to the top section 81 and the bottom section 85. The at least one flexible wall 96 may further protrude from the central section 83 in a direction towards and away from the extension card substrate 58. The at least one flexible wall 96 can have a first wall portion adjacent the extension card substrate 58 that is received in the engagement blocks 56 on the top and bottom surfaces of the extension card substrate 58 in the manner described above. The first wall portion can be disposed at a first end of the at least one wall 96. The at least one wall 96 can define a second wall portion opposite the extension card substrate engage with alignment blocks 56 on the top and bottom surfaces of the ASIC package substrate 32 as described above when the electrical connector 26 is mated to the ASIC package 22. As previously described, the at least one wall can flex, bend, and twist so that the core body 80 averages the misalignment between the contact pads 57 on the extension card substrate 58 and the contact pads 38 on the ASIC package substrate 32. In one example, the at least one flexible wall 96 can include first and second flexible walls 96 that are spaced from each other along the row direction. The row direction can be perpendicular to the mating direction of the electrical connector 26 to the ASIC package substrate 32, and thus perpendicular to a direction from the ASIC package substrate 32 to the extension card 27.

Figure 12:
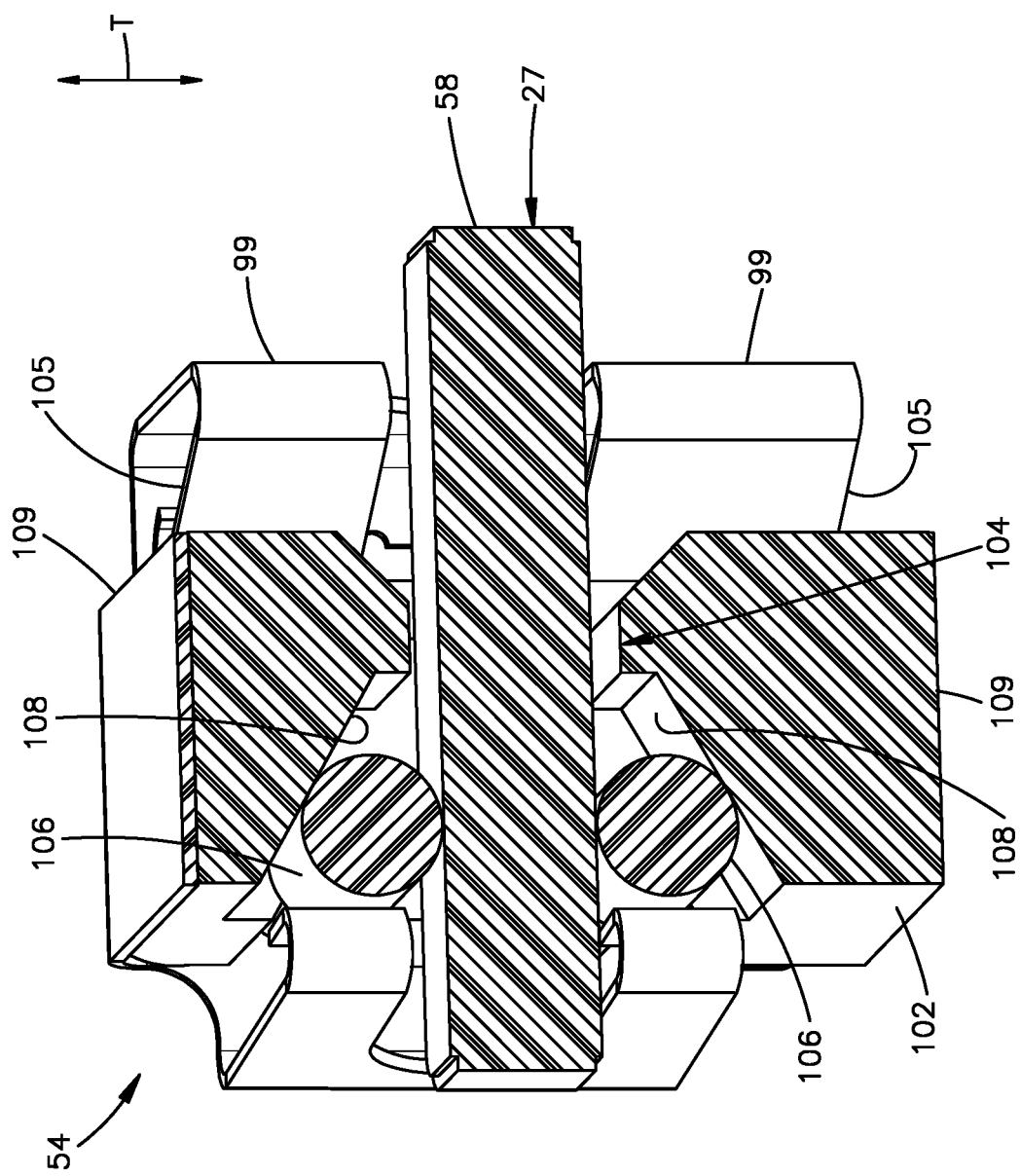
FIG. 12 shows a locking mechanism that prevents retraction/disengagement of an extension card.

Referring now to FIG. 12, and as described above, the extension card 27 can be locked in position with respect to the ASIC package substrate 32 when the electrical connector 26 is mated with the ASIC package substrate 32. For instance, as described above with respect to FIGS. 1-3, a locking mechanism 54 can be attached to the extension card 27 and mounted to the host substrate 25 so as to secure the extension card 27 with respect to movement along a direction away from the ASIC package substrate 32 a distance sufficient to unmount the extension card 27 from the electrical connector 26, which would remove the electrical connection between extension card 27 and the ASIC package substrate 32 once the two are mated. The locking mechanism 54 can allow for movement of the extension card 27 toward the electrical connector 26, and thus toward the ASIC package substrate 32 so as to cause the extension card 27 to be mounted to the electrical connector 26. The locking mechanism 54 can permit unidirectional movement of the extension card 27, such that the locking mechanism 54 prevents the retraction/disengagement of the extension card 27. Thus, the locking mechanism 54 can allow for free motion of the extension card substrate 58 into the electrical connector 26, but prevents retraction of the extension card 27.

The extension card 27 can be disconnected from the electrical connector 26 by actuating a release member 99. The release member 99 can be configured as a release button that can be depressed so as to allow the extension card 27 to be retracted a sufficient distance to remove the extension card 27 from the electrical connector 26. The locking mechanism 54 can include a locking body 102 having an opening 104 that is sized to receive the extension card substrate 58 such that the extension card substrate 58 is movable along the transverse direction T with respect to the locking body 102. The locking mechanism 54 can further include at least one engagement member above and below the extension card substrate 58 that are configured to prevent movement of the extension card substrate 58 away from the electrical connector 26. The engagement members can be configured as cylinders 106 disposed above and below the extension card substrate 58 that are configured to freely rotate between the release member 99 and the locking body 102. The cylinders 106 can be driven into the extension card substrate 58 by wedged surfaces 108 of respective wedges 109 of the locking body 102, thereby effectively clamping the extension card substrate 58 in position. For instance, when a rearward force is applied to the extension card 27 to remove the extension card 27 from the electrical connector 26, the extension card 27 causes the cylinders 106 rotate along the wedged surfaces 108, which thereby causes the cylinders to travel against the extension card 27 until they effectively clamp the extension card 27 and prevent movement of the extension card 27 away from the electrical connector 26. Further, the locking mechanism 54 can include a spring member 105 that urges the wedges 109 toward the cylinders 106, thereby causing the wedged surfaces 108 to urge the cylinders 106 against the extension card substrate 58, and thus the extension card substrate 58. When the release member 99 is actuated, the spring members 105 are removed from engagement with the wedge members 99. Advantageously, the locking mechanism 54 does not require any precise height or position along the row direction of the extension card 27 relative to the locking mechanism 54 in some examples. Accordingly, the extension card 27 can be positioned as defined by the alignment blocks 56 in the connector 26 in the manner described above, as opposed to being defined by the locking mechanism 54. As a result, electrical connectivity can be maintained through all contact pads of the electrical connector 26. Further, the locking mechanism 54 can does not require precise positioning of the extension card substrate 58 relative to the host substrate 25 along the transverse direction T. The locking system can work as described above with any positioning that allows the extension card substrate 58 to fit through the opening 104.

Figure 13:
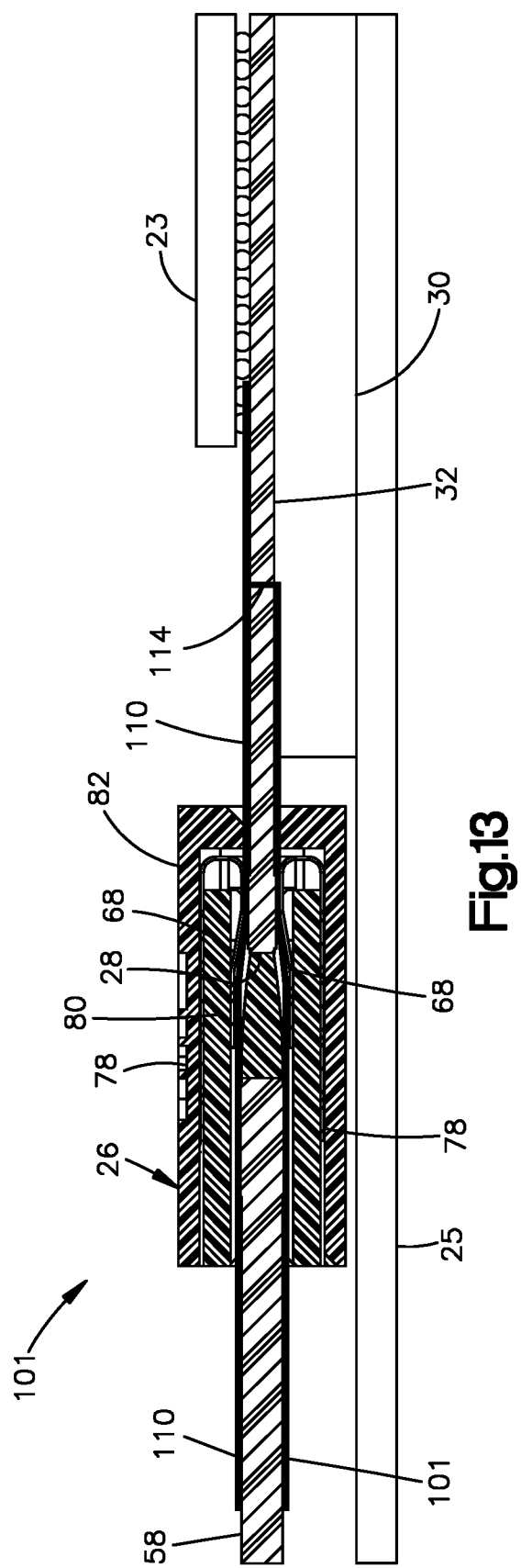
FIG. 13 is a sectional side elevation view of an interconnect system showing high-speed electrical routing from the ASIC package to the extension card.

Referring now to FIG. 13, the interconnect system 101 can define an electrical transmission line 110 that is configured to support high bandwidth signals between the ASIC package substrate 32 and the extension card substrate 58 of the type described above. For instance, high bandwidth signals can travel from the ASIC package substrate 32 to the extension card substrate 52. Alternatively or additionally, high bandwidth signals can travel from the extension card substrate 58 to the ASIC package substrate 32. As previously described with respect to FIG. 2, the LGA socket 30 can be mounted to the host substrate 25. The ASIC package 22 having the ASIC die 34 can be mounted on the ASIC package substrate 32. Further, the Serializer/Deserializer (SerDes) dies 23 can be mounted on the ASIC package substrate 32 if desired. The ASIC package substrate 32 can at least partially define a plurality of differential pair transmission lines 110 that can route high bandwidth signals from the SerDes die 23 to contact pads 38 disposed along the respective edge 28 of the ASIC package substrate 32. The ASIC package substrate 32 can include electrically conductive vias 114 that extend from the top surface to the bottom surface of the ASIC package substrate 32, and can thus route electrical signals from and to the top and bottom surfaces of the ASIC package substrate 32.

As described above, the electrical connector 26 can be fitted over a respective one of the edges 28 of the ASIC package substrate 32 to place the ASIC package substrate 32, and thus the ASIC die 34, in electrical communication with the extension card 27. The compliant circuits 68 of the electrical connector 26 can establish a separable interface with electrical contact pads to which the electrical connector 26 is mated. In one example, the electrical connector 26 can be mated with the ASIC package substrate 32. Thus, the compliant circuits 68 can be placed in removable electrical communication between the contact pads 38 of the ASIC package substrate 32. The electrical communication between the contact pads 38 of the ASIC package substrate 32 and the compliant circuits 68 can define a separable interface, and can be mated and unmated as desired. That is, the interconnect assembly does not prevent movement of the ASIC package substrate 32 from the electrical connector so as to unmate the ASIC package substrate 32 from the compliant circuits 68. The compliant circuits 68 are configured to make permanent electrical contact with contact pads to which the electrical connector 26 is mounted. In one example, the electrical connector 26 can be mounted to the extension card 27. Thus, the compliant circuits 68 can be configured to make permanent electrical connection with the contact pads 57 of the extension card substrate 58. That is, the extension card 27 is prevented from being removed from the electrical connector without actuating the release member 99 described above with respect to FIG. 12. A plurality of differential pair transmission lines 110 can route the high-speed electrical signals to and from the contact pads 57 of the extension card substrate 58 to other regions of the extension card 27.

Figure 14:
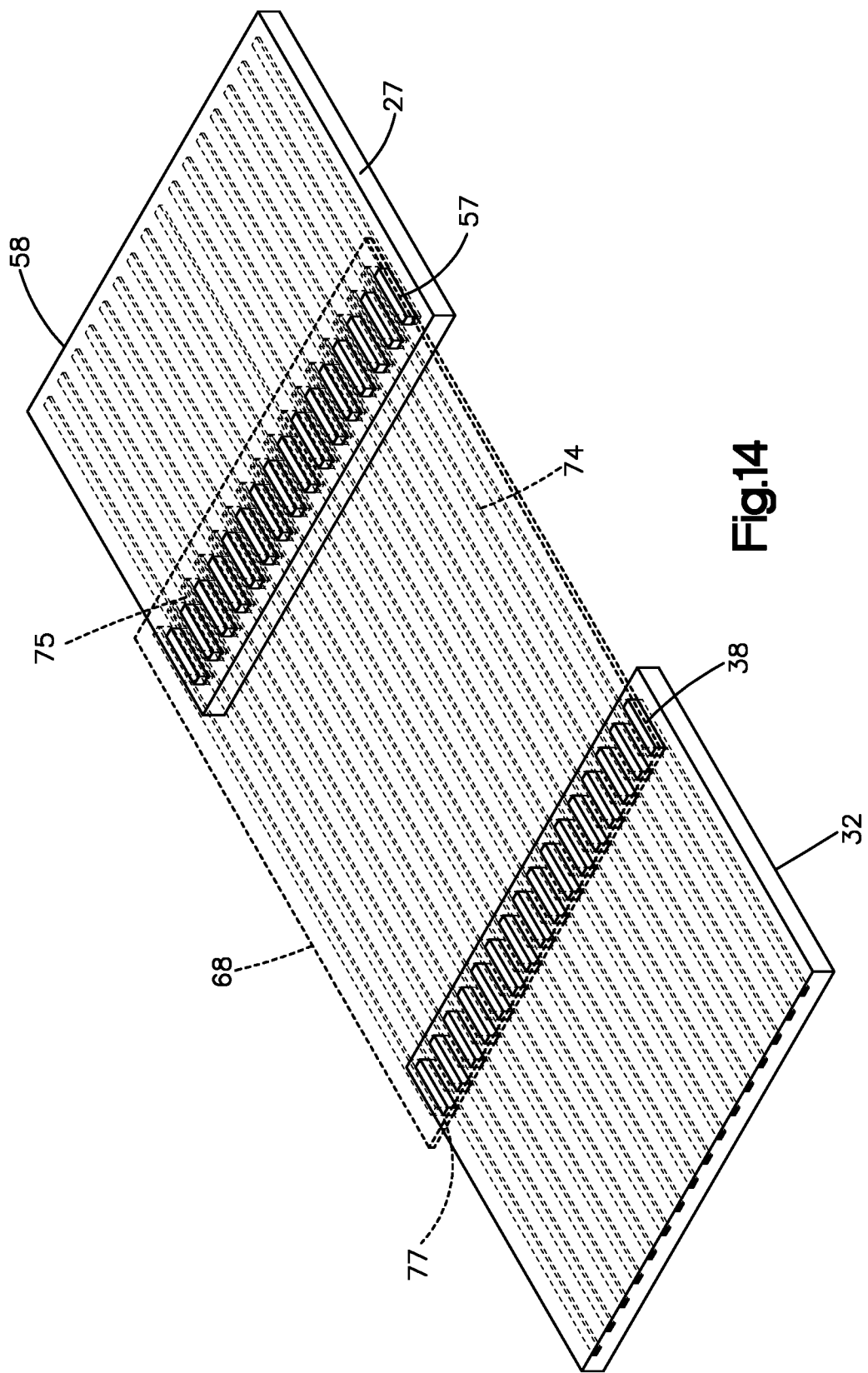
FIG. 14 shows a schematic perspective view of the electrically conductive paths between an ASIC package substrate, and an extension card through a compliant circuit of the electrical ultra-dense electrical connector.

Referring now to FIG. 14, the interconnect system is illustrated schematically, showing the extension card substrate 58 placed in electrical communication with the ASIC package substrate 32 through the at least one compliant circuit 68. In particular, the transmission lines 110 (see FIG. 13) are configured to define a continuous transmission line through and between the ASIC package substrate 32 and the extension card substrate 58.

While the present disclosure has generally been described in the context of establishing a separable interface (i.e., mateable and unmateable electrical connection) between the extension card substrate 58 and the ASIC package substrate 32, it is appreciated that the electrical connector 26 and associated electrical connection methods described herein may be used in any situation where high bandwidth electrical signals are transferred between two substantially planar substrates having contact pads along respective edges. The respective edges can face each other in certain examples. Aspects of the present disclosure can be particularly advantageous when high overall data transfer rates are desired across the electrical connection. The high overall data transfer rates are provided when the adjacent contact pads have high density, defined by a small contact pitch between adjacent contact pads along the row direction, and the continuous nature of the electrical transmission path, with a minimum of impedance discontinuities.

Figure 15:
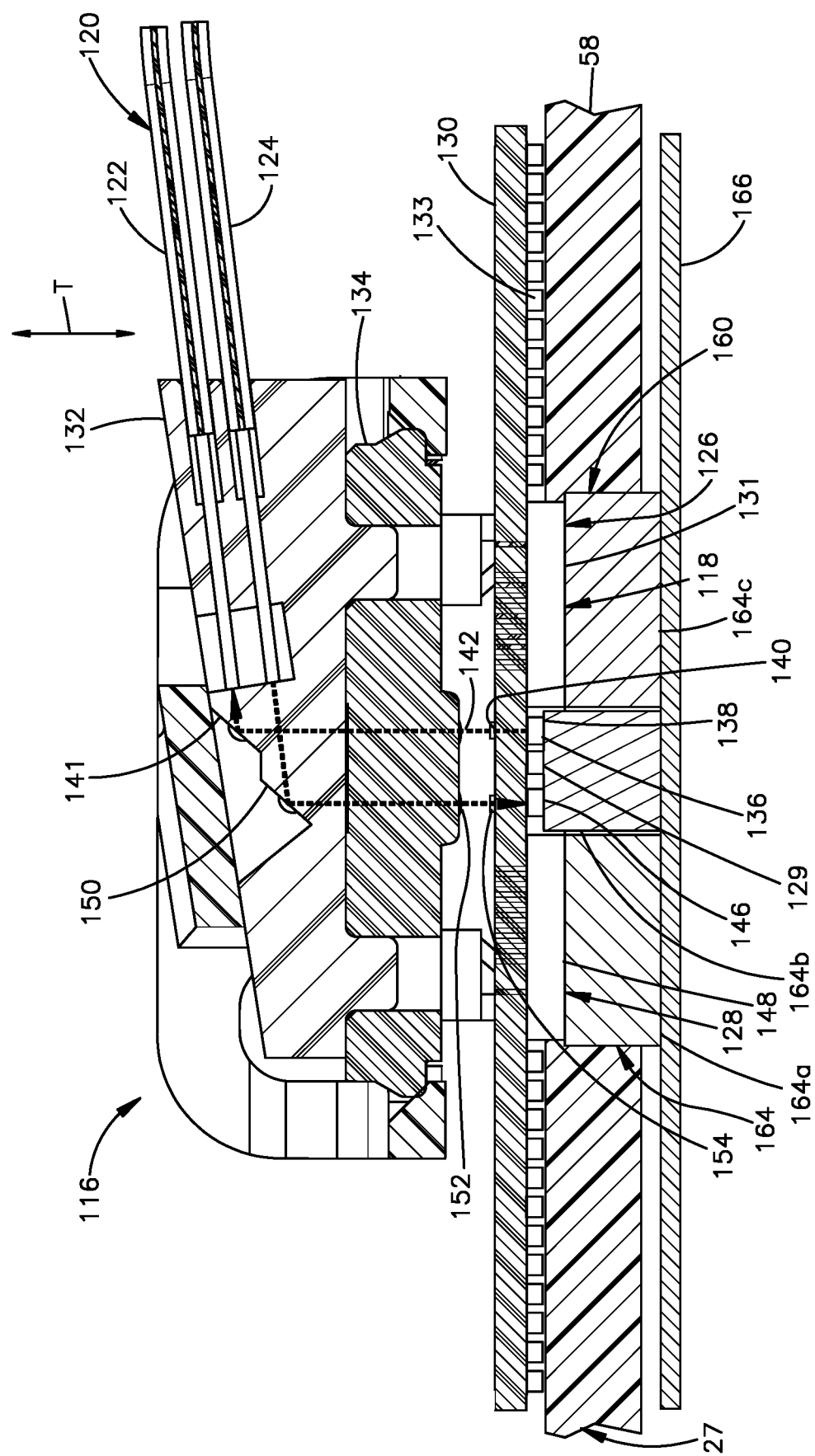
FIG. 15 is a cross-sectional view of an optical transceiver in one example.

As illustrated in FIG. 15, an optical engine 118 can be included in an optical transceiver 116. The optical engine 118 of the transceiver 116 is configured to receive electrical transmit signals from the ASIC package 22, convert the electrical transmit signals to optical transmit signals, and output the converted optical transmit signals to a second component. The optical engine 118 can be further configured to receive optical receive signals from a third component, convert the optical receive signals to electrical receive signals, and output the converted electrical receive signals for transmission to the ASIC package 22. The optical transceiver 116 can include a plurality of optical fibers 120, including one or both of optical transmit fibers 122 and optical receive fibers 124. The optical transmit signals can be transmitted to the second component along the optical transmit fibers 122. The optical receive signal can be received from the third component along the optical receive fibers 124.

Figure 16:
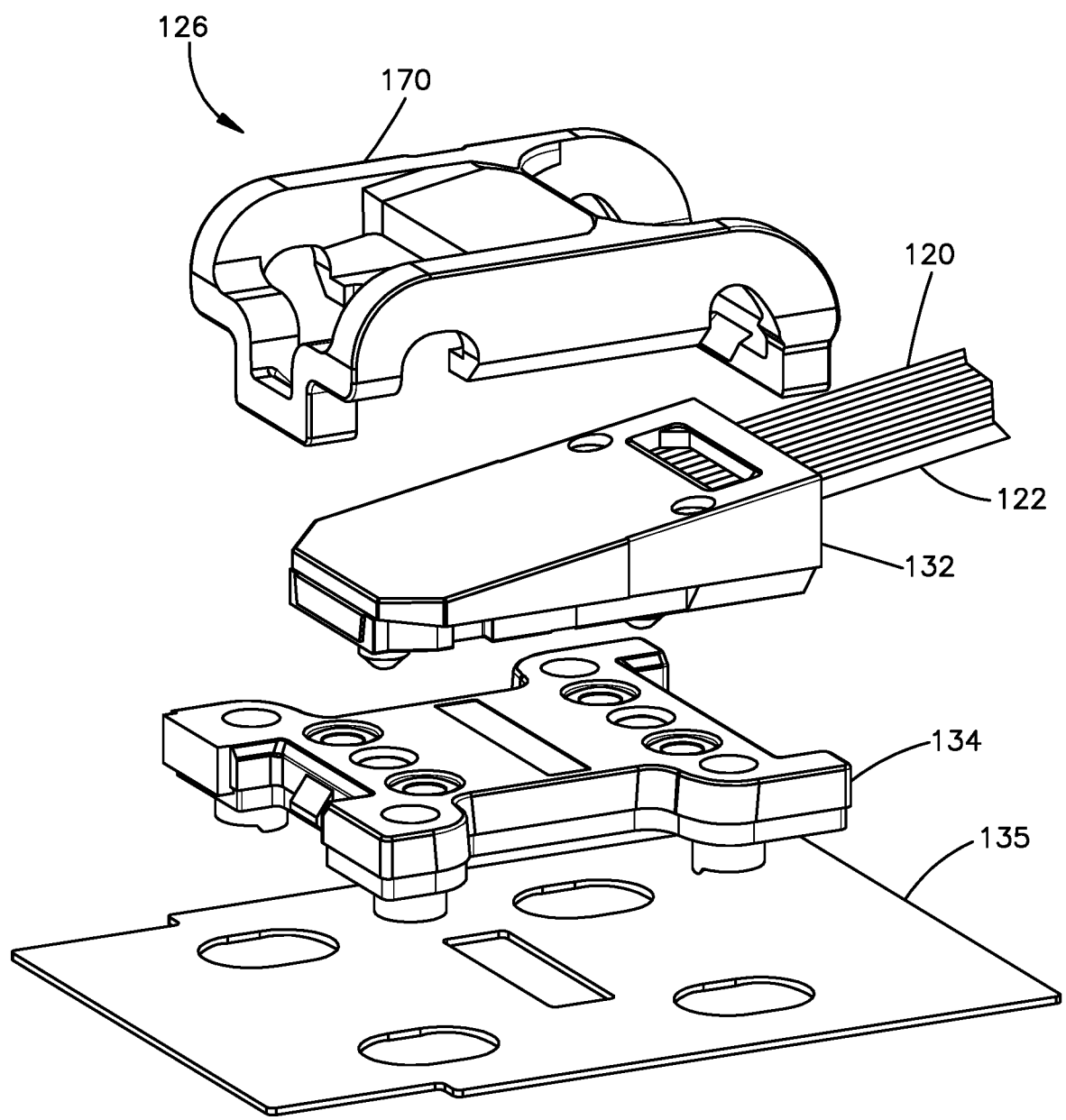
FIG. 16 is an exploded perspective view of an optical transceiver of another example.

The optical transceiver 116 includes an optical transmitter 126 and an optical receiver 128. The optical transmitter 126 and the optical receiver 128 can each be coupled between the ASIC package 22 and the second component when extension card 27 is in electrical communication with the ASIC package substrate 32. The optical transmitter 126 can be configured to receive electrical transmit signals from the ASIC package 22, convert the electrical transmit signals to optical transmit signals, and output the converted optical transmit signals for transmission to the second component. The optical receiver 128 can be configured to receive optical receive signals from the third component, convert the optical receive signals to electrical receive signals, and output the converted electrical receive signals for transmission to the ASIC package 22. Electrical signals can be transmitted to and from the ASIC package substrate 32 and the optical transceiver 116 along the extension card substrate 58. As illustrated in FIG. 16, a transmitter 126 is shown, it being appreciated that the device of FIG. 16 can alternatively be configured as a receiver 128.

The optical transceiver 116 can include the optical engine 118 of one or both of the optical transmitter 126 and the optical receiver 128. The optical engine 118 can be supported by an optical interposer 130 that provides for optical transmission therethrough. The interposer 130, in turn, can be supported by the extension card 27. Further, the interposer 130 can be mounted to the extension card 27, for instance to the top surface of the extension card 27. In one example, solder balls 133 can mount the interposer 130 to the extension card 27. It should be appreciated, however, that the interposer 130 can be mounted to the extension card 27 in any suitable alternative manner.

In one example, the interposer 130 can be a glass interposer 130. The optical transceiver 116 can include an optical coupler 132 that is configured to support the optical fibers 120. The optical transceiver 116 can further include a frame 134 that supports the optical coupler 132. The frame 134 can be mounted to the interposer 130. For instance, the frame 134 can be mounted to the top surface of the interposer 130. Accordingly, in one example, the frame 134 and thus the optical coupler 132 and the optical fibers 120 can be supported on a top surface of the interposer 130. The optical engine 118 can be supported on a bottom surface of the interposer 130 that is opposite the top surface. Thus, the optical fibers 120 can be supported on a first surface of the interposer 130, and the optical engine 118 can be supported on a second surface of the interposer 130 opposite the first surface along the transverse direction T.

The optical engine 118 of the optical transmitter 126 can further include at least one light source 136 such as a plurality of light sources 136 that emit light that is directed to the optical transmit fibers 122. In one example, the light source 136 can be configured as any suitable diode laser. For instance, the light source 136 can be configured as a laser, preferably emitting wavelengths between approximately 760 nanometers (nm) to approximately 1600 nm. The laser may be configured as a vertical-cavity surface-emitting laser (VCSEL) 138, a distributed feedback (DFB) laser, or a Fabry-Perot (FP) laser. The optical transmitter 126 can include at least one driver 131 that converts voltage modulation to current modulation so as to modulate the light from the light source 136 based on the electrical signals received from the ASIC package 22.

The optical transmitter 126 can include the plurality of optical transmit fibers 122 that are in optical alignment with the optical engine 118 of the optical transmitter 126, and in particular are in optical alignment with the light source 136. Thus, the optical transmit fibers 122 are configured to receive respective ones of the optical transmit signals that are output by the optical engine 118 of the transmitter 126, and carry the optical transmit signals to the second component. The optical fiber coupler 132 is configured to support the optical transmit fibers 122 such that an input end of the optical transmit fibers 122 are in optical alignment with the light output from the optical engine of the transmitter 126, and in particular from the light source 136. Thus, the input ends of the optical transmit fibers 122 are configured to receive the optical transmit signals from the optical engine 118 of the transmitter 126. In some embodiments, the optical coupler 132 can include a transmit reflector 141. The optical transmit signals output from the light source 136 can be directed to the transmit reflector 141 along a first transmit direction, and into the input ends of the optical transmit fibers 122 along a second transmit direction that is angularly offset with respect to the first direction. The first transmit direction can be oriented substantially along the transverse direction T. The transmit reflector 141 can be metallic, a multi-layer dielectric coating, an uncoated total internal reflection surface, or made from any suitable alternative reflective material or interface as desired.

It may be desirable to cause the light beams of the optical transmit signal to converge near the input end of the optical transmit fibers 122 such that the optical transmit signals are mode matched with the optical transmit fibers 122. In one example, one or more optical transmit elements can be disposed between the light sources 136 and the optical transmit fibers 122. These intervening optical transmit elements may include one or more of mirrors, lenses, transparent substrates, and optically transparent couplers that collectively serve to provide an optical path between the light sources 136 and the optical transmit fibers 122.

For instance, the transmitter 126 can include one or more lenses that the optical transmit signals pass through so as to control the beam size of the optical transmit signals. For instance, a first optical transmit lens 140 can be supported on the top surface of the interposer 130 in alignment with the light source 136. Thus, the optical transmit signals pass through the first optical transmit lens 140. A second optical transmit lens 142 can be supported by the frame 134 in alignment with the first optical transmit lens 140. Alternatively, the optical transceiver 116 can include one of the first and second optical transmit lenses 140 and 142, and not the other of the first and second optical transmit lenses 140 and 142.

In one example, the first transmit lens 140 can be configured as a collimating lens. Thus, the optical transmit signal can be collimated from the first optical transmit lens 140 to the second optical transmit lens. This can relax alignment tolerances between the optical transmit fibers 122 and the light sources 136. The second transmit lens 142 can be configured as a focusing lens. Thus, the optical transmit signals can converge in a direction of travel from the at least one optical transmit lens 140 to the input end of the optical transmit fibers 122. In one example, the second optical transmit lens 142 can be supported on a bottom surface of the frame 134 that faces the top surface of the interposer 130. The collimating lens and the converging lens can be positioned anywhere as desired. In other examples, the optical transmitter 126 can include the transmit lens 142 supported by the frame 134 but not the transmit lens 140 supported by the interposer 130. In this example, the transmit lens 142 supported by the frame 134 can be configured as a focusing lens. It should be appreciated that the optical transmitter 126 can include any number of lenses as desired.

The second optical transmit lens 142 that is supported by the frame 134 can be configured as a transmit optical lens array 144 that includes an optical block 143 and a plurality of the transmit lenses 142 supported by the optical block 143. In this regard, it is appreciated that the lenses 142 of the lens array 144 (see FIG. 17C) can be configured to shape optical transmit signals emitted from multiple light sources 136. The optical transmitter 126 can further include one or more monitor photo diodes (MPD) 129 that can receive a portion of the light generated by the light sources 136 to monitor light output. As will be described in more detail below, the interposer 130 can include alignment members that are configured to align the transmit optical block with the light sources 136 along directions perpendicular to the transverse direction T.

With continuing reference to FIG. 15, the optical receiver 128 is configured to receive optical receive signals from the third component, convert the optical receive signals to electrical receive signals, and output the electrical receive signals to the ASIC package substrate 32 when the extension card 27 is in electrical communication with the ASIC package 22. The optical engine 118 of the receiver 128 can include at least one photodetector 146 that is in optical alignment with a corresponding at least one optical receive fiber 124, and a current-to-voltage converter 148 that is in electrical communication with the at least one photodetector 146. For instance, the optical engine 118 of the receiver 128 can include a plurality of photodetectors 146 that are each in optical alignment with a respective one of the plurality of optical receive fibers 124. It can thus be said that the photodetectors 146 place the optical receive fibers 124 in data communication with the current-to-voltage converter 148.

The optical receiver 128, and in particular the optical coupler 132, can include at least one optical receive reflector 150 that is aligned with the output end of the optical receive fibers 124. Thus, the optical receive signals are emitted from the output end of the optical receive fibers 124 along a first receive direction, reflect off the optical receive reflector 150, and travel to the photodetectors 146 along a second receive direction that is angularly offset from the first direction. The second receive direction can be oriented substantially along the transverse direction T. The optical receive reflector 150 can be metallic, a multi-layer dielectric coating, an uncoated total internal reflection surface, or made from any suitable alternative reflective material or interface as desired.

In one example, one or more optical elements can be disposed between the optical receive fibers and the photodetectors 146. These intervening optical elements may include one or more of mirrors, lenses, transparent substrates, and optically transparent couplers that collectively serve to provide an optical path between the optical receive fibers 124 and the photodetectors 146. The optical elements can match the size of the optical receive signal beam to that of the photosensitive area of the photodetector 146, and can relax alignment tolerances between the optical receive fibers 124 and the photodetectors 146. High coupling efficiency may advantageously be maintained over a large operating temperature range.

In some embodiments, the optical receiver 128 can include a first receive lens 152 can be supported by the frame 134. For instance, the first receive lens 152 can be supported on a bottom surface of the frame 134 that faces the interposer 130. The optical receiver 128 can include a second receive lens 154 can be supported on a top surface of the interposer 130 that faces the frame 134. The first receive lens 152 can be a collimating lens. Thus, the optical receive signal can be collimated from the first optical receive lens 152 to the second optical receive lens 154. It is recognized that collimating the beams of the optical receiver 128 signals can include relaxing the alignment tolerance between the optical receiver 128 signals and the active photosensitive region of the photodetectors 146. The second receive lens 154 can be a focusing lens. Thus, the optical receive signals can converge from the second receive lens 154 to the photodetectors 146. Alternatively, the optical receiver 128 can include one of the first and second receive lenses 152 and 154 and not the other of the first and second receive lenses 152 and 154. For instance, the optical receiver 128 can include the first receive lens 152 but not the second receive lens 154. In this example, the first receive lens 152 can be configured as a focusing lens. The collimating lens and the converging lens can be positioned anywhere as desired. The interposer 130 can include alignment members that are configured to align the photodetectors 146 with the first optical receive lens.

The photodetectors 146 are configured to convert the optical receive signals to corresponding electrical receive signals. The electrical receive signals can have current levels that are proportional with the quantity of optical photons of the received optical receive signal. Generally the photo generated current increases as the intensity of the incoming optical receive signal increases, and decreases as the intensity of the incoming optical receive signal decreases. It is recognized that the current levels of the electrical receive signals are not necessarily linearly proportional to the quantity of optical photons of the received optical receive signal, and that often the proportionality is nonlinear. Thus, optical receive signals having a higher intensity, or number of incident optical photons per unit time, will be converted to an electrical signal having higher current levels than optical receive signals having a lower number of optical photons. Data may be transmitted by this modulated optical and electrical signal.

The current-to-voltage converter 148 can be configured to receive the electrical receive signals from the photodetectors 146, condition the electrical receive signal, and output the conditioned electrical receive signal. In one example, the current-to-voltage converter 148 is a transimpedance amplifier (TIA) that amplifies the electrical receive signal to voltage levels that are usable for communication with the first electrical component. The photodetector 146 can be a PIN photodiode (named after its P-doped, Intrinsic, and N-doped junction structure) that is in turn coupled to an ultra-low noise, very high gain trans-impedance amplifier which modifies the received photodiode current into an electrically compatible voltage output. In one example, the voltage output can be a differential voltage output. The TIA output can typically incorporate a limiting amplifier (LA) stage and equalization circuitry Advanced functionality such as loss of optical signal detection (LOS), received optical power, and squelch night also be implemented.

Thus, the electrical receive signals output by the current-to-voltage converter 148 are the electronic equivalent of the optical signals received by the photodetectors 146. Thus, the electrical receive signals output by the current-to-voltage converter 148 can mimic the digital patterns of the received optical patterns in an electrical signal. The current-to-voltage converter 148 outputs the conditioned electrical transmit signals from the respective channels to corresponding ones of the electrical contact pads 57 of the extension card substrate 58.

As illustrated in FIG. 15, the optical engine of the optical transmitter 126 can be disposed on a first side of the interposer 130, and the optical engine of the optical receiver 128 can be disposed on an opposed second side of the interposer 130. The first and second sides of the interposer 130 can be defined by the same surface of the interposer 130. In one example, the surface can be defined by the bottom surface of the interposer 130 that is opposite the top surface of the interposer 130 along the transverse direction T. Alternatively the surface can be defined by the top surface of the interposer 130. The first and second sides can be opposite each other along a direction substantially perpendicular to the transverse direction T.

Each of the photodetectors 146 and the light sources 136, the driver 131, and the current-to-voltage converter 148 can be supported on the bottom surface of the interposer 130.

Figure 17A:
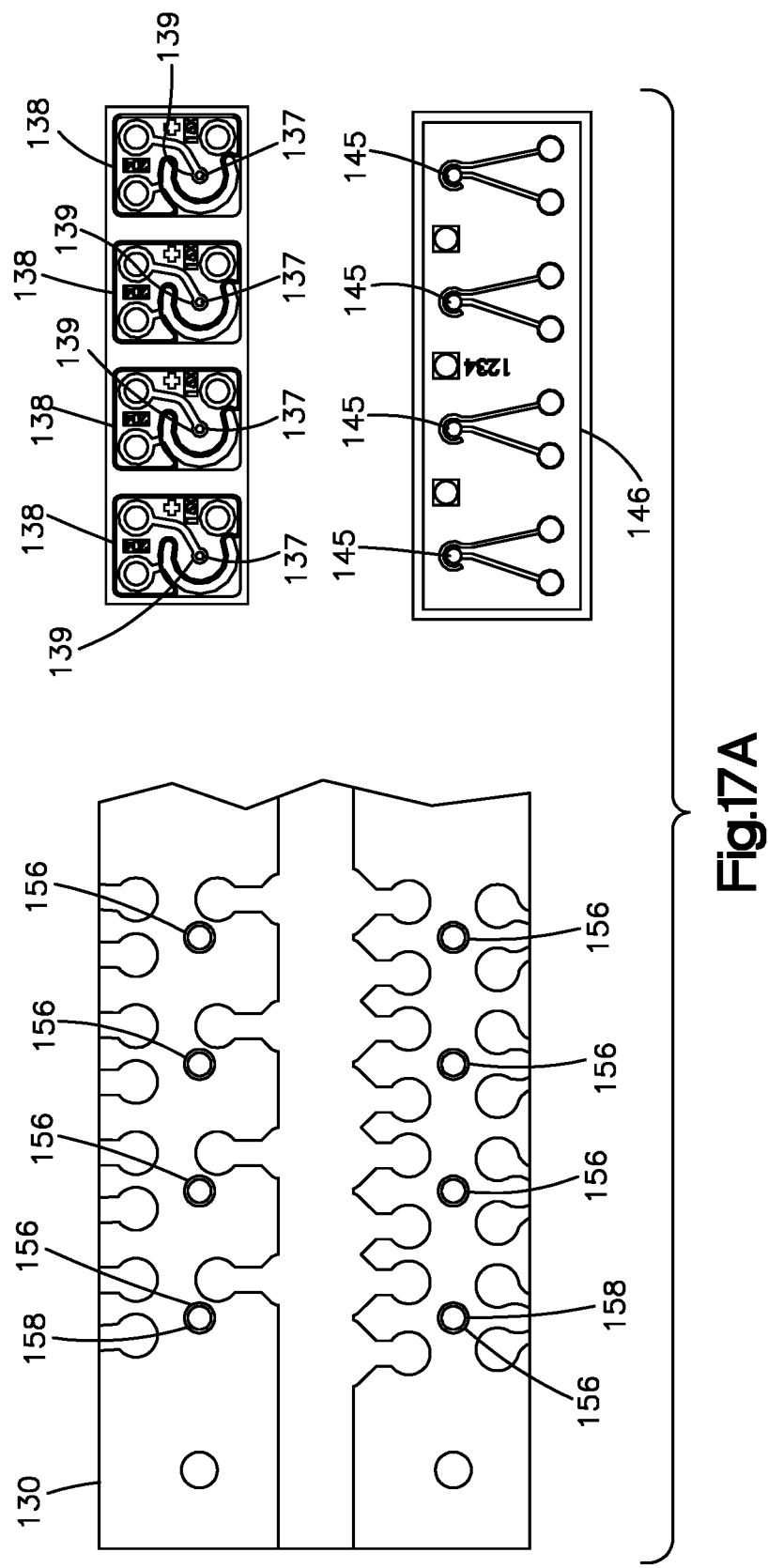
FIG. 17A is an exploded view of an interposer of the optical transceiver, a plurality of light sources configured to be aligned with the interposer, and a plurality of photodetectors configured to be aligned with the interposer.
Figure 17B:
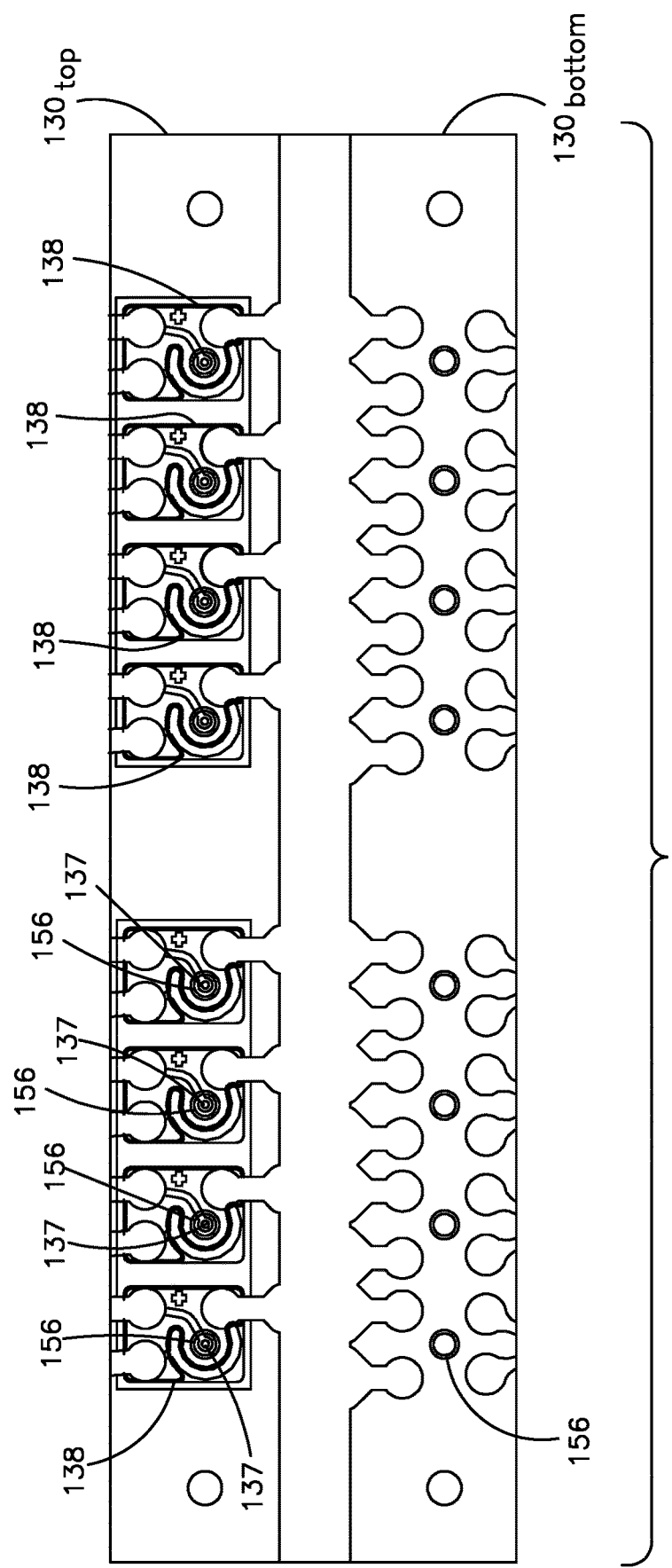
FIG. 17B is a plan view of the interposer of FIG. 17A, showing the light sources aligned with the interposer.

As described above, and referring now to FIG. 17A, interposer 130 can include alignment members 156 configured to align the photodetectors 146 with the first optical receive lenses 152 that are supported by the frame 134. In particular, the interposer 130 can include a plurality of markings 158 on outer surfaces of the interposer 130. The markings 158 can be oriented as respective circles that lie in a plane perpendicular to the transverse direction T. circles can be arranged in respective pluralities of arrays of circles that are aligned with each other in a given array that are disposed such that the central axes of the circles are linearly aligned with each other. The central axes can be linearly aligned with each other along a straight line oriented in a direction perpendicular to the transverse direction. Thus, when the circular markings 158 are viewed along the transverse direction T, the full diameter of the circle is visible. A first plurality of the alignment members 156, which can define circular profiles of profiles or any other suitable geometry, can be aligned with complementary alignment members 137 of the VCSELs 138 or alternative light sources to ensure that the VCSELs 138 or alternative light sources are disposed in a predetermined position with respect to the interposer 130 in a plane that is perpendicular to the transverse direction T as shown in FIG. 17B. The complementary alignment members of the VCSELs 138 or alternative light sources can be defined by the light emitting apertures 139 of the VCSELs 138 or alternative light sources. Further, a second plurality of the alignment members 156, which can be configured as circles or any suitable alternative geometry, can be aligned with complementary alignment members 145 of the photodetectors 146 to ensure that the photodetectors 146 are disposed in a predetermined position with respect to the interposer 130 in a plane that is perpendicular to the transverse direction T.

Figure 17C:
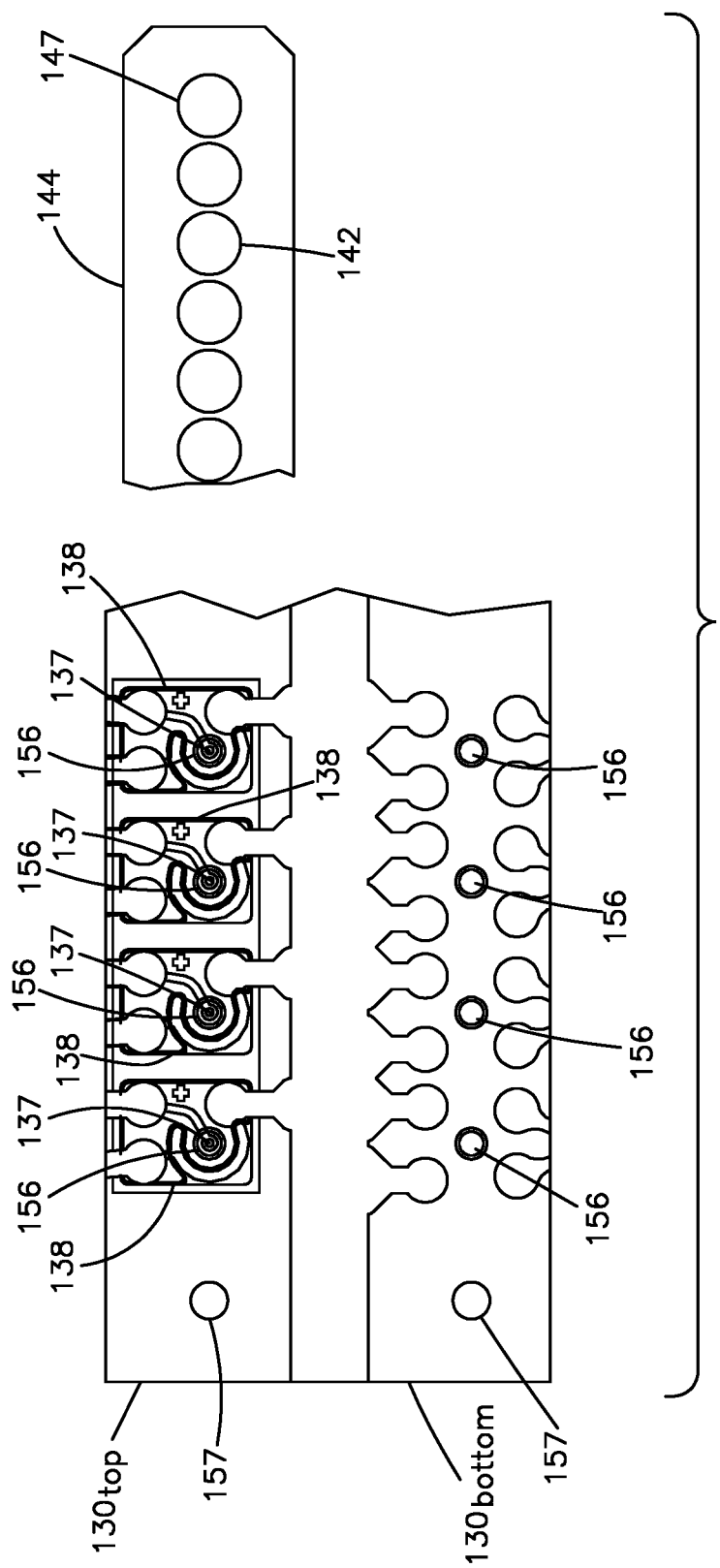
FIG. 17C is a plan view of the interposer of FIG. 17B, and an optical block configured to be aligned with the interposer.
Figure 17D:
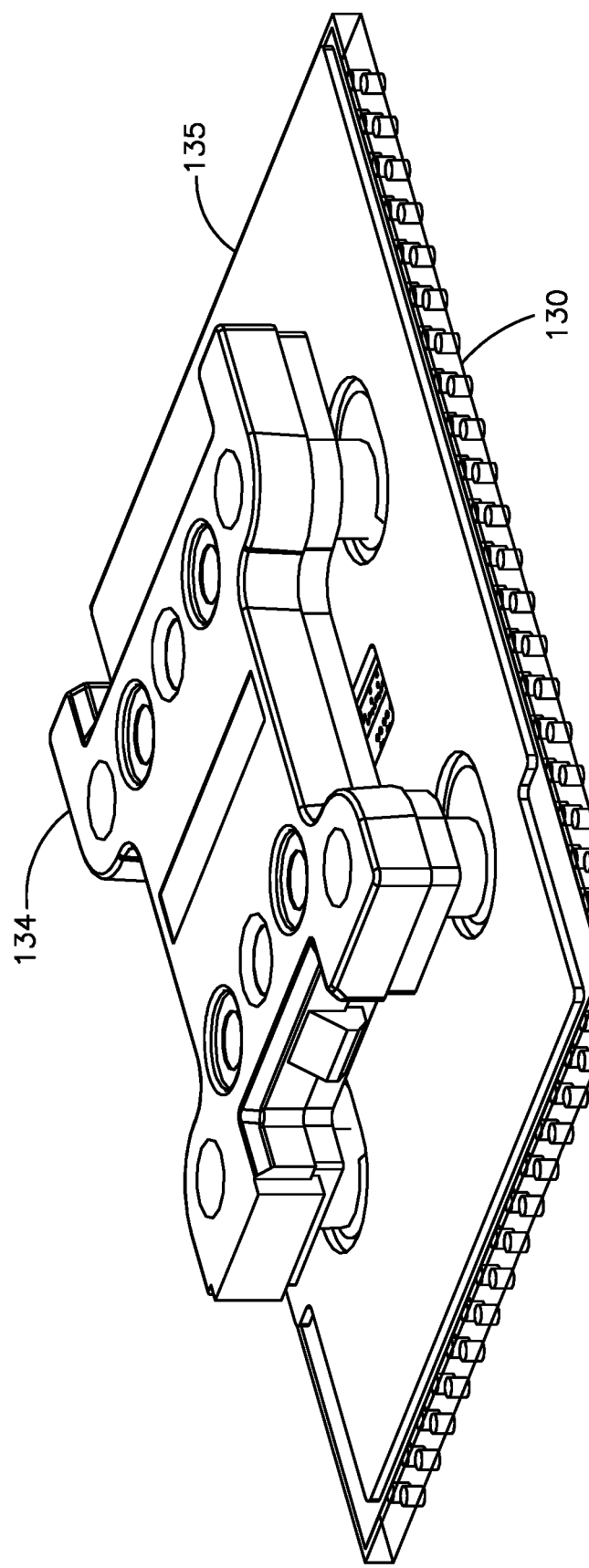
FIG. 17D is a perspective view of a frame that supports the optical block of FIG. 17D at a position aligned with the interposer.

Referring now to FIGS. 17C-17D, the interposer 130 can include an optical block alignment members 157 that are configured to align the lenses 142 of the transmit optical block 143 with the light sources 136 substantially along the transverse direction T. Thus, respective straight lines traveling substantially along the transverse direction T can intersect both the lenses 142 of the lens array 143 and the respective light sources 136. The transmit optical block 143 can include at least one complementary alignment member 147 that is configured to be aligned with the optical block alignment member 157, so as to align the optical block 143 with the VCSELs or other light sources 136. Thus, the second optical transmit lenses 142 supported by the frame 134 can be in optical alignment with the light emitting apertures 139 of the VCSELs or other light sources along the transverse direction T. As described above, the optical block 143 faces the top surface of the interposer 130. Because the optical block 143 is supported by the frame 134, alignment of the optical block 143 with the first plurality of alignment members 156 also positions the frame 134 with respect to the interposer 130 along a plane that is perpendicular to the transverse direction T. In this regard, the optical block 143 can provide an alignment member 147 of the frame 134. It should be appreciated, however, that the frame 134 can have any suitable alternative alignment member as desired. Thus, the first optical receive lens 152 that is supported by the frame 134 can therefore be placed in alignment with the photodetectors 146 along the transverse direction T.

Referring now to FIGS. 15 and 18-19E, the optical transceiver 116 can include a heat dissipation system 160 that can be configured to dissipate heat from the current-to-voltage converter 148, the light sources 136, and the driver 131. As illustrated in FIGS. 19A-19E, the heat from each of the current-to-voltage converter 148, the light sources, and the driver 131 can be directed up and away from the top surface of the interposer 130, or down and away from the bottom surface of the interposer 130. For instance, as illustrated in FIG. 19A-19B, a heat spreader 135 can be mounted to the top surface of the interposer 130 so as to direct heat produced by the current-to-voltage converter 148, the light sources 136, and the driver 131 up and away from the top surface of the interposer 130. The interposer 130 can include thermal vias that establish a thermal conductive path from the current-to-voltage converter 148, the light sources 136, and the driver 131 to the heat spreader.

The heat spreader 162 can be a single monolithic structure as illustrated in FIG. 19A. Alternatively, as illustrated in FIG. 19B, the heat sink 162 can be segmented such that a first segment 135a of the heat spreader 135 is in thermal communication with the current-to-voltage converter 148. A second segment 135b of the heat spreader 135 is in thermal communication with the light sources 136, and a third segment 135c of the heat spreader 135 is in thermal communication with the driver 131. One or more up to all of the first, second, and third segments 135a-135c can be spaced from each other, and thus isolated from each other with respect to thermal conduction. As a result, heat generated by the driver or drivers 131 is isolated from the light sources 134 and current-to-voltage converter 148 with respect to thermal conduction through the heat spreader 135. It is appreciated that the heat spreader 135 can be configured to conduct heat to a top heat sink (see heat sink 170 in FIG. 18). Either way, one or both of a heat sink and a heat spreader can be disposed on opposite surfaces of the interposer 130 with respect to the optical engine 118 along the transverse direction. The heat sink or heat spreader can be supported at the top surface of the interposer 130, and the optical engine 138 can be supported at the bottom surface of the interposer. It should be appreciated that the heat sink or heat spreader can alternatively be supported at the bottom surface of the interposer 130, and the optical engine 138 can be supported at the top surface of the interposer.

As illustrated in FIG. 19C, heat produced by the current-to-voltage converter 148 and the driver 131 can be directed up and away from the top surface of the interposer 130. Heat produced by the light sources 136 can be directed down and away from the lower surface of the interposer 130. Thus, heat produced by the current-to-voltage converter 148 and the driver 131 can be directed in a first direction, and heat produced by the light sources 136 can be directed in a second direction opposite the first direction. Alternatively still, as illustrated in FIG. 19D, heat produced by the current-to-voltage converter 148 and the driver 131 can be directed down and away from the bottom surface of the interposer 130. Heat produced by the light sources 136 can be directed down and away from the top surface of the interposer 130. Thus again, heat produced by the current-to-voltage converter 148 and the driver 131 can be directed in a first direction, and heat produced by the light sources 136 can be directed in a second direction opposite the first direction. Further, the light sources 136 can be disposed between the current-to-voltage converter 148 and the driver 131 along the bottom surface of the interposer 130. Finally, as will now be described with reference to FIGS. 15 and 19E, heat from each of the current-to-voltage converter 148, the light sources 136, and the driver 131 can be directed down and away from the bottom surface of the interposer 130.

In this regard, and as will now be described, it should be appreciated that the heat dissipation system 160 can be designed such that heat from any one or more up to all of the current-to-voltage converter 148, the light sources 136, and the driver 131 can be directed selectively up and away from the top surface of the interposer 130. Alternatively or additionally, the heat dissipation system 160 can be designed such that heat from any one or more up to all of the current-to-voltage converter 148, the light sources 136, and the driver 131 can be directed selectively down away from the bottom surface of the interposer 130.

Referring now to FIG. 15, the transceiver 116 can include a bottom heat sink 164 that is supported against the current-to-voltage converter 148, the light sources 136, and the driver 131. For instance, the bottom heat sink 164 can be supported against respective bottom surfaces of the current-to-voltage converter 148, the light sources 136, and the driver 131. In one example, the bottom heat sink 164 can extend through the extension card 27 along the transverse direction T. The bottom heat sink 164 can be configured to receive heat generated by the current-to-voltage converter 148, the light sources 136, and the driver 131, and direct the received heat down and away from the bottom surface of the interposer 130. The transceiver 116 can further include a heat spreader 166 that extends along the bottom surface of the heat sink 164, can receive the heat from the heat sink 164, and direct the heat and can direct the heat away from the optical engine along a plane that is perpendicular to the transverse direction T. The heat spreader 166 can extend out beyond the heat sink along at least one direction that is perpendicular to the transverse direction T.

In one example, the heat sink 164 can be a single monolithic structure. Alternatively, as illustrated in FIG. 15, the heat sink 164 can be segmented such that a first segment 164a of the top heat sink 164 is in thermal communication with the current-to-voltage converter 148. A second segment 164b of the top heat sink 164 is in thermal communication with the light sources 136, and a third segment 164c of the heat sink 164 is in thermal communication with the driver 131. One or more up to all of the first, second, and third segments 162a-162c can be spaced from each other by an air gap, and thus isolated from each other with respect to thermal conduction. As a result, heat generated by the driver or drivers 131 is isolated from the light sources 134 and current-to-voltage converter 148 with respect to thermal conduction through the heat sink 162. The heat spreader 166 can be in thermal contact with each of the segments 162a-162c. The heat spreader 166 can define a single monolithic structure. Alternatively, the heat spreader 166 can define separate segments that are con contact with respective ones of the segments 164a-164c, and are isolated from each other by air gaps. The heat dissipated by the current-to-voltage converter 148 and the at least one driver 131 can be dissipated in first and second opposite directions that are each substantially perpendicular to the transverse direction T. The heat dissipated by the light sources 136 can be dissipated along a third direction that is substantially perpendicular to each of the first and second opposite directions and substantially perpendicular to the transverse direction T.

As illustrated in FIG. 15, heat from any one or more up to all of the current-to-voltage converter 148, the at least one driver 131, and the light sources 136 can be directed down by placing a heat sink or segment of a heat sink below the any one or more up to all of the current-to-voltage converter 148, the at least one driver 131, and the light sources 136, such that the heat sink is in thermal conduction with the any one or more up to all of the current-to-voltage converter 148, the at least one driver 131, and the light sources 136.

Figure 18:
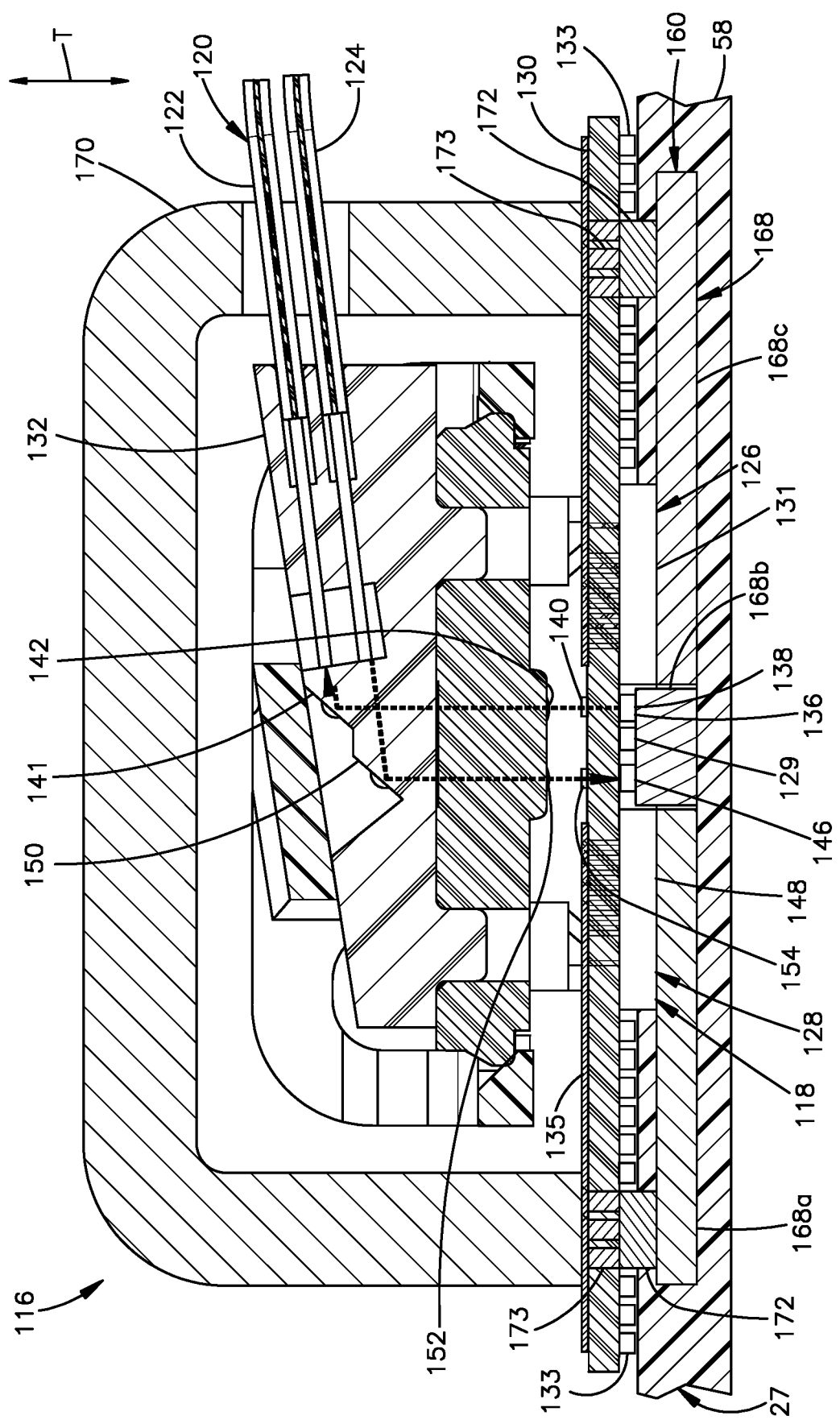
FIG. 18 is a sectional side elevation view of an optical transceiver having an alternative heat dissipation system.

Referring now to FIG. 18, heat from any one or more up to all of the current-to-voltage converter 148, the at least one driver 131, and the light sources 136 can be directed down by placing a heat sink or segment of a heat sink below the any one or more up to all of the current-to-voltage converter 148, the at least one driver 131, and the light sources 136, such that the heat sink is in thermal conduction with the any one or more up to all of the current-to-voltage converter 148, the at least one driver 131, and the light sources 136.

As illustrated in FIG. 18, a first heat spreader 168 can be at least partially embedded in the extension card substrate 58. Thus, the first heat spreader 168 can be defined by one or more metallization layers of the extension card substrate 58. The top surface of the first heat spreader 168 can be in thermal contact with the bottom surface of one or more up to all of the current-to-voltage converter 148, the at least one driver 131, and the light sources 136. For instance, the top surface of the first heat spreader 168 can be in direct contact with the bottom surface of one or more up to all of the current-to-voltage converter 148, the at least one driver 131, and the light sources 136. Alternatively, the extension card substrate 58 can define one or more thermal vias that extend up from the top surface of the first heat spreader 168 toward respective ones of the current-to-voltage converter 148, the at least one driver 131, and the light sources 136. The thermal vias can be in contact with the respective ones of the current-to-voltage converter 148, the at least one driver 131, and the light sources 136. Alternatively, the thermal vias can be in contact with the bottom surface of a thermal plate that, in turn, is in contact with a respective at least one or more up to all of the current-to-voltage converter 148, the at least one driver 131, and the light sources 136.

The thermal dissipation system 160 can further include an external heat sink 170 that extends up from the top surface of the interposer 130. The first heat spreader 168 can be placed in thermal communication with the external heat sink 170. For instance, the thermal dissipation system 160 can include a thermal interface 172 that can be configured as a thermally conductive slug that extends from the top surface of the first heat spreader 168 to the bottom surface of the interposer 130. The interposer 130 can include a plurality of thermally conductive vias 173 that extend from the external heat sink 170 to the thermal interface 172. Thus, the thermal interface 172 is in thermally conductive communication with the external heat sink 170.

The first heat spreader 168 can be segmented such that a first segment 168a of the first heat spreader 168 is in thermal communication with the current-to-voltage converter 148. A second segment 168b of the first heat spreader 168 is in thermal communication with the light sources 136. A third segment 168c of the first heat spreader 168 is in thermal communication with the driver 131. One or more up to all of the first, second, and third segments 168a-168c can be spaced from each other by a gap, and thus isolated from each other with respect to thermal conduction. As a result, heat generated by the driver or drivers 131 is isolated from the light sources 136 and current-to-voltage converter 148 with respect to thermal conduction through the heat sink 162. The heat generated by the current-to-voltage converter 148 and the at least one driver 131 can be dissipated in first and second opposite directions that are each substantially perpendicular to the transverse direction T. The heat generated by the light sources 136 can be dissipated along a third direction that is substantially perpendicular to each of the first and second opposite directions and substantially perpendicular to the transverse direction T. In another example, the first heat spreader 168 can be a single monolithic structure.

In this regard, while various heat sinks have been described as segmented into three segments, it should be appreciated that the heat sinks can be segmented into as many segments as desired. For instance, the heat sinks can be segmented into two segments, with a first segment in thermal conductive communication with the at least one driver 131, and a second segment in thermal conductive communication with the current-to-voltage converter 148 and the light sources 136.

Thus, the thermal dissipation system 160 can include the first heat spreader 168 that is in thermal communication with at least one or more up to all of the current-to-voltage converter 148, the at least one driver 131, and the light sources 136. The thermal dissipation system 160 can further include a second heat spreader 135 that is also in thermal communication with at least one or more up to all of the current-to-voltage converter 148, the at least one driver 131, and the light sources 136. The first heat spreader 168 can be in thermal communication with a first surface, such as a bottom surface, of the at least one or more up to all of the current-to-voltage converter 148, the at least one driver 131, and the light sources 136. The second heat spreader 168 can be in thermal communication with an opposed second surface, such as a top surface, of the at least one or more up to all of the current-to-voltage converter 148, the at least one driver 131, and the light sources 136. Thus, the opposed first and second surfaces can be opposite each other along the transverse direction T.

In one example, the second heat spreader 135 can be disposed on the top surface of the interposer 130. The interposer 130 can include a second plurality of thermal vias as described above with respect to the thermal vias 173 that extend from the second heat spreader 135 to a respective one of the current-to-voltage converter 148, the at least one driver 131, and the light sources 136. For instance, the second thermal vias can extend to the bottom surface of the second heat spreader 135. In this regard, the thermal vias 173 can be referred to as a first plurality of thermal vias. The heat sink 170 can be mounted to the top surface of the second heat spreader 135. Thus, heat can be dissipated from the at least one or more up to all of current-to-voltage converter 148, the at least one driver 131, and the light sources 136 to the heat sink 170 through the second plurality of thermal vias of the interposer 130, the second heat spreader 135, and the heat sink 170. In this regard, heat can be dissipated upward out the top surface of the interposer 130.

FIGS. 15 and 18 demonstrate that heat generated by the current-to-voltage converter 148, the at least one driver 131, and the light sources 136 can be directed selectively up to the external heat sink 170 or down to the heat spreader 166. Thus, it can be appreciated that the heat dissipation systems illustrated in FIGS. 19A-19E can be determined by configuring the heat dissipation system 160 to direct heat up and down, selectively, from respective ones of the current-to-voltage converter 148, the at least one driver 131, and the light sources 136. For instance, thermally conductive communication with the first heat spreader 168 illustrated in FIG. 18 can direct heat upwards, while thermally conductive communication with the bottom heat sink 164 illustrated in FIG. 15 can direct heat downward.

Figure 20A:
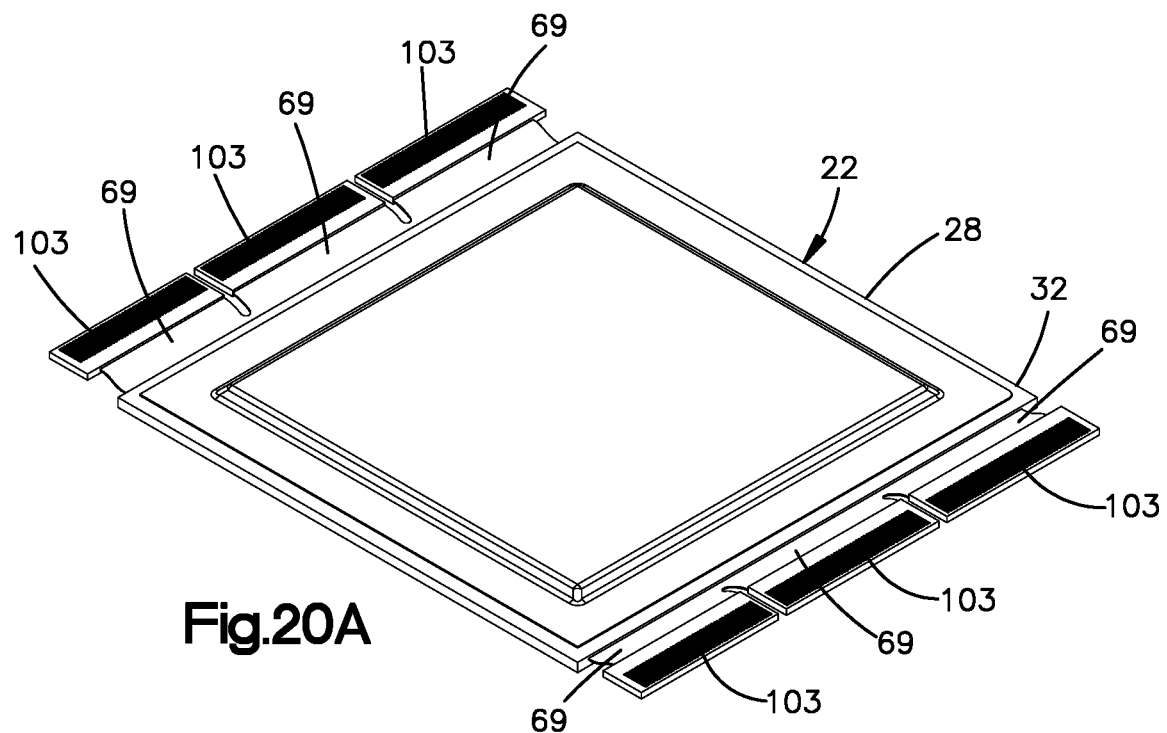
FIG. 20A is a perspective view of an ASIC package having a compliant circuit directly connected thereto in one example.
Figure 20B:
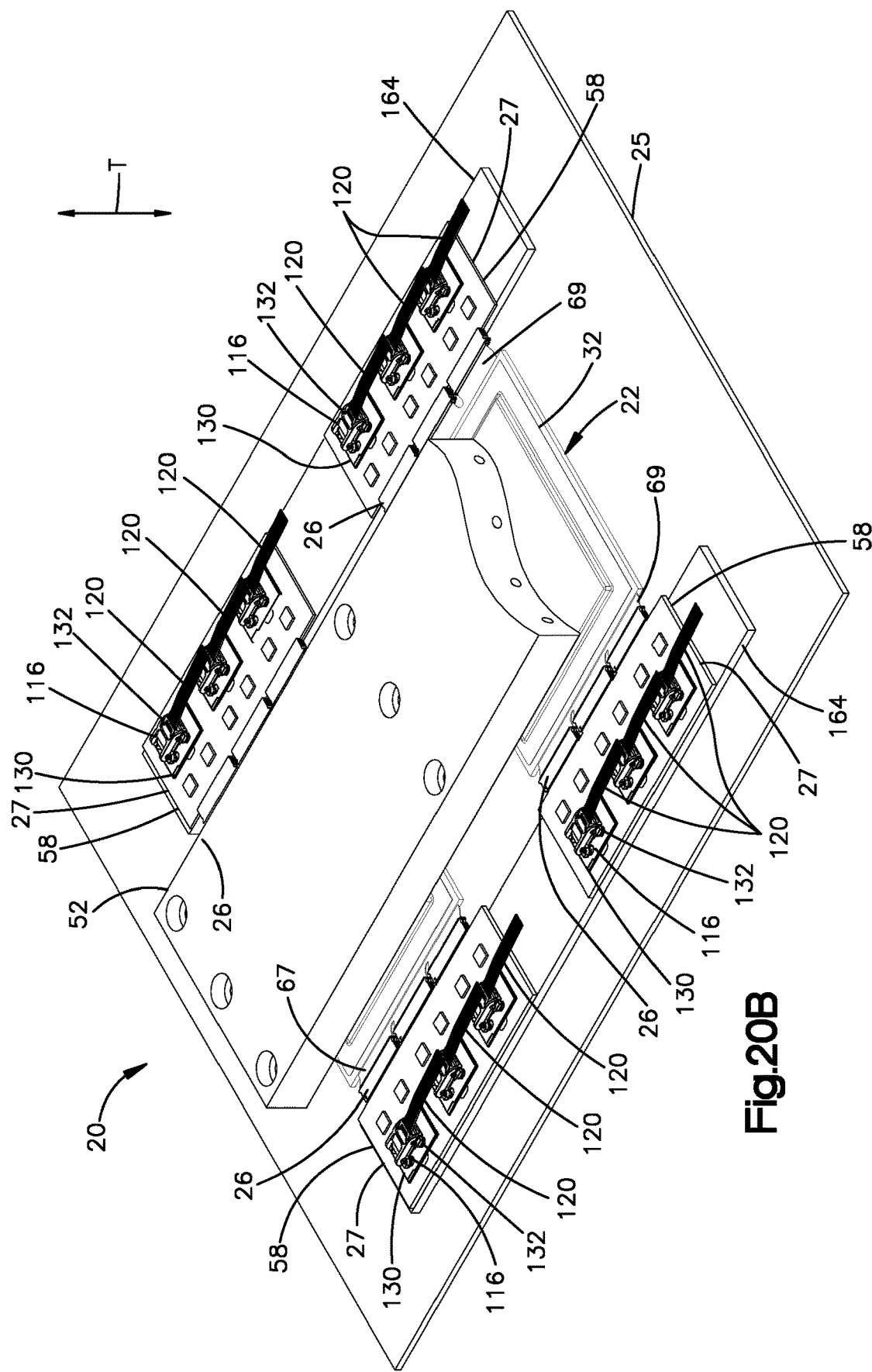
FIG. 20B is a perspective view of a data communication system including the ASIC package illustrated in FIG. 20A.

Referring now to FIGS. 20A-20B, and as described above, the optical transceivers 116 or other data communication devices can be mounted on the extension card 27. The extension card 27 can be placed in electrical communication with the ASIC package substrate 32 through a separable interface. The separable interface can be defined between a compliant circuit 60 and the extension card substrate 58. For instance, the electrical connector 26 can be mounted to the extension card substrate 58, and can mate with the compliant circuit 69 to the extension card substrate 58 to place the compliant circuit 69 in electrical communication with each of the ASIC package substrate 32 and the extension card substrate 58. The compliant circuits 69 can extend directly from the ASIC package substrate 32 and can be mechanically and electrically connected to electrical traces of the ASIC package substrate 32. Each of the compliant circuits 69 define a free end that carries electrical contact pads 103 configured to mate with the extension card substrate 58. The electrical connectors 26 can be supported by the extension card substrate 58. The electrical connectors 26 can compress the electrical contact pads 103 of the compliant circuits 69 to respective contact pads of the extension card substrate 58 in the manner described above. Alternatively, the electrical connector 26 can include a connector housing and electrical contacts supported by the connector housing and configured to mate with the electrical contact pads 103 of the compliant circuits 69 that are received in the receptacle of the electrical connectors 26. In this regard, it should be appreciated that the electrical connector 26 can be configured in any suitable manner as desired so as to mount to the extension card substrate 58 and mate with the compliant circuits 69 to place the compliant circuits 69 in electrical communication with the extension card substrate. The separable interface can thus be defined by the compliant circuits 69 and the electrical connectors 26.

In another example, instead of extending directly out from the ASIC package substrate 32, the compliant circuits 69 can be mounted to the ASIC package substrate 32 in the manner described above with respect to the extension card substrate 58 above as shown in FIGS. 1-3. The electrical connector 26 can mate with the extension card substrate 58 in the manner described above with respect to the ASIC package substrate 32 with reference to FIGS. 1-3. Thus, the electrical traces of the compliant circuits 69 can be placed in electrical communication with each of the ASIC package substrate 32 and the extension card substrate 58 via a separable interface. It should be appreciated that the compliant circuits 69 can accommodate height variations between the ASIC package substrate 32 and the extension card substrate 58 along the transverse direction while maintaining electrical communication between the extension card substrate 58 and the ASIC package substrate 32.

Figure 21A:
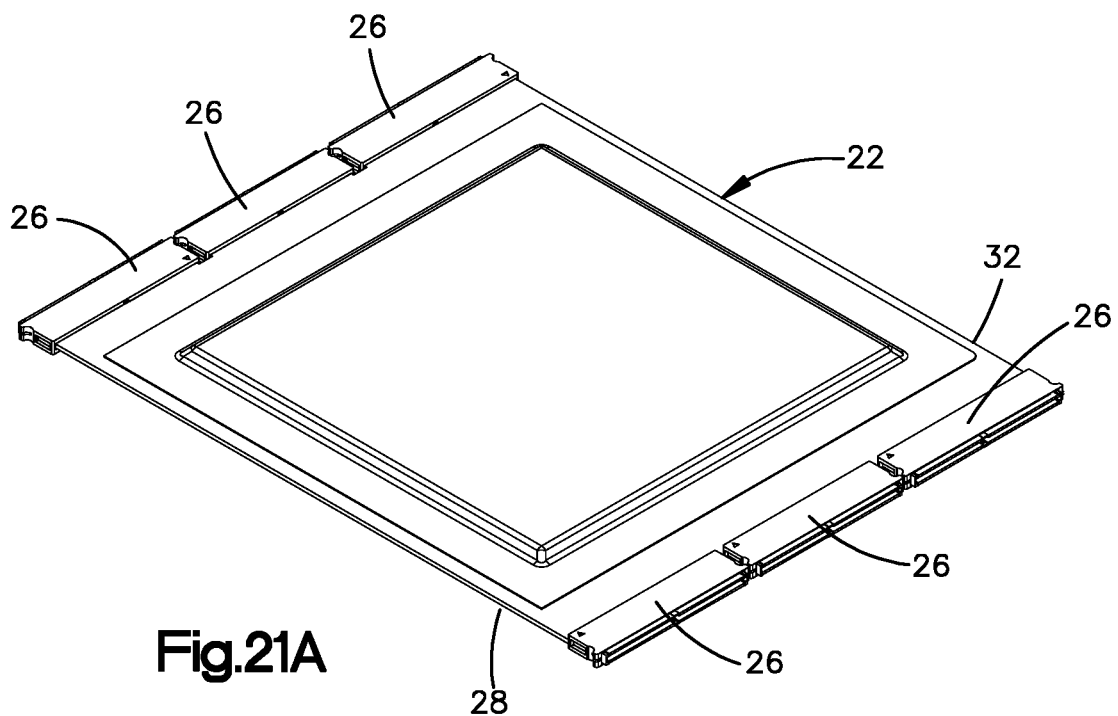
FIG. 21A is a perspective view of an ASIC package having an electrical connector mounted thereto in one example.
Figure 21B:
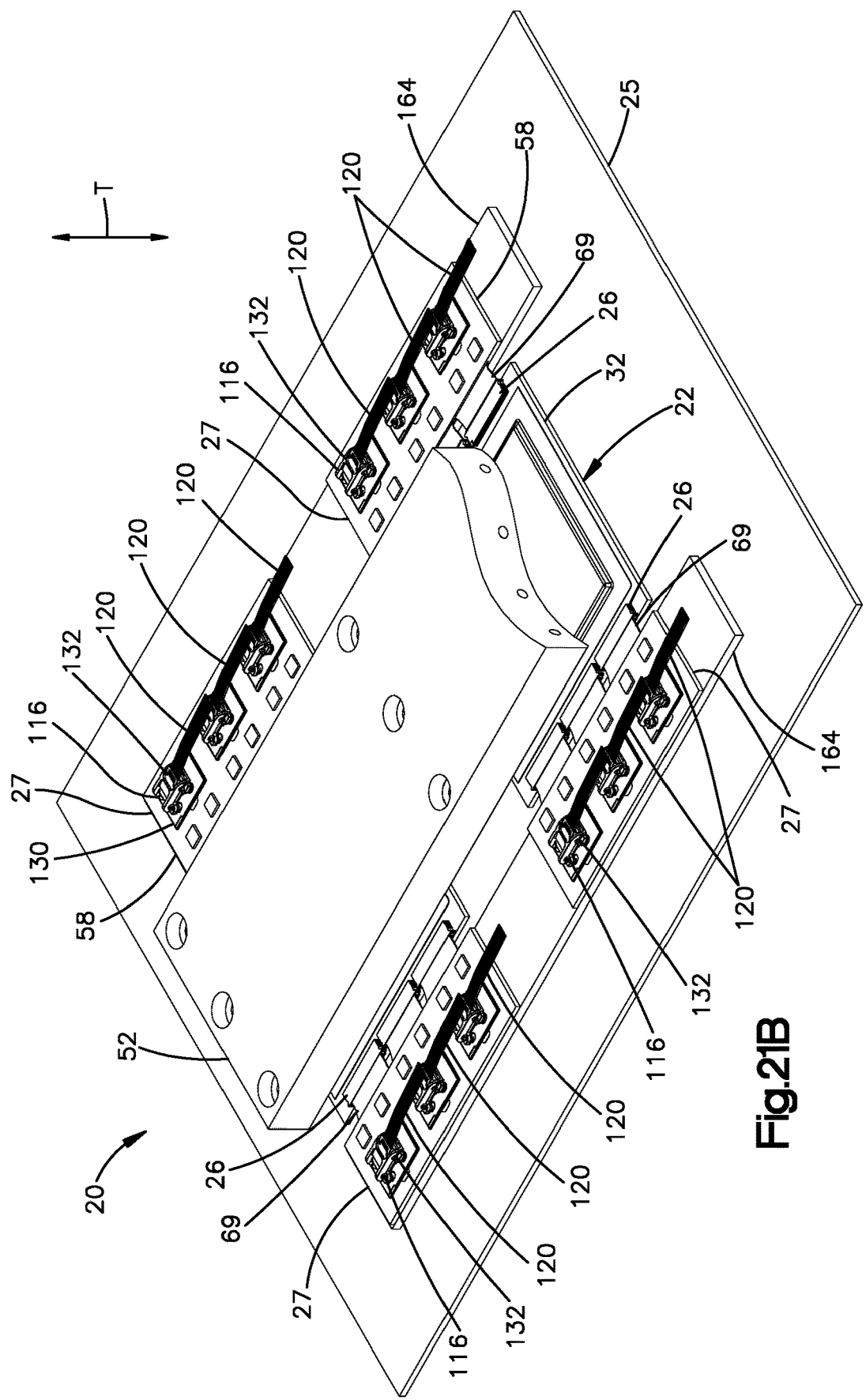
FIG. 21B is a perspective view of a data communication system including the ASIC package illustrated in FIG. 21A.

Alternatively, referring to FIGS. 21A-21B, the optical transceivers 116 or other data communication devices can be mounted on the extension card 27. The extension card 27 can be placed in electrical communication with the ASIC package substrate 32 through a separable interface as described above. The separable interface can be defined between the compliant circuit 69 and the extension card substrate 58. For instance, the electrical connectors 26 can be mounted on the ASIC package substrate 32 and mate with the compliant circuits 69, respectively, that extend out from the extension card substrate 58. Thus, the electrical connector 26 can mate the compliant circuit 69 to the ASIC package substrate 32 to place the compliant circuit 69 in electrical communication with each of the ASIC package substrate 32 and the extension card substrate 58. The compliant circuits 69 can extend directly from the extension card substrate 58 to respective free end that carry electrical contact pads configured to mate with the electrical connector 26 that is mounted to the ASIC package substrate 32. In this regard, the electrical contact pads can be said to mate with the ASIC package substrate 32. The electrical connectors 26 can further be supported by the ASIC package substrate 32 and can be electrically connected to electrical traces of the ASIC package substrate 32. For instance, the electrical connectors 26 can compress the electrical contact pads of the compliant circuits 68 to respective contact pads of the ASIC package substrate 32 in the manner described above with respect to the extension card substrate with reference to FIGS. 1-3. Alternatively, the electrical connector 26 can include a connector housing and electrical contacts supported by the connector housing that mount to contact pads of the ASIC substrate 32 so as to mount the electrical connector to the ASIC substrate 32. The electrical connector 26 can receive the free end of the compliant circuit 69 so as to mate the contact pads with respective mating ends of the electrical contacts of the electrical connector. It will therefore be appreciated that the electrical connector can be constructed as any suitable electrical connector to mount to the ASIC substrate 32 and mate to the compliant circuit 69, thereby placing the ASIC substrate in electrical communication with the compliant circuit 69, and thus to the extension card substrate 58. Thus, the separable interface between the extension card 27 and the ASIC package 22 can be defined between the compliant circuits 68 and the ASIC package substrate 32.

In another example, instead of extending directly out from the extension card substrate 58, the compliant circuits 68 can be mounted to the extension package substrate 58 in the manner described above with reference to FIGS. 1-3. Thus, the electrical traces of the compliant circuits 68 can be placed in electrical communication with each of the ASIC package substrate 32 and the extension card substrate 58 via a separable interface.

FIGS. 20A-21B illustrate that the separable interface can be defined by a first end of the compliant circuit 68 and the extension card 27. The second end of the compliant circuit 68 opposite the first end can extend directly out from the ASIC package substrate 32. Alternatively, the second end of the compliant circuit can be mounted to the ASIC package substrate 32. Alternatively, the separable interface can be defined by a first end of the compliant circuit 68 and the ASIC package substrate 32. The second end of the compliant circuit 68 opposite the first end can extend directly out from the extension card substrate 58. Alternatively, the second end of the compliant circuit 68 can be mounted to the extension card substrate 58. Thus, the electrical connector 26 can mate at least one compliant circuit 68 to one of the ASIC package substrate 32 and the extension card substrate 58.

Referring still to FIGS. 20A-21B, the optical fibers 120 can extend out from the optical fiber coupler 132 in a direction that can limit mechanical interference between the optical fibers 120 and the host substrate 25. For instance, from a view of the data communication system 20 along the transverse direction T, the optical fibers 120 can extend along a direction that is non-perpendicular to respective outer edges of the host substrate 25 along which the respective optical transceivers 116 that include the optical fibers 120 are arranged. Otherwise stated, a select optical transceiver 116 can be disposed along a select one of the outer edges of the host substrate 25. Further, the select optical transceiver 116 can be disposed closest to the select one of the outer edges than any others of the edges of the host substrate 25. From a view of the host substrate 25 along the transverse direction, the optical fibers 120 of the select optical transceiver 116 can extend from the optical coupler 132 along a direction that is non-perpendicular to the select one of the outer edges. In one example, the optical fibers 120 of the select optical transceiver 116 can extend from the optical coupler 132 along a direction that is substantially parallel to the select one of the outer edges. Further, a plurality of optical transceivers 116 can be positioned along the select one of the outer edges such that the respective optical fibers 120 of the plurality of optical transceivers extend out from the optical coupler 132 along the direction. Thus, the optical fibers 120 of at least one of the optical transceivers 116 positioned along the select one of the outer edges can extend over the optical fibers 120 of an adjacent one of the optical transceivers 116 as they extend along the direction.

Further, from a view of the data communication system 20 along the transverse direction T, the optical fibers 120 can extend along a direction that is non-perpendicular to a respective outer edge of the extension card substrate 58 along which the respective optical transceivers 116 that include the optical fibers 120 are arranged. Otherwise stated, a select optical transceiver 116 can be disposed along a select one of the outer edges of the extension card substrate 58. The outer edge of the extension card substrate can be placed in electrical communication with the IC package 22. For instance, the extension card substrate 58 can define contact pads that are arranged along the outer edge that are placed in electrical communication with the IC package 22. In one example, the outer edge can be mounted to the electrical connector 26 in the manner described above.

From a view of the ASIC package substrate 32 along the transverse direction T, the optical fibers 120 of the select optical transceiver 116 can extend from the optical coupler 132 along a direction that is non-perpendicular to the select one of the outer edges 28 of the ASIC package substrate 32. In one example, the optical fibers 120 of the select optical transceiver 116 can extend from the optical coupler 132 along a direction that is substantially parallel to the select one of the outer edges 28. Further, a plurality of optical transceivers 116 can be positioned along the select one of the outer edges 28 such that the respective optical fibers 120 of the plurality of optical transceivers extend out from the optical coupler 132 along the direction. Thus, the optical fibers 120 of at least one of the optical transceivers 116 positioned along the select one of the outer edges can extend over the optical fibers 120 of an adjacent one of the optical transceivers 116 as they extend along the direction.

Referring still to FIGS. 20A-21B, the extension cards 27 can be supported on the host substrate 25. Further, the data communication system 20 can further include a bottom heat sink 164 that is disposed between the host substrate 25 and at least one interposer, such as first and second interposers 30 that support a respective at least one optical transceiver 116. For instance, each of the first and second interposers 30 can support a plurality of optical transceivers. The bottom heat sink can be in thermal communication with at least one or more up to all of the current-to-voltage converter, the light sources, and the light source drivers as described above.

It should be noted that the illustrations and discussions of the embodiments shown in the figures are for exemplary purposes only and should not be construed limiting the disclosure. One skilled in the art will appreciate that the present disclosure contemplates various embodiments.

Additionally, it should be understood that the concepts described above with the above-described embodiments may be employed alone or in combination with any of the other embodiments described above. It should further be appreciated that the various alternative embodiments described above with respect to one illustrated embodiment can apply to all embodiments as described herein, unless otherwise indicated.

What is claimed:

1. An interconnect system comprising:
   an IC package including an IC package substrate and an IC die mounted on the IC package substrate;
   a compliant circuit that extends from the IC package substrate and is in electrical communication with the IC package substrate;
   an extension card that extends from the compliant circuit and is in electrical communication with the compliant circuit, and thus also with the IC package;
   an electrical path that is established between the extension card and the IC die without traveling first through a host substrate when the IC package is mounted to the host substrate; and
   an electrical connector permanently mounted to the extension card.

2. The interconnect system of claim 1, wherein IC package substrate has a top surface and a bottom surface that are opposite each other, and the IC package further comprises a plurality of contact pads on the top surface.

3. The interconnect system of claim 2, wherein the IC package substrate defines a plurality of edges, and the contact pads arranged along all of the edges of the IC package substrate.

4. The interconnect system of claim 2, wherein the extension card defines contact pads that are arranged along an outer edge of the extension card that are placed in electrical communication with the IC package.

5. The interconnect system of claim 4, wherein the electrical contact pads of the IC package substrate and the electrical contact pads of the extension card have a contact pitch that ranges from approximately 0.2 mm to approximately 0.5 mm.

6. The interconnect system of claim 1, further comprising a plurality of electrical cables mounted to the extension card.

7. The interconnect system of claim 1, wherein an edge of the extension card is disposed adjacent a respective edge of the IC package substrate.

8. The interconnect system of claim 1, wherein an electrical connection of the extension card and the IC package substrate has no electrically conductive stub.

9. The interconnect system of claim 1, wherein the electrical connector is electrically connected to electrical traces of the IC package substrate.

10. The interconnect system of claim 1, further comprising an electrical transmission line that supports signals between the IC package substrate and the extension card at 112 gigabits per second with no more than 6% asynchronous worst-case multi-active cross-talk.

11. The interconnect system of claim 1, further comprising the host substrate.

12. The interconnect system of claim 11, wherein a top surface of the host substrate faces a bottom surface of the extension card.

13. The interconnect system of claim 11, wherein the extension card is supported on the host substrate.

14. The interconnect system of claim 11, wherein the host substrate is configured as a printed circuit board.

15. The interconnect system of claim 1, wherein the electrical connector is configured to define a separable interface between an extension card substrate of the extension card and the IC package substrate.

16. The interconnect system of claim 1, wherein the extension card comprises an extension card substrate, and the interconnect system further comprises a plurality of electrical connectors mounted to the extension card substrate, wherein the extension card substrate is configured to be placed in electrical communication with an IC package substrate.

17. The interconnect system of claim 1, wherein the compliant circuit is flexible to allow an edge of the compliant circuit to be positionally varied along a transverse direction to conform to variations in height of the IC package substrate.

* * * * *